US012308605B2

(12) United States Patent
Nishikawa et al.

(10) Patent No.: US 12,308,605 B2
(45) Date of Patent: May 20, 2025

(54) SEMICONDUCTOR LASER MODULE

(71) Applicant: NUVOTON TECHNOLOGY CORPORATION JAPAN, Kyoto (JP)

(72) Inventors: Tohru Nishikawa, Toyama (JP); Kazuhiko Yamanaka, Osaka (JP); Masahiko Nishimoto, Osaka (JP)

(73) Assignee: NUVOTON TECHNOLOGY CORPORATION JAPAN, Kyoto (JP)

(*) Notice: Subject to any disclaimer, the term of this patent is extended or adjusted under 35 U.S.C. 154(b) by 821 days.

(21) Appl. No.: 17/409,110

(22) Filed: Aug. 23, 2021

(65) Prior Publication Data

US 2021/0384698 A1 Dec. 9, 2021

Related U.S. Application Data

(63) Continuation of application No. PCT/JP2020/002996, filed on Jan. 28, 2020.

(30) Foreign Application Priority Data

Feb. 27, 2019 (JP) ................. 2019-034609

(51) Int. Cl.
H01S 3/10 (2006.01)
H01S 5/00 (2006.01)
(Continued)

(52) U.S. Cl.
CPC ........ *H01S 5/02255* (2021.01); *H01S 5/0071* (2013.01); *H01S 5/02208* (2013.01);
(Continued)

(58) Field of Classification Search
CPC .............. H01S 5/02255; H01S 5/0071; H01S 5/02208; H01S 5/02218; H01S 5/02251;
(Continued)

(56) References Cited

U.S. PATENT DOCUMENTS 6,332,721 B1 12/2001 Inokuchi
7,668,214 B2* 2/2010 Wilson ............... G02B 27/1006
372/50.23
(Continued)

FOREIGN PATENT DOCUMENTS

JP S60-182781 A 9/1985
JP H4-340286 A 11/1992
(Continued)

OTHER PUBLICATIONS

International Search Report and Written Opinion issued on Apr. 28, 2020 in International Application No. PCT/JP2020/002996; with partial English translation.

*Primary Examiner* — Kinam Park
(74) *Attorney, Agent, or Firm* — Rimon P.C.

(57) ABSTRACT

A semiconductor laser module includes a semiconductor laser chip, a first collimator element, and a package. The package includes: a body having a bottom and a top with an opening; a cap member; and a window member. The semiconductor laser chip has a light-emitting point for emitting laser light. The semiconductor laser chip is located on the bottom so as to emit the laser light in a direction parallel to the principal surface of the bottom. The laser light has a greater divergence angle along the first axis than a divergence angle along a second axis perpendicular to the first axis. The first collimator element includes a concave mirror surface. The mirror surface reflects the laser light toward the opening, and reduces the divergence angle of the laser light along the first axis.

21 Claims, 35 Drawing Sheets

(51) Int. Cl.
*H01S 5/02208* (2021.01)
*H01S 5/02218* (2021.01)
*H01S 5/02251* (2021.01)
*H01S 5/02255* (2021.01)
*H01S 5/02257* (2021.01)
*H01S 5/02325* (2021.01)
*H01S 5/02253* (2021.01)
*H01S 5/024* (2006.01)
*H01S 5/40* (2006.01)

(52) U.S. Cl.
CPC ...... *H01S 5/02218* (2021.01); *H01S 5/02251* (2021.01); *H01S 5/02257* (2021.01); *H01S 5/02325* (2021.01); *H01S 5/02253* (2021.01); H01S 5/02476 (2013.01); H01S 5/4025 (2013.01)

(58) Field of Classification Search
CPC ............ H01S 5/02257; H01S 5/02325; H01S 5/02253; H01S 5/02476; H01S 5/4025
See application file for complete search history.

(56) References Cited

U.S. PATENT DOCUMENTS

| | | | |
|---|---|---|---|
| 2006/0056276 A1* | 3/2006 | Shimano | G11B 7/123 369/112.02 |
| 2015/0131692 A1 | 5/2015 | Hayamizu et al. | |
| 2015/0255960 A1* | 9/2015 | Kanskar | H01S 5/4043 359/641 |
| 2017/0170629 A1* | 6/2017 | Lerner | G02B 19/0052 |
| 2019/0032907 A1 | 1/2019 | Kuribayashi et al. | |
| 2021/0159664 A1* | 5/2021 | Liu | H01S 5/02255 |

FOREIGN PATENT DOCUMENTS

| | | |
|---|---|---|
| JP | 2000-081550 A | 3/2000 |
| JP | 2013-235943 A | 11/2013 |
| JP | 2015-099388 A | 5/2015 |
| JP | 2016-092236 A | 5/2016 |
| JP | 2016-115694 A | 6/2016 |
| JP | 2019-029477 A | 2/2019 |

* cited by examiner

FIG. 39
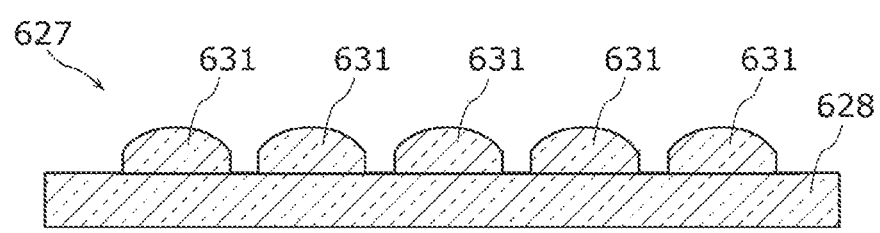
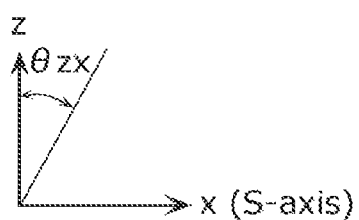

SEMICONDUCTOR LASER MODULE

CROSS REFERENCE TO RELATED APPLICATIONS

This is a continuation application of PCT International Application No. PCT/JP2020/002996 filed on Jan. 28, 2020, designating the United States of America, which is based on and claims priority of Japanese Patent Application No. 2019-034609 filed on Feb. 27, 2019. The entire disclosures of the above-identified applications, including the specifications, drawings and claims are incorporated herein by reference in their entirety.

FIELD

The present disclosure relates to a semiconductor laser module.

BACKGROUND

High-power laser light has been utilized for processing purposes. As a light source that emits such high-power laser light, a semiconductor laser chip is used. Since the light emitted from semiconductor laser chip diverges, a semiconductor laser module is used which includes the semiconductor laser chip and a collimator element in combination (see e.g., Patent Literature (PTL) 1).

In the semiconductor device described in PTL 1, a stem for placing the semiconductor laser chip includes a concave reflector with a parabolic reflecting surface (i.e., a mirror surface) that collimates the light emitted from the semiconductor laser chip. This configuration aims to collimate the light emitted from the semiconductor laser chip without any extra collimator element.

CITATION LIST

Patent Literature

PTL 1: Japanese Unexamined Patent Application Publication No. S60-182781

SUMMARY

Technical Problem

In the semiconductor device described in PTL 1, however, the reflecting surface is formed on the stem made of metal, for example. It is thus more difficult to form the parabolic reflecting surface than to form a single element with a reflecting surface.

In order to solve the problem, it is an objective of the present disclosure to provide a semiconductor laser module including a semiconductor laser chip and a collimator element with a mirror surface, and capable of easily forming the mirror surface.

Solution to Problem

In order to achieve the objective, a semiconductor laser module according to an aspect of the present disclosure includes: at least one semiconductor laser chip; at least one first collimator element; and a package containing the at least one semiconductor laser chip and the at least one first collimator element. The package includes: a body in a bottomed cylindrical shape including a bottom in a plate shape and a top with an opening; a cap member attached to the top; and a window member located in the cap member and having a translucency. Each of the at least one semiconductor laser chip includes a light-emitting point for emitting laser light. Each of the at least one semiconductor laser chip is placed on the bottom so as to emit the laser light in a direction parallel to a principal surface of the bottom. The laser light has a divergence angle along a first axis greater than a divergence angle along a second axis, the first axis extending perpendicularly to a propagating direction of the laser, the second axis extending perpendicularly to the propagating direction and the first axis. Each of the at least one first collimator element includes a mirror surface in a concave shape and opposed to the light-emitting point. The mirror surface reflects the laser light toward the opening and reduces the divergence angle of the laser light along the first axis.

As described above, unlike the concave reflector described in PTL 1, the first collimator element may not be integral with a part of the case. Accordingly, as a single body, the first collimator element can be easily formed which has a mirror surface in a desired shape.

In addition, the mirror surface collimates the laser light. The laser light is thus collimated in the following position as compared to the case where the light-emitting surface of the transmissive collimator lens collimates the laser light. The position is closer to the light-emitting point. That is, in the position, the spot diameter is increased with a relatively smaller width by the divergence of the laser light. As a result, the laser light is formed with a smaller spot diameter along the fast axis (i.e., the first axis). Accordingly, the density of the laser light increases. Since the laser light has the smaller spot diameter along the fast axis, a shorter optical path length suffices to set the ratio of the spot diameters of the laser light between the fast axis and the slow axis (i.e., the second axis) to a predetermined value. As a result, the semiconductor laser module can be miniaturized.

The semiconductor laser module according to another aspect of the present disclosure may further include at least one submount joined to the bottom. Each of the at least one semiconductor laser chip may be joined to the bottom via the at least one submount.

Since the semiconductor laser chip is mounted on such the submount, the heat generated in the semiconductor laser chip is dissipated via the submount.

In the semiconductor laser module according to another aspect of the present disclosure, each of the at least one submount may include a surface including a front surface extending orthogonally to a direction in which the laser light of a corresponding one of the at least one semiconductor laser chip is emitted. Each of the at least one first collimator element may be placed with the mirror surface opposed to the front surface.

In this manner, the first collimator element is provided separately from the submount on which the semiconductor laser chip is mounted. This configuration facilitates the formation of the first collimator element than in the case where the first collimator element and the submount are formed integrally.

The semiconductor laser module according to another aspect of the present disclosure may further include at least one second collimator element. Each of the at least one second collimator element may reduce the divergence angle along the second axis of the laser light reflected by one of the at least one first collimator element.

Accordingly, the laser light is collimated by reducing the divergence angles of the laser light from the semiconductor laser chip along both the first and second axes.

In the semiconductor laser module according to another aspect of the present disclosure, the cap member may include an inner surface facing the body, and an outer surface on a backside of the inner surface. The at least one second collimator element may be located at the outer surface.

This configuration requires a smaller size of the package than in the case where the second collimator element is located at the inner surface of the cap member. In addition, the aberration of the second collimator element can be reduced using, as the second collimator element, a lens having a flat surface at the cap member and a convex surface such as a cylindrical surface as the opposite surface (i.e., the outer surface). Accordingly, the beam quality of the light emitted from the semiconductor laser module is less degraded. In this specification, a cylindrical surface has no curvature in one direction parallel to the surface of a lens or a mirror. The cylindrical surface includes not only a cylindrical surface with a constant curvature in the direction perpendicular to the one direction and a surface (e.g., a parabolic cylindrical surface) with a curvature variable in the direction perpendicular to the one direction. Each of the cylindrical lenses and the cylindrical mirrors in this specification has the cylindrical surface described above.

In the semiconductor laser module according to another aspect of the present disclosure, the cap member may include an inner surface facing the body, and an outer surface on a backside of the inner surface. The at least one second collimator element may be located at the inner surface.

With this configuration, the cap member has a flatter outer surface than in the case where the second collimator element is located at the outer surface of the cap member. Accordingly, an additional component can be easily mounted at the outer surface of the cap member.

In the semiconductor laser module according to another aspect of the present disclosure, the at least one second collimator element and the window member may be formed integrally.

With this configuration, the semiconductor laser module requires a smaller number of components, which simplifies the assembly procedure.

In the semiconductor laser module according to another aspect of the present disclosure, the package may seal an inside space.

This configuration reduces the contamination of the optical or other elements located in the space inside the package. For example, if laser light has a short wavelength ranging from ultraviolet light to blue light, the siloxane generated from resin, for example, is drawn to an area with a higher light intensity and deposited on the optical path of the optical element. The contamination of the optical element in this manner may cause a problem such as degradation in the beam quality. In the semiconductor laser module according to an aspect of the present disclosure, the sealed package reduces the siloxane flowing into the package from the outside, and thus reduces the contamination of the optical element with the siloxane. As a result, the beam quality of the laser light is less degraded.

In the semiconductor laser module according to another aspect of the present disclosure, the at least one semiconductor laser chip and the at least one first collimator element may be joined to the package by a joining member containing no resin.

This configuration reduces the amount of the siloxane within the sealed package. The configuration thus reduces the contamination of the optical element with the siloxane and resultant degradation of the beam quality of the laser light, for example, even if laser light has a short wavelength ranging from ultraviolet light to blue light.

In the semiconductor laser module according to another aspect of the present disclosure, an optical path length may be at least 30 µm and at most 300 µm from the light-emitting point to the mirror surface of one of the at least one first collimator element on which the laser light is incident.

In this manner, the distance is reduced from the light-emitting point to the mirror surface of the first collimator element. The laser light is thus collimated in a position closer to the light-emitting point, that is, in a position in which the spot diameter is increased with a relatively smaller width by the divergence of the laser light. As a result, the laser light is formed with a smaller spot diameter along the fast axis. Accordingly, the density of the laser light increases.

In the semiconductor laser module according to another aspect of the present disclosure, an optical path length may be at least 1450 µm and at most 4200 µm from the light-emitting point to one of the at least one second collimator element on which the laser light is incident.

The optical path length of 1450 µm or more from the light-emitting point to the second collimator element reduces the interference between the first and second collimator elements, even if the optical path length is relatively long, for example, about 700 µm from the light-emitting point to the first collimator element. On the other hand, the optical path length of 4200 µm or less from the light-emitting point to the second collimator element reduces spot diameter BDS along the second axis of the laser light to about 1000 µm or less. Accordingly, less loss occurs when the laser light enters the tip lens of a general lens-tip equipped optical fiber. The size of the semiconductor laser module is less increased.

In the semiconductor laser module according to another aspect of the present disclosure, an optical path length may be at least 900 µm and at most 4200 µm from the light-emitting point to one of the at least one second collimator element on which the laser light is incident.

The optical path length of 900 µm or more from the light-emitting point to the second collimator element reduces the interference between the first and second collimator elements, even if the optical path length is relatively long, for example, about 700 µm from the light-emitting point to the first collimator element. On the other hand, the optical path length of 4200 µm or less from the light-emitting point to the second collimator element reduces spot diameter BDS along the second axis of the laser light to about 1000 µm or less. Accordingly, less loss occurs when the laser light enters the tip lens of a general lens-tip equipped optical fiber. The size of the semiconductor laser module is less increased.

In the semiconductor laser module according to another aspect of the present disclosure, at least one of the cap member or the top may include, in a junction area in which the cap member and the top overlap each other in a plan view of the bottom: a first protrusion with a cross-sectional area variable in accordance with a position in a direction perpendicular to the principal surface of the bottom; and a second protrusion with a cross-sectional area not variable in accordance with the position in the direction perpendicular to the principal surface of the bottom.

For example, even if the cap member and the top are joined by resistance projection welding using the first protrusion, the shape of the second protrusion hardly changes. Accordingly, the second protrusion improves the accuracy in positioning the cap member with respect to the top.

In the semiconductor laser module according to another aspect of the present disclosure, the at least one semiconductor laser chip may include a plurality of semiconductor laser chips. The at least one first collimator element may include one first collimator element opposed to the light-emitting point of each of the plurality of semiconductor laser chips.

This configuration requires a smaller number of the first collimator elements. In addition, all the laser beams are collimated and reflected by the same first collimator element, which reduces displacement among the plurality of laser beams.

In the semiconductor laser module according to another aspect of the present disclosure, a maximum width of each of the at least one first collimator element in the direction in which the laser light is emitted may be at least twice a maximum width of the mirror surface in the direction in which the laser light is emitted.

Accordingly, the part other than the mirror surface is larger than in the case where the first collimator element has, in the laser light emitting direction, a width about the maximum width of the mirror surface. The first collimator element is thus handled easily. For example, assume that the first collimator element is joined to the bottom of the package. In this case, the joining area increases more than in the case where the first collimator element has, in the laser light emitting direction, a width about the maximum width of the mirror surface. Accordingly, the joining strength increases between the first collimator element and the bottom, for example.

The semiconductor laser module according to another aspect of the present disclosure may further include a beam rotating element (beam twister) outside the package.

Accordingly, the laser light rotates with respect to the optical axis at a predetermined angle.

The semiconductor laser module according to another aspect of the present disclosure may further include a lens-tip equipped optical fiber that receives the laser light reflected by the at least one first collimator element.

Accordingly, the laser light is easily introduced into the optical fiber. In addition, the optical fiber and the lens are formed integrally, which reduces extra works for adjusting the optical axis.

In the semiconductor laser module according to another aspect of the present disclosure, each of the at least one second collimator element may include a convex surface. BDS>1.1×LFAC×1.5×n may be satisfied, where: n, where n≥1, is a number of light-emitting points; LFAC is an optical path length from each of the light-emitting points to the mirror surface on an optical axis of the laser light; and BDS is a spot diameter of the laser light along the second axis on the convex surface.

This configuration reduces a too large decrease in the spot diameter along the second axis with respect to the spot diameters of n laser beams along the first axis, when n laser beams are aligned along the first axis. Accordingly, when n laser beams are introduced into an optical fiber with a circular cross-section, the entire cross-section of the optical fiber can be used effectively.

In the semiconductor laser module according to another aspect of the present disclosure, a distance between adjacent two of the light-emitting points may be at least 1.2 times BDS.

This configuration reduces the interference between two adjacent laser beams.

In the semiconductor laser module according to another aspect of the present disclosure, the body may include a side part extending along an outer edge of the bottom. The side part may include a plurality of lead pins electrically connected to the at least one semiconductor laser chip.

Using such the lead pins, the electric power is easily supplied from the outside of the package to the semiconductor laser chip.

Advantageous Effects

The present disclosure provides a semiconductor laser module including a semiconductor laser chip and a collimator element with a mirror surface, and capable of easily forming the mirror surface.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 39 is a schematic cross-sectional view showing a shape of a window member according to Embodiment 7.

DESCRIPTION OF EMBODIMENTS

Now, embodiments of the present disclosure will be described with reference to the drawings. Note that the embodiments described below are mere specific examples of the present disclosure. The numerical values, shapes, materials, constituent elements, the arrangement and connection of the constituent elements etc. shown in the following embodiments are thus mere examples, and are not intended to limit the scope of the present disclosure. Among the constituent elements in the following embodiments, those not recited in any of the independent claims defining the broadest concept of the present disclosure are described as optional constituent elements.

The figures are schematic representations and not necessarily drawn strictly to scale. The scales are thus not necessarily the same in the figures. In the figures, substantially the same constituent elements are assigned with the same reference marks, and redundant descriptions will be omitted or simplified.

In this specification, the terms "above" and "below" do not represent upward (i.e., vertically above) and downward (i.e., vertically below) in absolute spatial perception, but used as the terms defined by the relative positional relationship based on the order of staking the elements in a multi-layer structure. The terms "above" and "below" are applicable not only to two constituent elements spaced apart from each other with another constituent element interposed therebetween, but also to two constituent elements in contact with each other.

Embodiment 1

A semiconductor laser module according to Embodiment 1 will be described,

[1-1. Overall Configuration]

Figure 1:
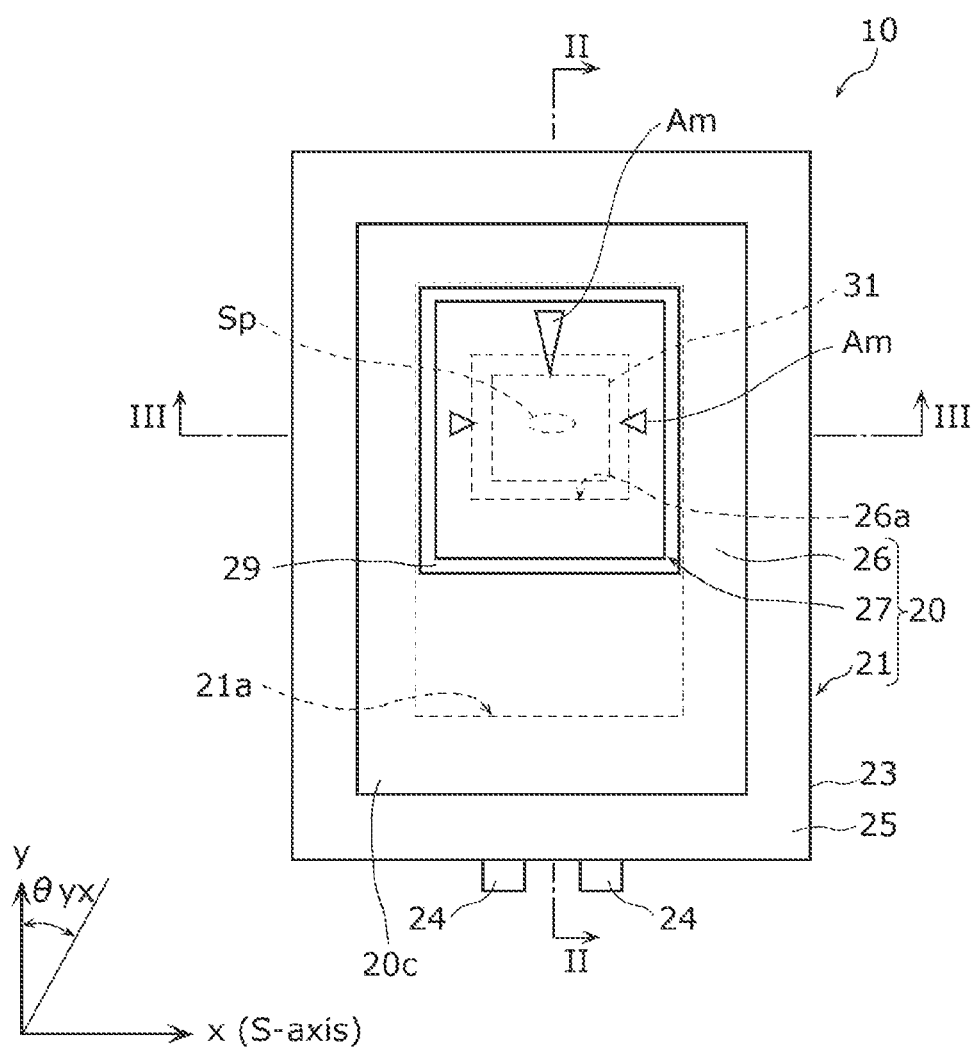
FIG. 1 is a schematic plan view showing an overall configuration of a semiconductor laser module according to Embodiment 1.
Figure 2:
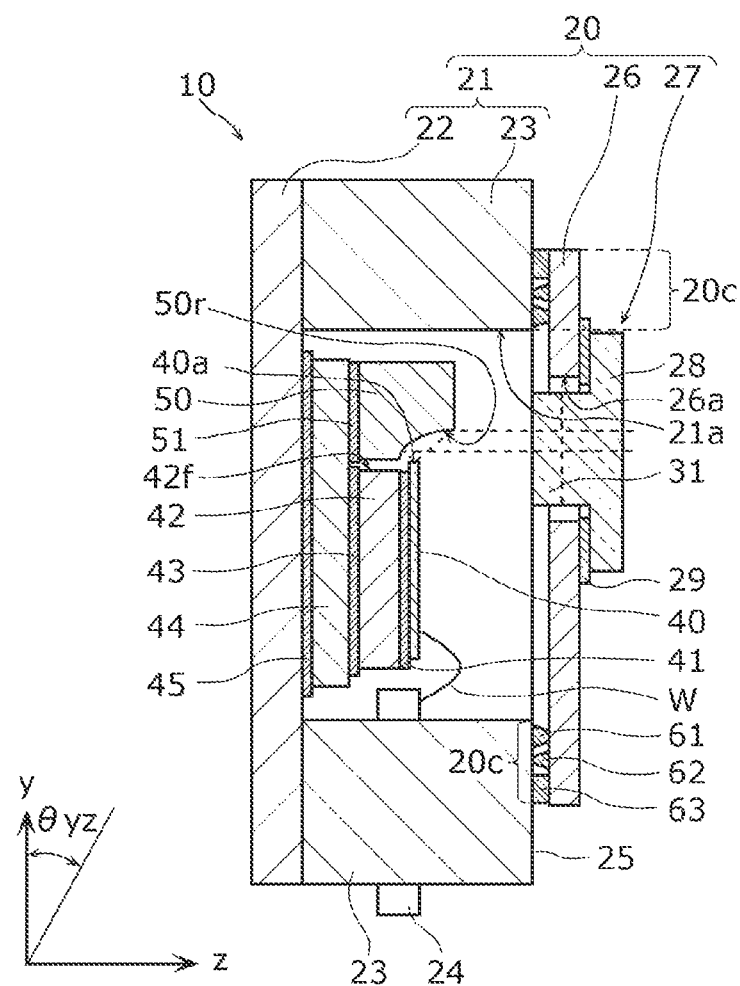
FIG. 2 is a first schematic cross-sectional view showing the overall configuration of the semiconductor laser module according to Embodiment 1.
Figure 3:
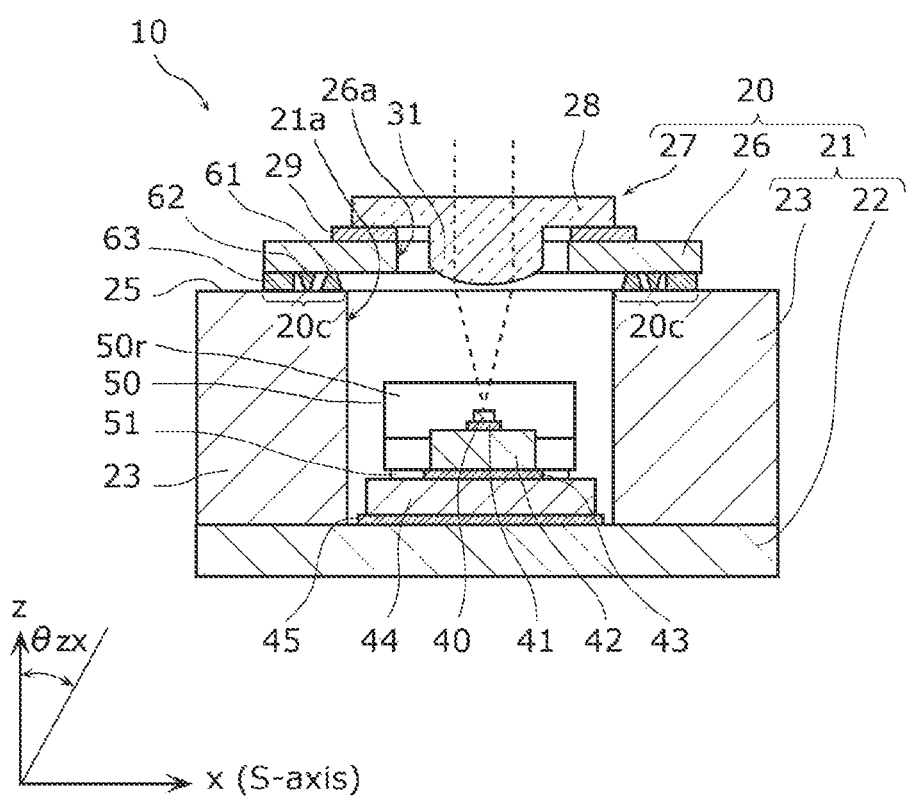
FIG. 3 is a second schematic cross-sectional view showing the overall configuration of the semiconductor laser module according to Embodiment 1.

First, an overall configuration of the semiconductor laser module according to this embodiment will be described with reference to FIGS. 1 to 3. FIGS. 1, 2, and 3 are a schematic plan view, a first schematic cross-sectional view, and a second schematic cross-sectional view, respectively, showing the overall configuration of semiconductor laser module 10 according to this embodiment. FIG. 2 shows a cross-section taken along line II-II in FIG. 1. FIG. 3 shows a cross-section taken along line III-III in FIG. 1. In these and subsequent figures, a "z-axis" extends in the vertical direction, and "x-axis" and "y-axis" extend perpendicularly to the z-axis and to each other. In the figure, the positive sides of the x-, y-, and z-axes form the right-handed coordinate system. For example, in FIG. 1, the positive side of the z-axis (not shown) is vertical to the paper and located at the front of the paper. In FIG. 2, the positive side of the x-axis (not shown) is vertical to the paper and located at the back of the paper.

Semiconductor laser module 10 emits laser light and includes package 20 as shown in FIGS. 1 to 3. As shown in FIGS. 2 and 3, semiconductor laser module 10 further includes semiconductor laser chip 40 and first collimator element 50. In this embodiment, semiconductor laser module 10 further includes second collimator element 31, submount 42, and heat sink 44.

Package 20 is a case containing at least one semiconductor laser chip 40 and at least one first collimator element 50. Package 20 includes body 21, cap member 26 attached to top 25, and window member 27.

Body 21 is a bottomed cylindrical member having plate-like bottom 22 and top 25 with opening 21a. Opening 21a is an example of the first opening at the end of body 21 opposite to the end at bottom 22. In this embodiment, body 21 has bottom 22 and side part 23.

Bottom 22 is a plate-like member at the bottom of body 21. In this embodiment, bottom 22 is a rectangular plate-like member. Placed on the principal surface of bottom 22 inside package 20 is semiconductor laser chip 40, for example. The material of bottom 22 is not particularly limited and may be Cu or a Cu-based alloy, for example. If used, such a material with a higher thermal conductivity promotes the dissipation of the heat generated by semiconductor laser chip 40, for example.

Side part 23 is a cylindrical member standing on the principal surface of bottom 22 inside package 20. Located at one opening end of side part 23 is bottom 22. Located at the other opening end, that is, at top 25 is cap member 26. In other words, top 25 is one end surface of side part 23 opposed to cap member 26. In this embodiment, side part 23 is a cylindrical member extending along the outer edge of bottom 22 and having openings at both ends. Side part 23 has a rectangular opening. The opening at top 25 of side part 23 is the first opening (i.e., opening 21a) described above. Side part 23 and bottom 22 are joined air tight by a joining member having a higher melting point than solder such as a brazing material.

Side part 23 includes a plurality of lead pins 24 electrically connected to semiconductor laser chip 40. In the example shown in FIGS. 1 and 2, side part 23 has two lead pins 24. As shown in FIG. 2, lead pins 24 extend from the outside of package 20 through side part 23 to the inside of package 20. Side part 23 with such lead pins 24 allows easier power supply from the outside of package 20 to semiconductor laser chip 40. As long as being conductive, the material of lead pins 24 is not particularly limited and may be Cu, a Cu-based alloy, Fe, or a Fe-based alloy, for example. Although not shown, the part of side part 23 around lead pins 24 is made of an insulating member such as glass with a low melting point. This configuration allows insulation between lead pins 24 and package 20. On the other hand, the material of the part of side part 23 other than lead pins 24 and the part around thereof is not particularly limited and may be Fe or a Fe-based alloy, for example.

As shown In FIGS. 2 and 3, top 25 includes first protrusion 61 and second protrusion 63 in junction area 20c in which cap member 26 and top 25 overlap each other in a plan view of bottom 22. First protrusion 61 has a cross-sectional area variable in accordance with the position in the direction perpendicular to the principal surface of bottom 22. Second protrusion 63 has a cross-sectional area not variable in accordance with the position in the direction perpendicular to the principal surface of bottom 22. In the following description, "in a plan view of bottom 22" means a "plan view of the principal surface of bottom 22".

First protrusion 61 is a part for joining top 25 and cap member 26 through resistance projection welding. As shown in FIGS. 2 and 3, first protrusion 61 has a triangular cross-section whose area decreases with an increasing distance from bottom 22. In other words, the width of first protrusion 61 (i.e., the width of first protrusion 61 in the cross-section perpendicular to the longitudinal direction) decreases with an increasing distance from bottom 77. First protrusion 61 extends continuously throughout the circumference of opening 21a. Accordingly, top 25 and cap member 26 are kept air tight.

Second protrusion 63 is a part for positioning cap member 26 with respect to top 25 of body 21. In this embodiment, second protrusion 63 extends throughout the circumference of opening 21a. Accordingly, cap member 26 is positioned more accurately with respect to top 25. Note that second protrusion 63 does not necessarily extend throughout the circumference of opening 21a. For example, second protrusion 63 may extend intermittently (i.e., discretely) along the circumference of opening 21a.

As described above, top 25 according to this embodiment includes first protrusion 61 and second protrusion 63. Even if cap member 26 and top 25 are joined by resistance projection welding using first protrusion 61, the shape of second protrusion 63 hardly changes. Accordingly, second protrusion 63 improves the accuracy in positioning cap member 26 with respect to top 25.

Cap member 26 is attached to top 25 of body 21. Cap member 26 has an inner surface facing body 21 and an outer surface on the backside of the inner surface. As shown in FIG. 1, cap member 26 overlaps top 25 throughout the circumference of opening 21a in a plan view of bottom 22. Cap member 26 has opening 26a to overlap opening 21a of body 21 in a plan view of bottom 22. Opening 26a is an example of the second opening that penetrates cap member 26 around the center of cap member 26 in a plan view. The material of cap member 26 is not particularly limited and may be Fe or a Fe-based alloy, for example.

As shown in FIGS. 2 and 3, cap member 26 includes first protrusion 62 in junction area 20c in which cap member 26 and top 25 overlap each other in a plan view of bottom 22. First protrusion 62 has a cross-sectional area variable in accordance with the position in the direction perpendicular to the principal surface of bottom 22 (see FIG. 1 for junction area 20c in a plan view of bottom 22). First protrusion 62 is located on the inner surface of cap member 26.

First protrusion 62 is a part for joining top 25 and cap member 26 through resistance projection welding. As shown in FIGS. 2 and 3, first protrusion 62 has a triangular cross-section whose area decreases with a decreasing distance to bottom 22. In other words, the width of first protrusion 62 (i.e., the width of first protrusion 62 in the cross-section perpendicular to the longitudinal direction) decreases with a decreasing distance to bottom 22. First protrusion 62 extends continuously throughout the circumference of opening 21a. Accordingly, top 25 and cap member 26 are kept air tight. In this embodiment, double resistance projection welding with first protrusions 61 and 62 improves the air tight keeping performance between top 25 and cap member 26 more than in single resistance projection welding.

Window member 27 is a translucent member in cap member 26. In this embodiment, window member 27 closes opening 26a of cap member 26. In this embodiment, second collimator element 31 and window member 27 are formed integrally. As shown in FIGS. 2 and 3, second collimator element 31 is the part of window member 27 including the optical axis of the laser light. In FIGS. 2 and 3, the ends of the area in which the laser light propagates are indicated by the broken lines. In this manner, second collimator element 31 and window member 27 are integral so that semiconductor laser module 10 requires a smaller number of components, which simplifies the assembly procedure.

Window member 27 includes plate 28 around second collimator element 31. Plate 28 is joined to cap member 26. Being translucent, the material of window member 27 is not particularly limited. Window member 27 is made of glass, for example. In this embodiment, window member 27 and cap member 26 are joined air tight by joining member 29. The material of joining member 29 is not particularly limited and may be, for example, glass with a low melting point.

As shown in FIG. 1, window member 27 includes alignment marks Am for adjusting the optical axes of the laser light and second collimator element 31. By positioning spot Sp of the laser light with respect to alignment marks Am, the optical axis of the second collimator element can be easily adjusted.

As described above, the constituent elements of package 20 according to this embodiment are joined air tight. That is, package 20 seals the inside space. This configuration reduces the contamination of the optical or other elements located in the space inside package 20. For example, if the laser light has a short wavelength ranging from ultraviolet light to blue light, the siloxane generated from resin, for example, is drawn to an area with a higher light intensity and deposited on the optical path of the optical element. The contamination of the optical element in this manner may cause a problem such as degradation in the beam quality. In semiconductor laser module 10 according to this embodiment, sealed package 20 reduces the siloxane flowing into package 20 from the outside, and thus reduces the contamination of the optical element with the siloxane. As a result, the beam quality of the laser light is less degraded.

Semiconductor laser chip 40 is a light source of semiconductor laser module 10, and is a semiconductor light-emitting element having an optical waveguide with two end surfaces and light-emitting point 40a on one of the end surfaces. More specifically, semiconductor laser chip 40 includes a substrate, a semiconductor multilayer structure on the substrate, and an optical waveguide in the semiconductor multilayer structure. The optical waveguide has a width ranging, for example, from about 10 μm to about 500 μm. Light-emitting point 40a is the point on the emitting side surface of the light emitting layer of the semiconductor multilayer structure. As long as capable of emitting laser light, the configuration of semiconductor laser chip 40 is not particularly limited. In this embodiment, semiconductor laser chip 40 is a nitride semiconductor laser chip that emits laser light with a short wavelength ranging from ultraviolet light to blue light.

Semiconductor laser chip 40 is located above bottom 22 to emit the laser light in parallel to the principal surface of bottom 22. In this embodiment, as shown in FIG. 2, the laser light is emitted from light-emitting point 40a along the y-axis, and the principal surface of bottom 22 is parallel to the x-y plane. Semiconductor laser chip 40 is joined to bottom 22 via submount 42.

The laser light emitted from semiconductor laser chip 40 has a first axis (or a fast axis) and a second axis (a slow axis or an S-axis). The first axis is a beam axis parallel to the direction of stacking the semiconductor multilayer structure. The second axis is a beam axis perpendicular to the light propagating direction and the stacking direction. Divergence angle θvmax of the laser light along the first axis is greater than divergence angle θh along the second axis. In this embodiment, the first and second axes between light-emitting point 40a and first collimator element 50 are parallel to the z- and x-axes, respectively. Note that each divergence angle is defined by the angle between the optical axis and the line connecting light-emitting point 40a and the point where the light intensity of the laser light on the far-field pattern is $1/e^2$ of the light intensity on the optical axis.

Semiconductor laser chip 40 is electrically connected to lead pins 24 by wires W. In this embodiment, lead pin 24 applied with a lower potential and an n-type electrode (not shown) of the semiconductor laser chip are connected by wire W. On the other hand, lead pin 24 applied with a higher potential and a p-type electrode (not shown) of the semiconductor laser chip are connected by wire W. Accordingly, electric power is supplied to semiconductor laser chip 40 via lead pins 24. In FIG. 2, wire W is not shown which connects lead pin 24 and the p-type electrode.

Submount 42 is a base joined to bottom 22. Mounted on submount 42 is semiconductor laser chip 40. In this embodiment, submount 42 has a rectangular parallelepiped shape. The surface of surmount 42 includes front surface 42f extending orthogonally to the laser light emitting direction (i.e., the y-axis). Front surface 42f is parallel to the z-x plane. The material of submount 42 is not particularly limited. Submount 42 may be made of, for example, a single crystal substrate (e.g., a Si substrate or a SiC substrate), a ceramic substrate (e.g., an AlN substrate or a SiC substrate), a diamond substrate, an alloy (e.g., Cu—W or Cu—Mo), or a composite material (e.g., Mg—SiC, Cu-diamond, or Ag-diamond). In this embodiment, submount 42 is joined to bottom 22 via heat sink 44. That is, semiconductor laser chip 40 is joined to bottom 22 via submount 42 and heat sink 44. Semiconductor laser chip 40 is joined to submount 42 by joining member 41. The material of joining member 41 is not particularly limited and may be AuSn solder, for example.

Submount 42 is joined to heat sink 44 via joining member 43. Joining member 43 may be AuSn solder, for example.

Heat sink 44 is a base joined to bottom 22 and dissipates the heat generated by semiconductor laser chip 40, for example. In this embodiment, heat sink 44 has a rectangular parallelepiped shape and is joined to the principal surface of bottom 22 via joining member 45. As long as having a high thermal conductivity, the material of heat sink 44 is not particularly limited and may be a Cu-based material, for example. Joining member 45 is solder (made of a material such as Sn, Ag, Cu, Au, Bi, Ni, Sb, or In alone or in combination, e.g., SnAgCu) with a lower melting point (e.g., 140° C. to 250° C.) than joining member 43, for example. In order to increase the joining strength between heat sink 44 and joining members 43 and 45, the surfaces of heat sink 44 may be plated. For example, Ni—Au plating may be applied to the surfaces of heat sink 44.

First collimator element 50 is a one-dimensional concave mirror located, in package 20, opposed to light-emitting point 40a of semiconductor laser chip 40. First collimator element 50 is a cylindrical mirror with mirror surface 50r. Mirror surface 50r has no curvature in a direction parallel to the surface, and a concave shape in a cross-section perpendicular to the direction. As a concave reflecting surface, a spherical, aspherical, or paraboloidal surface, for example, may be selected in accordance with the optical design. First collimator element 50 is placed to have a concave reflecting surface along the first axis. Mirror surface 50r reflects the laser light toward opening 21a and reduces the divergence angle of the laser light along the first axis. In this embodiment, mirror surface 50r reflects the laser light propagating along the y-axis to the z-axis and changes the orientation of the laser light by 90°. The laser light reflected by mirror surface 50r is incident on second collimator element 31. In order to enable this, first collimator element 50 is placed so that mirror surface 50r overlaps openings 21a and 26a in a plan view of bottom 22. In other words, first collimator element 50 is placed so that the x- and y-axes of mirror surface 50r coincide with the x- and y-axes of openings 21a and 26a.

Mirror surface 50r has a parabolic shape having, as a focal point, light-emitting point 40a on the light-emitting surface of semiconductor laser chip 40. Note that mirror surface 50r is a parabolic cylindrical surface having no curvature along the x-axis and parallel to the x-axis. This reduces the divergence angle of the laser light emitted from light-emitting point 40a along the first axis. That is, mirror surface 50r reduces the divergence angle of the laser light along the first axis. In this manner, first collimator element 50 according to this embodiment simultaneously performs the collimation and the conversion of the optical axis by the reflection of the laser light. As a result, semiconductor laser module 10 requires a smaller number of components. In addition, extra works such as the alignment of first collimator element 50 can be reduced. Semiconductor laser chip 40 is located on submount 42 so as to protrude from submount 42 toward first collimator element 50. In one preferred embodiment, first collimator element 50 is formed so that the focal point of mirror surface 50r is located on the plane extending from the surface, of first collimator element 50, adjacent to mirror surface 50r and opposed to submount 42. Accordingly, the alignment of light-emitting point 40a on the light-emitting surface of semiconductor laser chip 40 to the extending plane described above allows light-emitting point 40a to coincide with the focal point of mirror surface 50r.

The optical axis of the laser light extends in the vertical direction (along the z-axis in FIGS. 1 to 3). Accordingly, the spot of the laser light can be visually checked, which facilitates visual alignment of the optical axis. This configuration improves the productivity of semiconductor laser module 10 and thus reduces the costs. Note that the first axis of the laser light reflected by mirror surface 50r is parallel to the y-axis.

As shown in FIGS. 2 and 3, first collimator element 50 has a shape obtained by cutting out an area including one side of the upper surface of a cuboid. The cut-out surface is a paraboloidal surface (i.e., mirror surface 50r). Note that the cross-section parallel to the y-z plane of mirror surface 50r that is the paraboloidal surface has a parabolic shape having, as a focal point, light-emitting point 40a or a point on a line passing through light-emitting point 40a and parallel to the x-axis. On mirror surface 50r, a reflecting film may be formed which increases the reflectance of the laser light. The reflecting film may be a dielectric multilayer film, for example. Note that the reflecting film may be a metal film.

First collimator element 50 is placed with mirror surface 50r opposed to front surface 42f of submount 42. In this manner, first collimator element 50 is provided which is not integral with submount 42 on which semiconductor laser chip 40 is mounted. This configuration easily forms first collimator element 50 while improving the accuracy of the paraboloidal surface as compared to the case where first collimator element 50 and submount 42 are formed integrally. The material of first collimator element 50 is not limited and may be glass, for example. In the use of such glass, first collimator element 50 can be easily formed in a desired shape by high-temperature press molding, for example.

First collimator element 50 is joined to package 20 by joining member 51. In this embodiment, first collimator element 50 is joined to package 20 via heat sink 44. In addition, joining member 51 contains no resin. Specifically, joining member 51 may be solder containing no resin and having a low melting point. This configuration reduces the amount of the siloxane within the sealed package. For example, even if laser light has a short wavelength ranging from ultraviolet light to blue light, the contamination of the optical element with the siloxane and resultant degradation in the beam quality of the laser light can be reduced. Note that ozone cleaning through irradiation with ultraviolet light before sealing the package further reduces the contamination and the resultant degradation in the beam quality of the laser light. If first collimator element 50 is made of glass, a metal film may be formed on the surface of first collimator element 50 joined to joining member 51 to increase the joining strength with joining member 51. For example, Ti, Pt, and Au may be stacked on the surface of first collimator element 50 joined to joining member 51 in the order from the joined surface. The metal film may be obtained by stacking two or more of Ti, Pt, Au, Cr, Ni, and Pd. In the order from the joined surface, a material highly adhesive with glass of first collimator element 50, a material with barrier properties against the Sn contained in joining member 51, and a material in which the Sn contained in joining member 51 is easily diffused may be stacked.

Second collimator element 31 reduces the divergence angle along the second axis of the laser light reflected by first collimator element 50. In this embodiment, second collimator element 31 is a cylindrical lens having a convex shape toward bottom 22 and a curvature with respect to the plane defined by the second axis and the light travel direction. As shown in FIG. 3, second collimator element 31 is opposed to mirror surface 50r so that the laser light reflected by first collimator element 50 is incident, and reduces the divergence angle of the laser light along the x-axis that is the second axis. As described above, second collimator element 31 is integrally formed with window member 27. Second collimator element 31 is located at the outer surface of cap member 26. This configuration reduces the size of package 20 than in the case where second collimator element 31 is located at the inner surface of cap member 26.

Out of the surfaces of the second collimator element, antireflection coating films are formed on the laser light incident surface and the light-emitting surface. Note that the antireflection coating films only need to reduce the reflection of the laser light and are not limited to the films that reflect no laser light at all.

Figure 4:
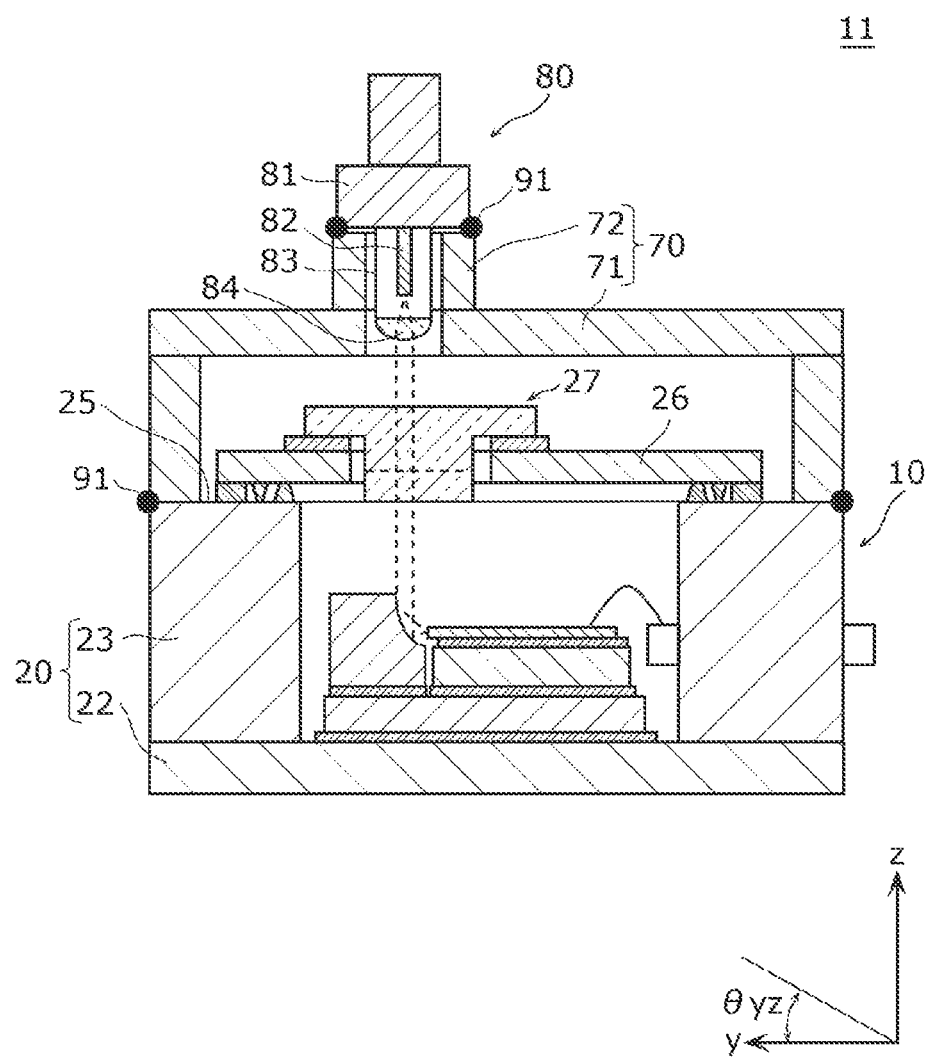
FIG. 4 is a first schematic cross-sectional view showing another overall configuration of the semiconductor laser module according to Embodiment 1.
Figure 5:
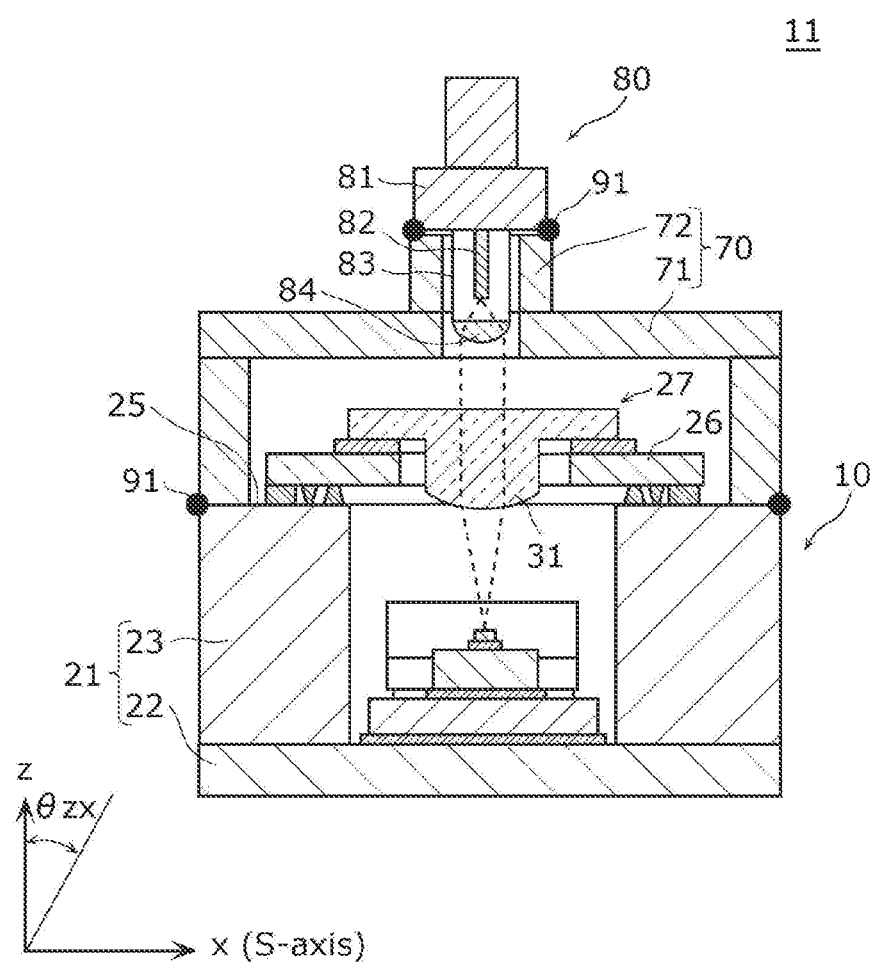
FIG. 5 is a second schematic cross-sectional view showing the other overall configuration of the semiconductor laser module according to Embodiment 1.

Note that semiconductor laser module 10 may be combined with another optical element such as an optical fiber. An example configuration of such the semiconductor laser module will be described with reference to FIGS. 4 and 5. FIGS. 4 and 5 are first and second schematic cross-sectional views, respectively, showing an overall configuration of semiconductor laser module 11 according to this embodiment. FIGS. 4 and 5 are cross-sectional views of semiconductor laser module 11 in the same or similar positions in the cross-sectional views shown in FIGS. 2 and 3.

As shown in FIGS. 4 and 5, semiconductor laser module 11 includes semiconductor laser module 10 described above and lens-tip equipped optical fiber 80. In this embodiment, semiconductor laser module 11 further includes fiber holder 70.

Lens-tip equipped optical fiber 80 is a light guide member that receives the laser light reflected by first collimator element 50. In this embodiment, lens-tip equipped optical fiber 80 is an assembly including optical fiber 82, condenser lens 84, ferrule 83, and flange 81.

Optical fiber 82 is a waveguide that guides the laser light incident on a facet. Condenser lens 84 is an optical element that converges the laser light into the facet of optical fiber 82. Out of the surfaces of condenser lens 84, antireflection coating films are formed against the laser light on the laser light incident surface and the light-emitting surface. Note that the antireflection coating films only need to reduce the reflection of the laser light and are not limited to the films that reflect no laser light at all. Ferrule 83 is a member that is fixed to flange 81 and keeps optical fiber 82 and condenser lens 84. Flange 81 is fixed to fiber holder 70 and keeps optical fiber 82 and condenser lens 84 via ferrule 83.

Fiber holder 70 is a member that holds lens-tip equipped optical fiber 80. Fiber holder 70 includes fixture 71 and cylinder 72. Fixture 71 is a part fixed to package 20 and covers cap member 26. Fixture 71 has an opening opposed to second collimator element 31. Cylinder 72 is located around the opening. Cylinder 72 is a cylindrical part into which optical fiber 82 and condenser lens 84 are inserted, and fixed to fixture 71 to locate the hole in cylinder 72 in the position of the opening in fixture 71. This configuration allows the laser light emitted from second collimator element 31 to enter optical fiber 82 through the opening in fixture 71. Here, the opening of fixture 71 is opposed to the laser light incident surface of second collimator element 31 in a convex shape.

The material of fiber holder 70 is not particularly limited and may be Fe or a Fe-based alloy, for example. Fiber holder 70 and side part 23 of body 21 are joined by spot welding, for example. FIGS. 4 and 5 show spot welding marks 91 formed by spot welding. Lens-tip equipped optical fiber 80 may be joined to fiber holder 70 by spot welding. Fiber holder 70 may be positioned by visual alignment so that the center of the hole of cylinder 72 of the fiber holder coincides with spot Sp of the laser light of second collimator element 31. Fiber holder 70 may be then fixed to body 21 by spot welding.

As described above, semiconductor laser module 11 according to this embodiment includes lens-tip equipped optical fiber 80 that receives the laser light reflected by first collimator element 50. Accordingly, the laser light is easily introduced into optical fiber 82. In addition, optical fiber 82 and condenser lens 84 are integral, which reduces extra works for adjusting the optical axis. Lens-tip equipped optical fiber 80 may irradiate semiconductor laser chip 40 with light, and positions the center through active alignment so that lens-tip equipped optical fiber 80 receives the maximum optical power. Lens-tip equipped optical fiber 80 may be then fixed to the fiber holder by spot welding.

[1-2. Advantageous Effects]

Figure 6A:
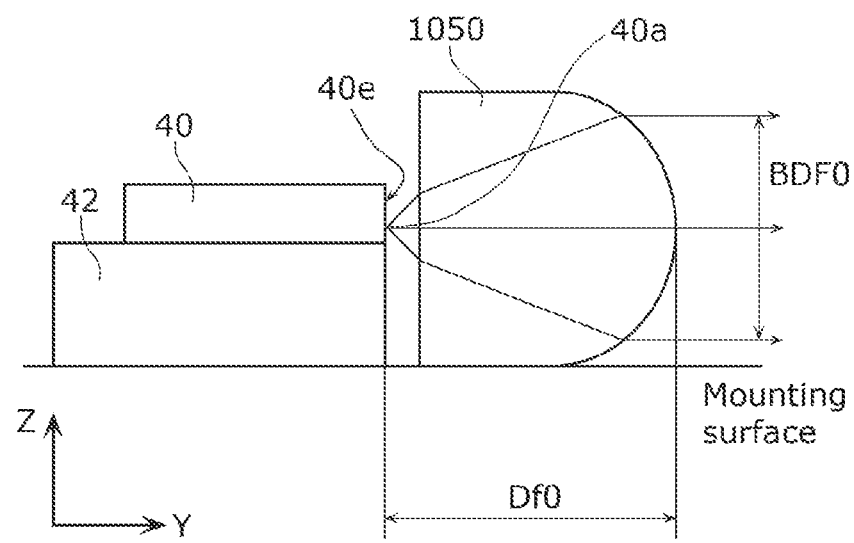
FIG. 6A is a schematic side view showing a first collimator element according to a comparative example.
Figure 6B:
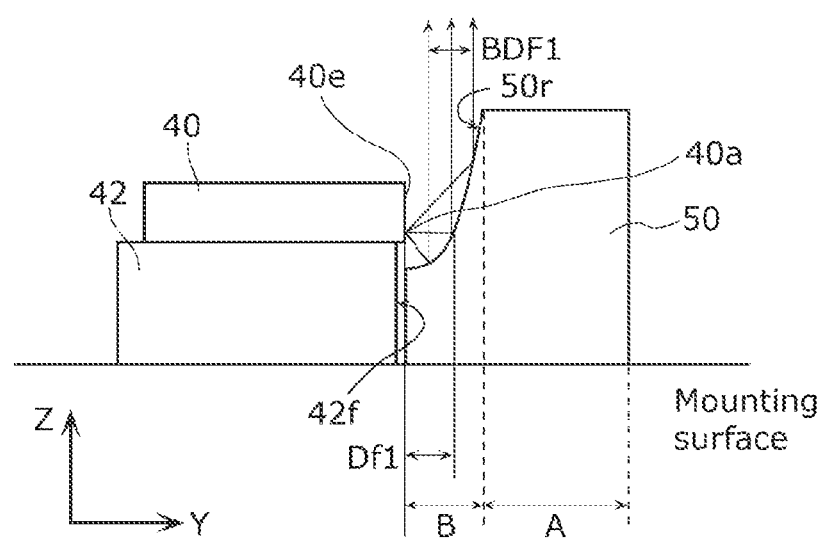
FIG. 6B is a schematic side view showing a first collimator element according to Embodiment 1.

Now, advantageous effects of semiconductor laser modules 10 and 11 according to this embodiment will be described with reference to FIGS. 6A, 6B, and 7. FIGS. 6A and 6B are schematic side views showing first collimator elements according to a comparative example and this embodiment, respectively. Each of FIGS. 6A and 6B also shows semiconductor laser chip 40 that emits laser light incident on the first collimator element, and submount 42 on which semiconductor laser chip 40 is mounted. The mounting surfaces shown in FIGS. 6A and 6B correspond to the upper surface of heat sink 44, for example.

First collimator element 1050 shown in FIG. 6A is a cylindrical lens that reduces the divergence angle of the laser light emitted from semiconductor laser chip 40 along the first axis (i.e., the z-axis). In a cylindrical lens like first collimator element 1050, the surface downstream of the laser light (i.e., the light-emitting surface) serves as a cylindrical surface that collimates the laser light to reduce the influence of aberration. It is thus difficult to reduce optical path length Df0 from light-emitting point 40a (i.e., end surface 40e of semiconductor laser chip 40 on which light-emitting point 40a is located) shown in FIG. 6A to the cylindrical surface. For example, it is in principle possible to reduce optical path length Df0 by miniaturizing first collimator element 1050. It is however difficult to handle first collimator element 1050 in a small size and there is a limit to reduce optical path length Df0. In general, optical path length Df0 is about 300 μm at the minimum. As described above, in first collimator element 1050 according to the comparative example, as optical path length Df0 relatively increases, the diverging laser light has a width relatively increasing until reaching the cylindrical surface. Accordingly, first collimator element 1050 relatively increases width BDF0 of the collimated laser light along the first axis.

On the other hand, in first collimator element 50 according to this embodiment, mirror surface 50r reduces the divergence angle along the first axis. In this embodiment, optical path length Df1 easily decreases between light-emitting point 40a and mirror surface 50r. For example, optical path length Df1 decreases to about 50 μm or less. Accordingly, width BDf1 of the collimated laser light along the first axis largely decreases as compared to width BDF0 according to the comparative example.

As described above, first, collimator element 50 according to this embodiment, mirror surface 50r collimates the laser light. The laser light is collimated in a position closer to light-emitting point 40a, that is, in a position in which the spot diameter is increased with a relatively smaller width by the divergence of the laser light than in the following case. The laser light is collimated by the light-emitting surface of a transmissive collimator lens as in first collimator element 1050 according to the comparative example. As a result, the laser light is formed with a smaller spot diameter along the first axis. Accordingly, the density of the laser light increases. In first collimator element 50 according to this embodiment, there is no need to miniaturize entire first collimator element 50 even with a decrease in optical path length Df1. For example, in order to reduce the maximum width (i.e., width B shown in FIG. 6B) of mirror surface 50r in the laser light emitting direction, there is no influence on the laser light even with an increase in the part (i.e., the part with width A shown in FIG. 6B) of first collimator element 50 other than mirror surface 50r. Thus, the maximum width (i.e., widths A+B shown in FIG. 6B) of the laser light emitting direction increases. Accordingly, while maintaining the handleability of first collimator element 50, optical path length Df1 decreases from light-emitting point 40a to mirror surface 50r. For example, the maximum width (i.e., widths A+B shown in FIG. 6B) of first collimator element 50 in the laser light emitting direction is at least twice the maximum width (width B shown in FIG. 6B) of mirror surface 50r in the laser light emitting direction. Accordingly, the part other than mirror surface 50r increases more than in the case where first collimator element 50 has, in the laser light emitting direction, a width about the maximum width of mirror surface 50r. First collimator element 50 is thus handled easily. For example, assume that first collimator element 50 is joined to bottom 22 of the package. In this case, the joining area increases more than in the case where first collimator element 50 has, in the laser light emitting direction, a width about the maximum width of mirror surface 50r. Accordingly, the joining strength increases between first collimator element 50 and bottom 22, for example. In this embodiment, the joining strength increases between first collimator element 50 and submount 42.

Figure 7:
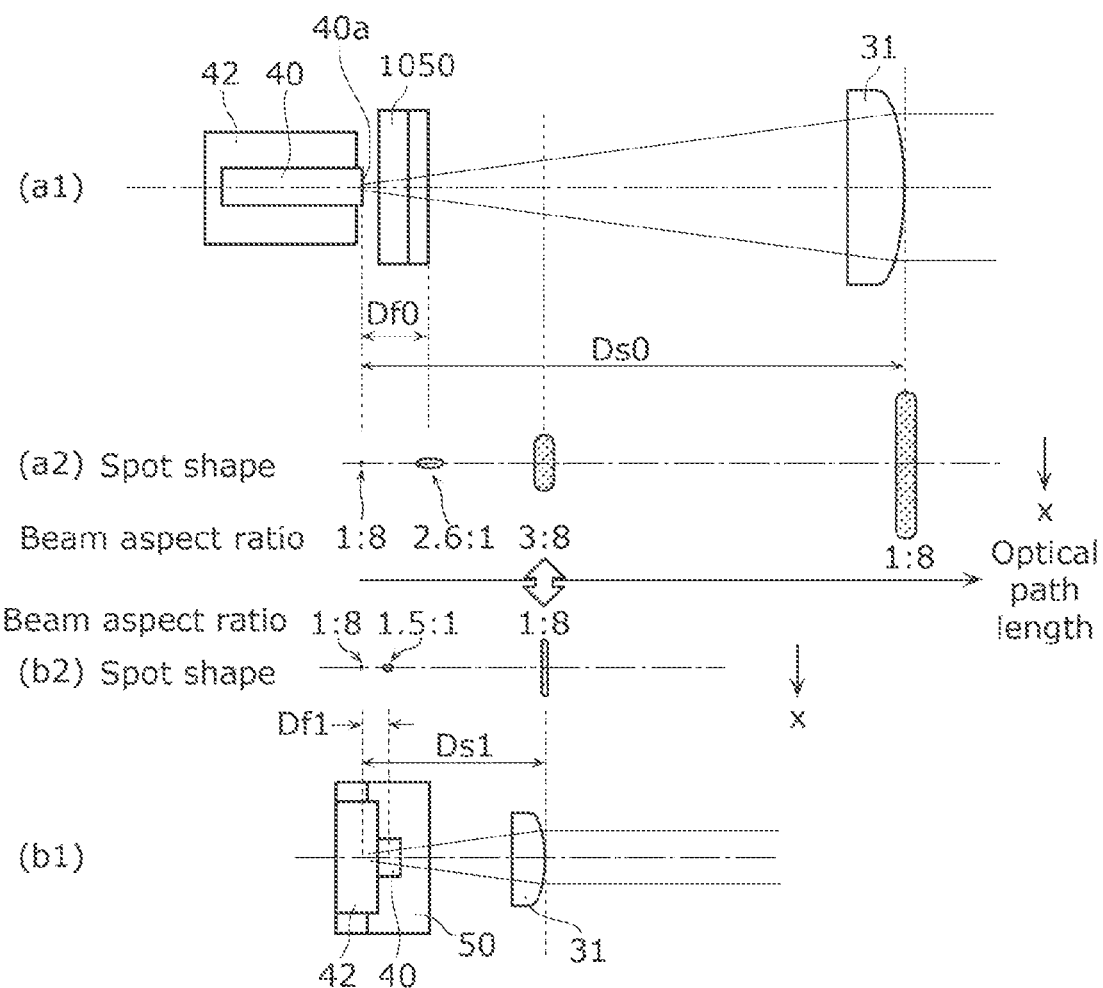
FIG. 7 is a schematic view illustrating effects of the semiconductor laser modules according to the comparative example and Embodiment 1 along a second axis.

FIG. 7 is a schematic view illustrating effects of the semiconductor laser modules according to the comparative example and this embodiment along the second axis. Schematic view (a1) of FIG. 7 shows a relationship between the semiconductor laser module according to the comparative example and the spot diameter of the laser light along the second axis. Schematic view (a2) of FIG. 7 shows a relationship between the optical path length, in which the laser light propagates, of the semiconductor laser module according to the comparative example from light-emitting point 40a and the spot shape of the laser light. Schematic view (b1) of FIG. 7 shows a relationship between the semiconductor laser module according to this embodiment and the spot diameter of the laser light along the second axis. Schematic view (b2) of FIG. 7 shows a relationship between the spot shape of the laser light and the optical path length, in which the laser light propagates, of the semiconductor laser module according to this embodiment from light-emitting point 40a. Note that FIG. 7 shows an example of using, as second collimator element 31, an element with the collimating surface serving as the light-emitting surface.

As shown in schematic view (a1) of FIG. 7, the semiconductor laser module according to the comparative example includes second collimator element 31 according to this embodiment in addition to semiconductor laser chip 40, submount 42, and first collimator element 1050 shown in FIG. 6A.

As shown in schematic views (a2) and (b2) of FIG. 7, the aspect ratio (hereinafter referred to as a "beam aspect ratio") of the spot shape of the laser light emitted from semiconductor laser chip 40 is, for example, 1:8 near light-emitting point 40a. In schematic views (a1) and (a2), the laser light diverges more along the first axis than along the second axis until reaching the light-emitting surface (i.e., the collimating surface) of first collimator element 1050 of the semiconductor laser module according to the comparative example. If optical path length Df0 is 300 μm, for example, the beam aspect ratio is about 2.6:1 on the light-emitting surface (i.e., in the position with optical path length Df0 from light-emitting point 40a) of first collimator element 1050. Downstream of first collimator element 1050, the laser light diverges not along the first axis but along the second axis. The comparative example shown in FIG. 7 determines the position of the light-emitting surface (i.e., the collimating surface) of second collimator element 31 so that the beam aspect ratio of the laser light emitted from second collimator element 31 is equal to the beam aspect ratio near light-emitting point 40a. As shown in schematic view (a1) of FIG. 7, the optical path length is Ds0 from light-emitting point 40a to the light-emitting surface (i.e., the collimating surface) of second collimator element 31. In this comparative example, optical path length Ds0 is about 9.85 mm.

On the other hand, in semiconductor laser module 10 according to this embodiment, as described above, optical path length Df1 from light-emitting point 40a to mirror surface 50r of first collimator element 50 is much shorter than optical path length Df0 according to the comparative example. On mirror surface 50r, the laser light diverges less along the first axis. For example, if optical path length Df1 is about 100 μm, mirror surface 50r of first collimator element 50 has a beam aspect ratio of about 1.5:1. Downstream of first collimator element 50, the laser light diverges not along the first axis but along the second axis. Like the comparative example described above, this embodiment determines the position of the light-emitting surface (i.e., the collimating surface) of second collimator element 31 so that the beam aspect ratio of the laser light emitted from second collimator element 31 is equal to the beam aspect ratio near light-emitting point 40a. As shown in schematic view (b1) of FIG. 7, the optical path length is Ds1 from light-emitting point 40a to the light-emitting surface (i.e., the collimating surface) of second collimator element 31. In this embodiment, optical path length Ds1 is about 3.3 mm. In the comparative example, the beam aspect ratio is 3:8 in the position of 3.15 mm from light-emitting point 40a. The ratio of the spot diameters along the second axis to the first axis is three times as high as the desired beam aspect ratio (i.e., 1:8).

As described above, in this embodiment, the spot diameter of the laser light decreases along the first axis. A shorter optical path length thus suffices to set the ratio of the spot diameters of the laser light between the first and second axes to a predetermined value. For example, optical path length Ds1 from light-emitting point 40a to second collimator element 31 is much shorter than optical path length Ds0 according to the comparative example. Accordingly, package 20 and semiconductor laser module 10 are miniaturized.

The semiconductor laser module according to this embodiment reduces the spot diameter of the collimated laser light emitted from second collimator element 31 to about one-third of the spot diameter of the laser light emitted from the semiconductor laser module according to the comparative example. Semiconductor laser module 10 according to this embodiment increases the optical density of the emitted laser light more than the optical density of the laser light emitted from the semiconductor laser module according to the comparative example.

With a decrease in the spot diameter of the laser light, less loss occurs when the laser light is incident on the tip lens of lens-tip equipped optical fiber 80 shown in FIGS. 4 and 5. The light emitted from semiconductor laser module 10 is thus directly incident on lens-tip equipped optical fiber 80 without via any other condenser lens. Accordingly, semiconductor laser module 10 requires a smaller number of components.

[1-3. Example Size of First Collimator Element]

Figure 8:
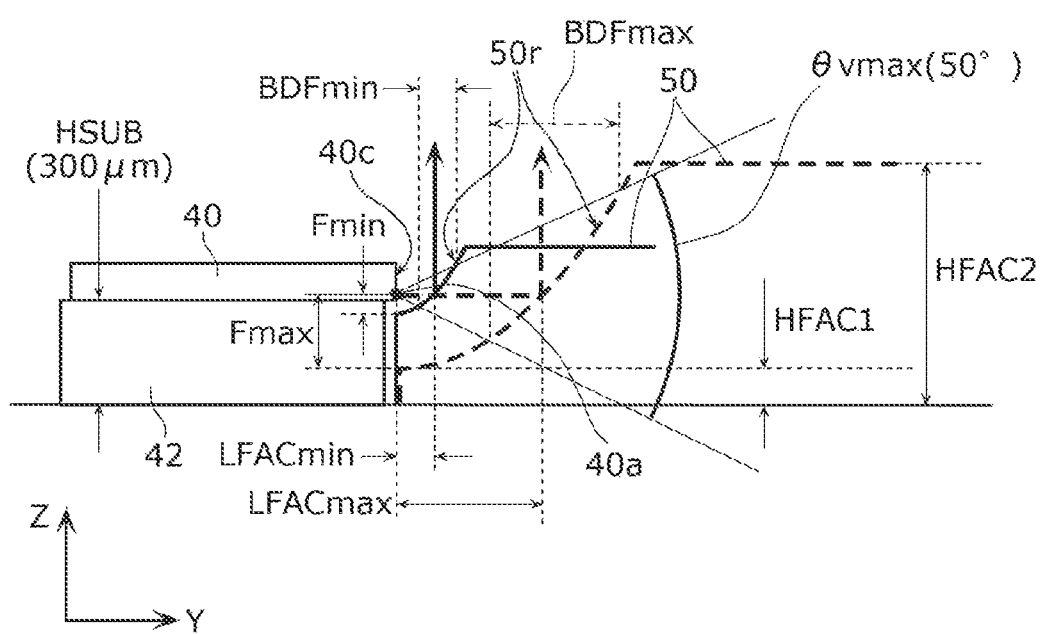
FIG. 8 is a schematic view illustrating requirements for the first collimator element according to Embodiment 1.

Now, an example size of first collimator element 50 according to this embodiment will be described with reference to FIG. 8. FIG. 8 is a schematic view illustrating requirements for first collimator element 50 according to this embodiment. FIG. 8 shows semiconductor laser chip 40, submount 42, and first collimator element 50. If distance LFAC from light-emitting point: 40a to mirror surface 50r is the minimum value (LFAC=LFACmin), first collimator element 50 is indicated by a solid line. On the other hand, if distance LFAC is the maximum value (LFAC=LFACmax), first collimator element 50 is indicated by a broken line.

FIG. 8 shows an example where the submount has height HSUB of 300 μm and divergence angle θvmax of the laser light from semiconductor laser chip 40 along the first axis is 50°.

The plane shown in FIG. 8 on which submount 42 and first collimator element 50 are located has a z-coordinate of 0. The z-coordinate of light-emitting point 40a is assumed to be 300 μm (i.e., the z-coordinate of the upper surface of submount 42 is assumed to be the z-coordinate of light-emitting point 40a). The y-coordinate of light-emitting point 40a is 0. Then, the coordinates (y and z) of the point on mirror surface 50r that is the paraboloidal surface having light-emitting point 40a as the focal point is assumed to satisfy following Expression (1).

$$z = y^2/(4F) + C \tag{1}$$

Here, the z-coordinate of light-emitting point 40a located at the focal point of the paraboloidal surface is expressed as F+C using F and C. As described above, since the z-coordinate of the light-emitting point is 300 µm, following Expression (2) is satisfied.

$$F+C=300 \text{ µm} \quad (2)$$

There are following requirements for first collimator element 50. The laser light is not projected on the surface of first collimator element 50 other than mirror surface 50r (Requirement 1). The minimum value of distance HFAC1 is 100 µm from the lower surface of first collimator element 50 to the lowermost part of mirror surface 50r (Requirement 2). The minimum value of distance HFAC1 is determined in view of the productivity of first collimator element 50. It is difficult to produce first collimator element 50 with distance HFAC1 shorter than 100 µm at a high yield.

Under the requirements described above, distance HFAC1 corresponds to C in Expression (1) described above. C is thus 100 µm or more. Based on Expression (2), F of 200 µm or less is obtained. That is, maximum value Fmax of F is 200 µm in this embodiment.

When first collimator element 50 is mounted, height HFAC1 of the lowermost part of mirror surface 50r is lowered from the height of light-emitting point 40a by 15 µm or more to reduce the interference with semiconductor laser chip 40. That is, F is 15 µm or more, and minimum value Fmin of F is 15 µm in this embodiment. From the foregoing, F satisfies following Expression (3).

$$15 \text{ µm} \leq F \leq 200 \text{ µm} \quad (3)$$

In this case, optical path length LFAC [µm] from light-emitting point 40a to mirror surface 50r satisfies following Expression (4) based on Expressions (1) to (3).

$$30 \text{ µm} \leq LFAC \leq 400 \text{ µm} \quad (4)$$

When height HFAC2 [µm] of first collimator element 50 is roughly estimated from Expressions (1) to (4) and Requirement 1 described above, following Expression (5) is satisfied.

$$312 \text{ µm} \leq HFAC2 \leq 700 \text{ µm} \quad (5)$$

Based on Expressions (1) to (5) described above, spot diameter BDF [µm] of the laser light collimated by first collimator element 50 along the first axis satisfies following Expression (6).

$$28 \text{ µm} \leq BDF \leq 370 \text{ µm} \quad (6)$$

That is, minimum BDFmin of spot diameter BDF is 28 µm and maximum value BDFmax is 370 µm. Here, based on the specification of a general tip lens of lens-tip equipped optical fiber 80 described above, the spot diameter of the laser light to be incident on lens-tip equipped optical fiber 80 is about 1000 µm or less. Accordingly, the spot diameter of the laser light emitted from semiconductor laser module 10 according to this embodiment along the first axis is sufficiently small to be incident on lens-tip equipped optical fiber 80 without using any other condenser lens.

In view of the example numerical values described above, optical path length LFAC may be at least 30 µm and at most 300 µm from light-emitting point 40a to mirror surface 50r of first collimator element 50. In this manner, the distance decreases from light-emitting point 40a to mirror surface 50r of first collimator element 50. The laser light is thus collimated in a position closer to light-emitting point 40a, that is, in a position in which the spot diameter is increased with a relatively smaller width by the divergence of the laser light. As a result, the laser light is formed with a smaller spot diameter along the fast axis. Accordingly, the density of the laser light increases.

[1-4. Manufacturing Method]

Now, a method of manufacturing semiconductor laser modules 10 and 11 according to this embodiment will be described with reference to FIGS. 9 to 17. FIGS. 9 to 17 are schematic cross-sectional views showing the steps of the method of manufacturing semiconductor laser modules 10 and 11 according to this embodiment.

Figure 9:
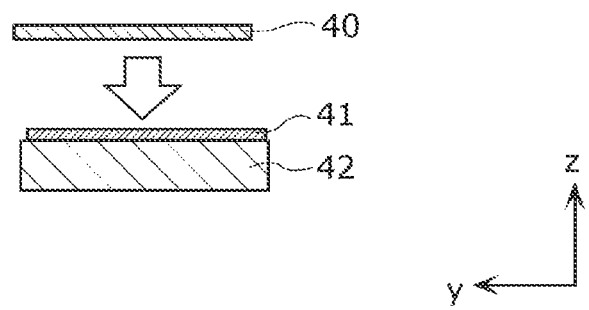
FIG. 9 is a schematic cross-sectional view showing a first step in a method of manufacturing the semiconductor laser module according to Embodiment 1.

First, as shown in FIG. 9, semiconductor laser chip 40 is mounted on submount 42. In this embodiment, semiconductor laser chip 40 is joined to submount 42 using joining member 41 (e.g., AuSn solder) containing no resin.

Figure 10:
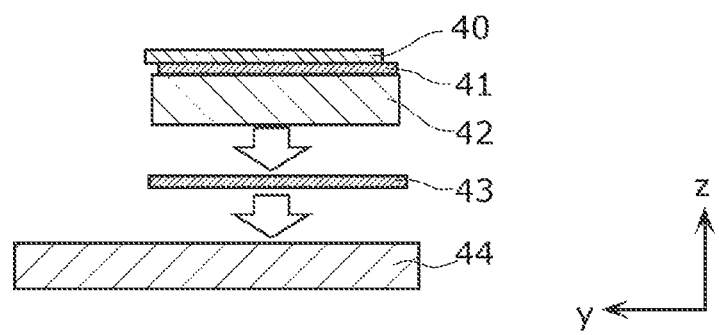
FIG. 10 is a schematic cross-sectional view showing a second step in the method of manufacturing the semiconductor laser module according to Embodiment 1.

Next, as shown in FIG. 10, submount 42 on which semiconductor laser chip 40 is joined to heat sink 44. In this embodiment, submount 42 is joined to heat sink 44 using joining member 43 (e.g., AuSn solder) containing no resin. In order to increase the joining strength between heat sink 44 and joining member 43, plating such as Ni—Au is applied on the surface of heat sink 44. Applied onto the surface of heat sink 44 may be plating made of Ni, Au, Pd, Sn, and Ag alone or in combination.

Figure 11:
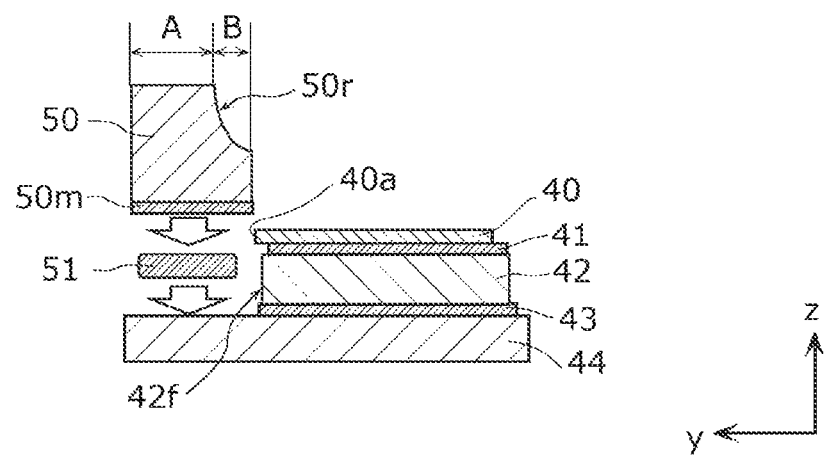
FIG. 11 is a schematic cross-sectional view showing a third step in the method of manufacturing the semiconductor laser module according to Embodiment 1.

Then, as shown in FIG. 11, first collimator element 50 is joined to heat sink 44. In this embodiment, first collimator element 50 is joined to heat sink 44 using joining member 51 (e.g., a solder with a low melting point) containing no resin. At this time, first collimator element 50 is placed with mirror surface 50r opposed to front surface 42f of submount 42. In order to increase the joining strength between first collimator element 50 and joining member 43, a metal film is formed on the surface of first collimator element 50 joined to heat sink 44 (i.e., the surface opposed to heat sink 44). Specifically, Ti, Pt, and Au are stacked on the joined surface of first collimator element 50 in the order from the joined surface. Accordingly, metal film 50m is formed on the surface of first collimator element 50 joined to heat sink 44. Note that first collimator element 50 is made of glass and formed by high-temperature press molding. On mirror surface 50r, a reflecting film is stacked which is made of a dielectric multilayer film. Note that the configuration of the reflecting film is determined as appropriate in accordance with the wavelength of the laser light. Note that the metal film may be a metal film obtained by stacking two or more of Ti, Pt, Au, Cr, Ni, and Pd. Stacked in the order from the joined surface may be a material highly adhesive with glass of first collimator element 50, a material with barrier properties against the Sn contained in joining member 51, and a material in which the Sn contained in joining member 51 is easily diffused.

Figure 12:
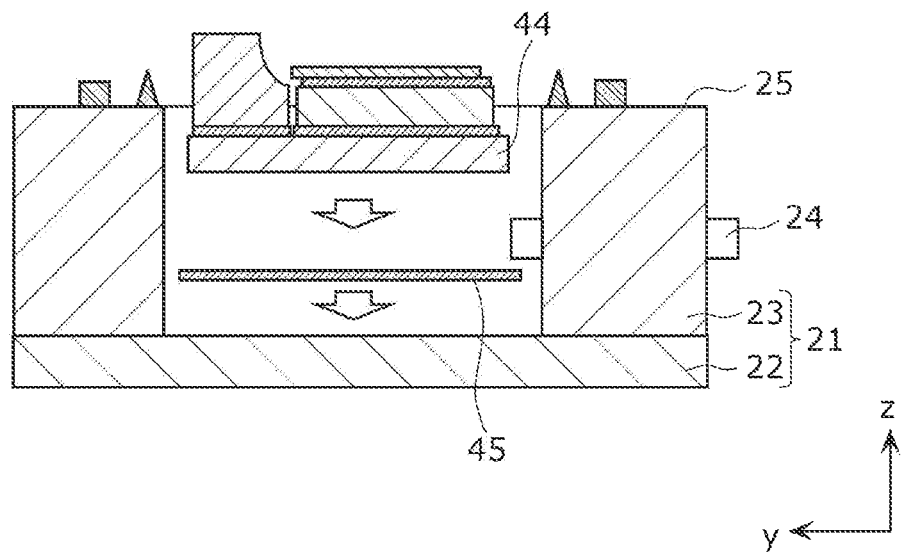
FIG. 12 is a schematic cross-sectional view showing a fourth step in the method of manufacturing the semiconductor laser module according to Embodiment 1.

After that, as shown in FIG. 12, heat sink 44 joined with semiconductor laser chip 40, submount 42, and first collimator element 50 is joined to bottom 22 of body 21. In this embodiment, heat sink 44 is joined to bottom 22 using joining member 45 made of solder with a low melting point.

Figure 13:
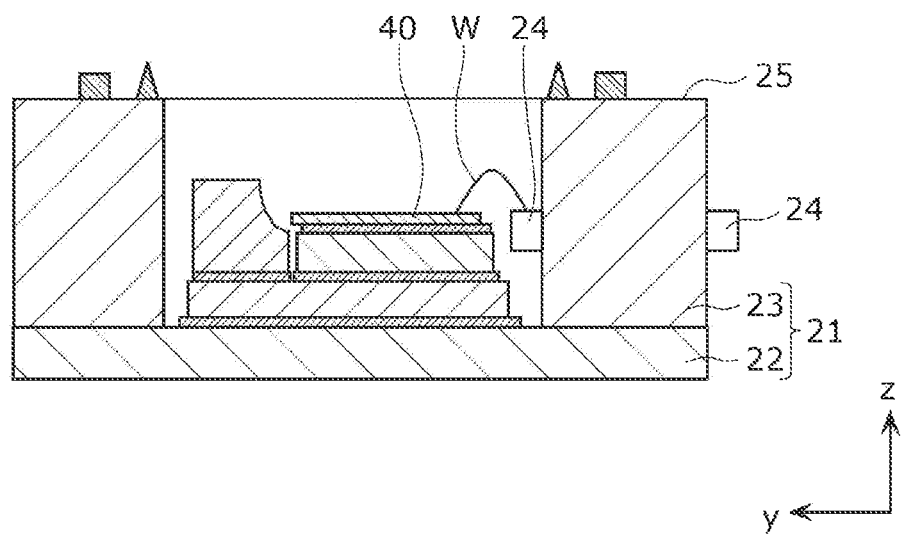
FIG. 13 is a schematic cross-sectional view showing a fifth step in the method of manufacturing the semiconductor laser module according to Embodiment 1.

Next, as shown in FIG. 13, semiconductor laser chip 40 and lead pins 24 are connected by wires W. In this embodiment, lead pin 24 applied with a lower potential and the n-type electrode (not shown) of the semiconductor laser chip are connected by wire W. On the other hand, lead pm 24 applied with a higher potential and the p-type electrode (not shown) of the semiconductor laser chip are connected by wire W. FIG. 13 shows no wire W connecting lead pin 24 and the p-type electrode.

Figure 14:
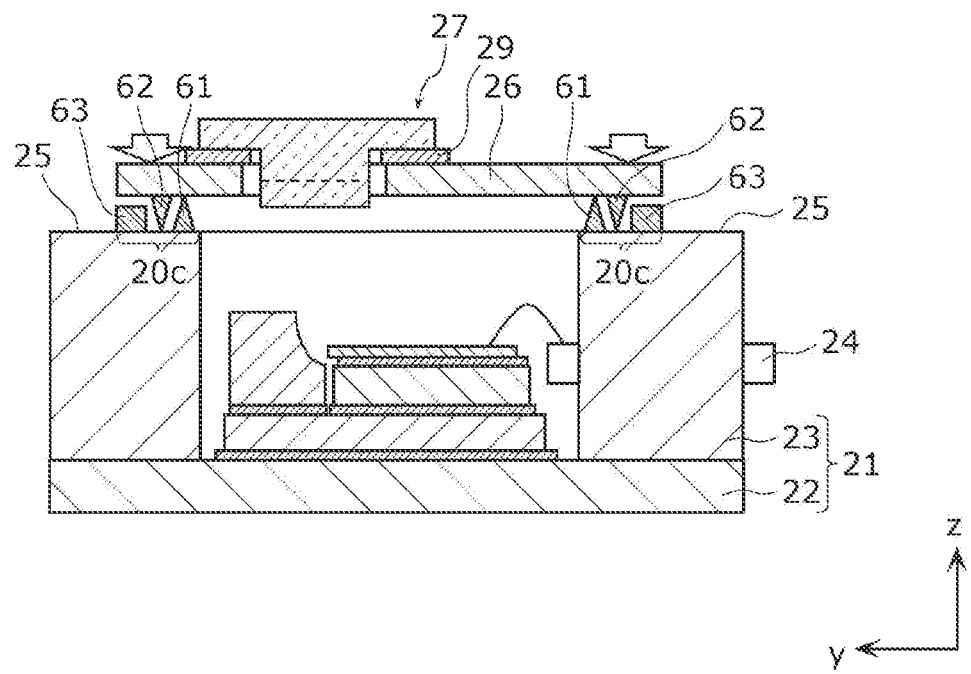
FIG. 14 is a schematic cross-sectional view showing a sixth step in the method of manufacturing the semiconductor laser module according to Embodiment 1.

Then, as shown in FIG. 14, cap member 26 and body 21 are joined. In this embodiment, cap member 26 and body 21 are joined by resistance projection welding. Specifically, in junction area 20c, a voltage is applied to cap member 26 while applying pressure to cap member 26 toward top 25 of body 21. Accordingly, in first protrusions 61 and 62, the tips of first protrusions 61 and 62 and the contact between the tips melt due to the Joule heat.

Subsequently, the application of the voltage to cap member 26 is stopped and the melted metal is cooled to join cap member 26 and body 21 together. As shown in FIG. 14, prior to this step, window member 27 is joined to cap member 26. In this embodiment, window member 27 is joined to cap member 26 using joining member 29 made of glass containing no resin and having a low melting point.

Here, in this embodiment, extending from top 25 is second protrusion 63 with a cross-sectional area not variable in accordance with the position in the direction perpendicular to the principal surface of bottom 22. Since second protrusion 63 has a constant cross-sectional area, currents do not concentrate at the tip of second protrusion 63, even when a voltage is applied to cap member 26. Accordingly, second protrusion 63 does not substantially melt. In this manner, the shape of second protrusion 63 hardly changes so that second protrusion 63 positions cap member 26 with respect to top 25. As a result, the accuracy improves in positioning cap member 26 with respect to top 25.

Figure 15:
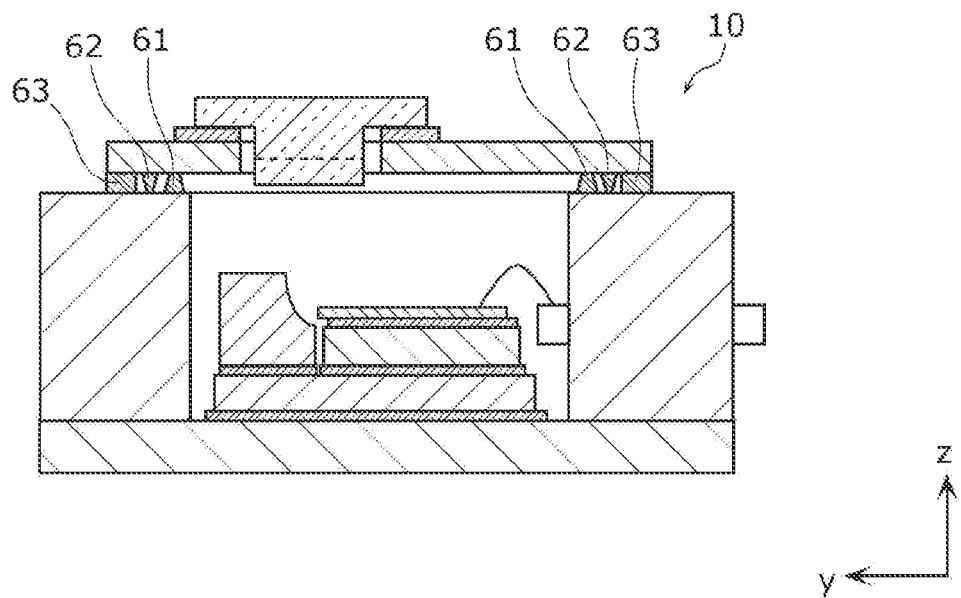
FIG. 15 is a schematic cross-sectional view showing a seventh step in the method of manufacturing the semiconductor laser module according to Embodiment 1.

Through the steps described above, semiconductor laser module 10 shown in FIG. 15 is manufactured.

Subsequently, a method of manufacturing semiconductor laser module 11 will be described.

Figure 16:
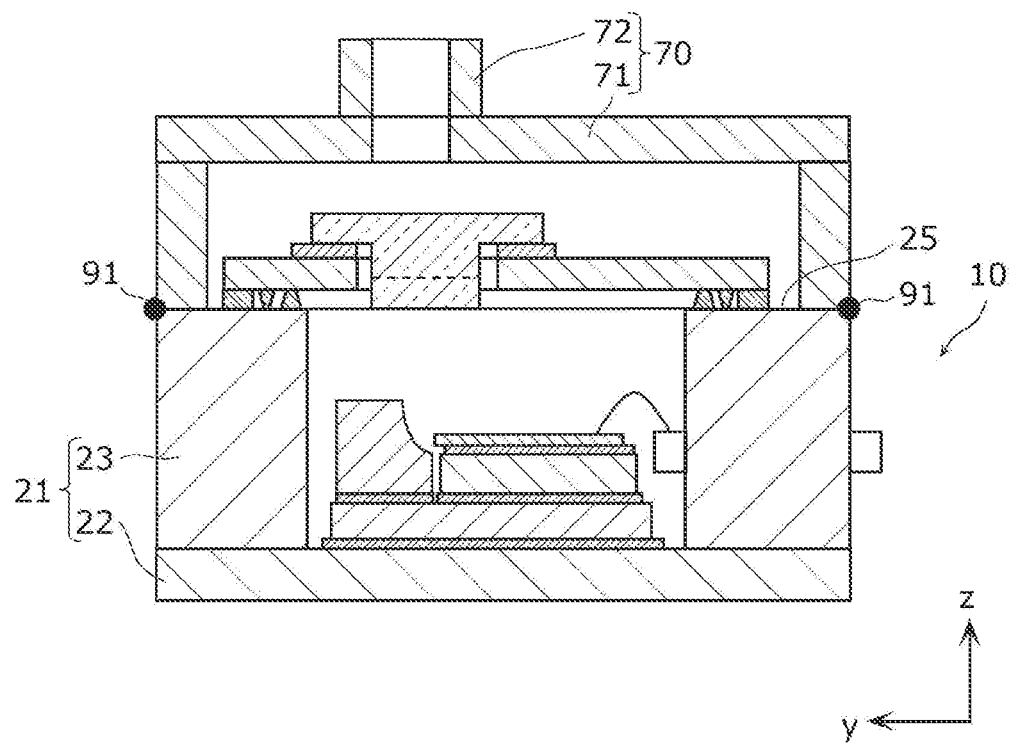
FIG. 16 is a schematic cross-sectional view showing an eighth step in the method of manufacturing the semiconductor laser module according to Embodiment 1.

As shown in FIG. 16, fiber holder 70 is joined to top 25 of body 21 of semiconductor laser module 10. In this embodiment, fiber holder 70 is joined to top 25 by spot welding. Accordingly, spot welding marks 91 are formed where the spot welding has been performed.

Figure 17:
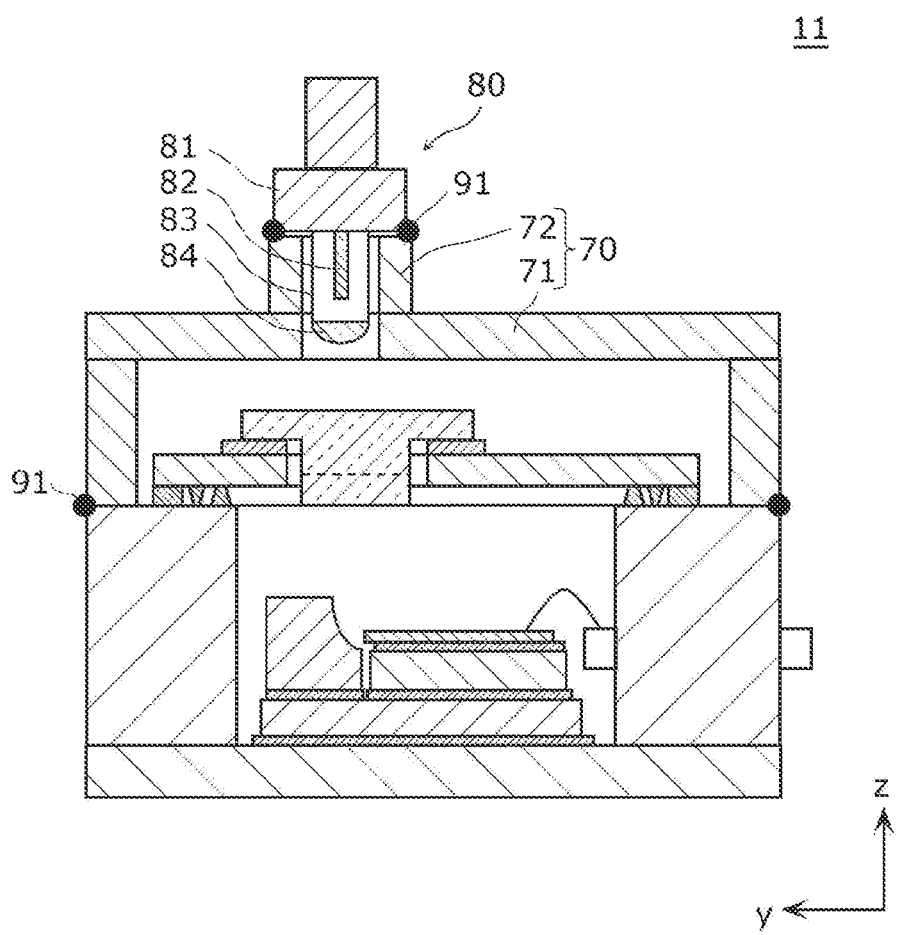
FIG. 17 is a schematic cross-sectional view showing a ninth step in the method of manufacturing the semiconductor laser module according to Embodiment 1.

Next, as shown in FIG. 17, lens-tip equipped optical fiber 80 is joined to fiber holder 70. In this embodiment, the tip of optical fiber 82 of lens-tip equipped optical fiber 80 is inserted into cylinder 72 of fiber holder 70 to join flange 81 and cylinder 72 by spot welding. Accordingly, spot welding marks 91 are formed where the spot welding has been performed.

Through the steps described above, semiconductor laser module 11 is manufactured.

Embodiment 2

A semiconductor laser module according to Embodiment 2 will be described. The semiconductor laser module according to this embodiment differs from semiconductor laser modules 10 and 11 according to Embodiment 1 mainly in including a plurality of semiconductor laser chips 40. Now, the semiconductor laser module according to this embodiment will be described focusing on the differences from semiconductor laser modules 10 and 11 according to Embodiment 1.

[2-1. Overall Configuration]

Figure 18:
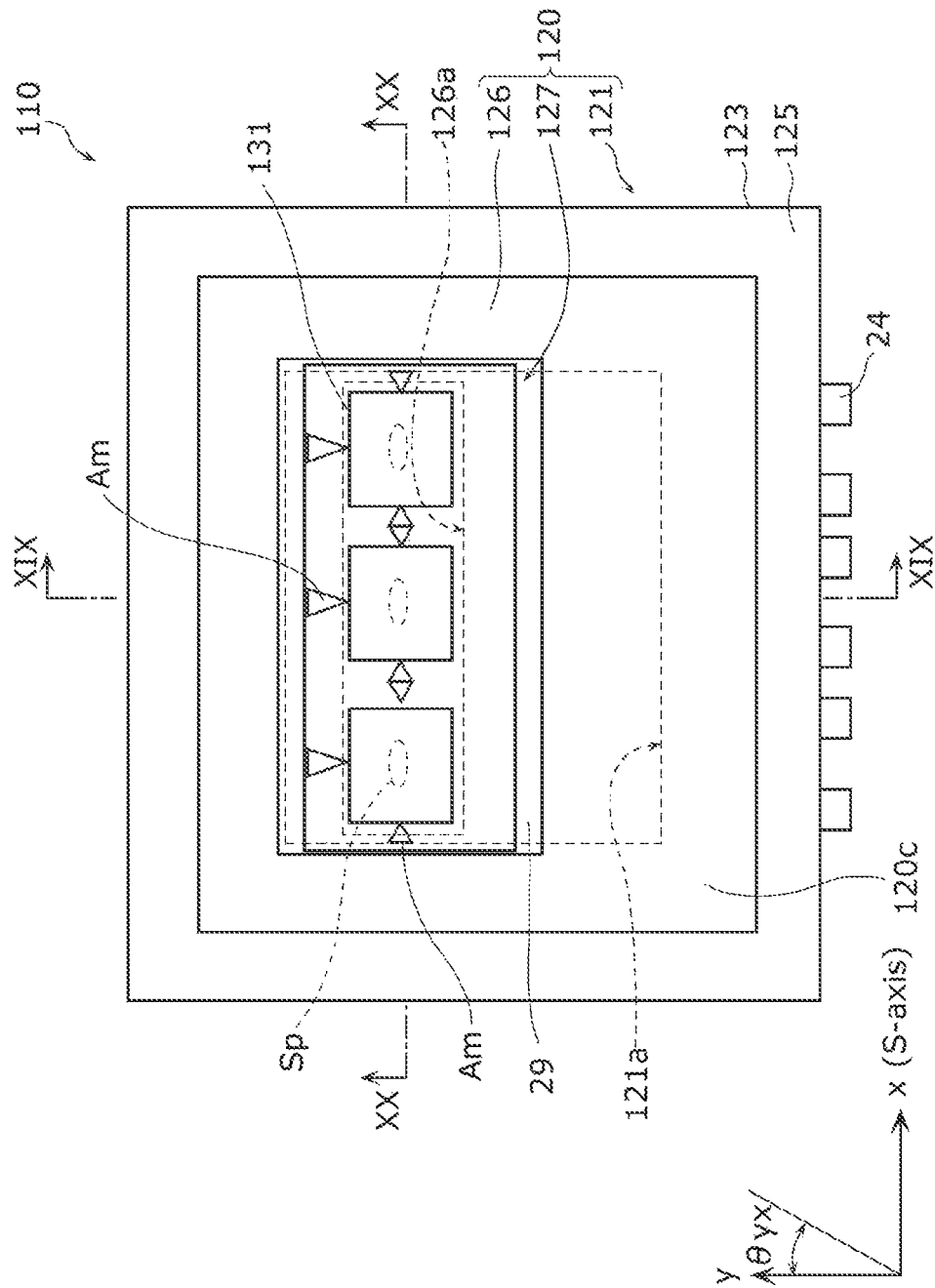
FIG. 18 is a schematic plan view showing an overall configuration of a semiconductor laser module according to Embodiment 2.
Figure 19:
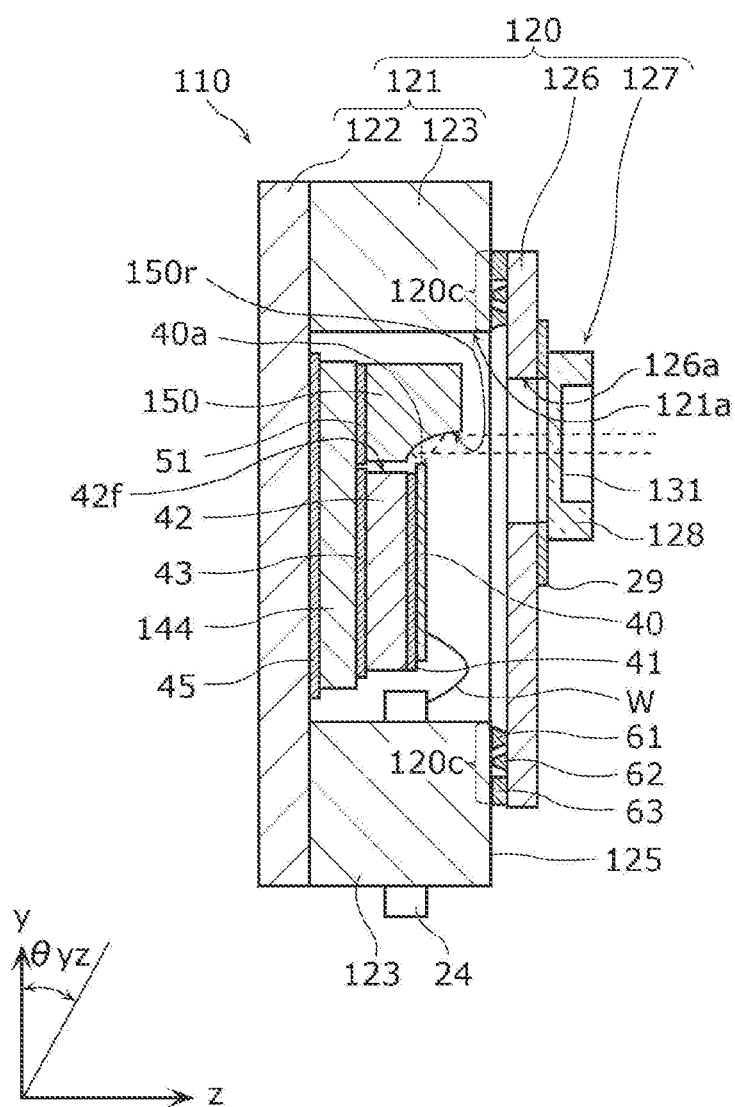
FIG. 19 is a first schematic cross-sectional view showing the overall configuration of the semiconductor laser module according to Embodiment 2.
Figure 20:
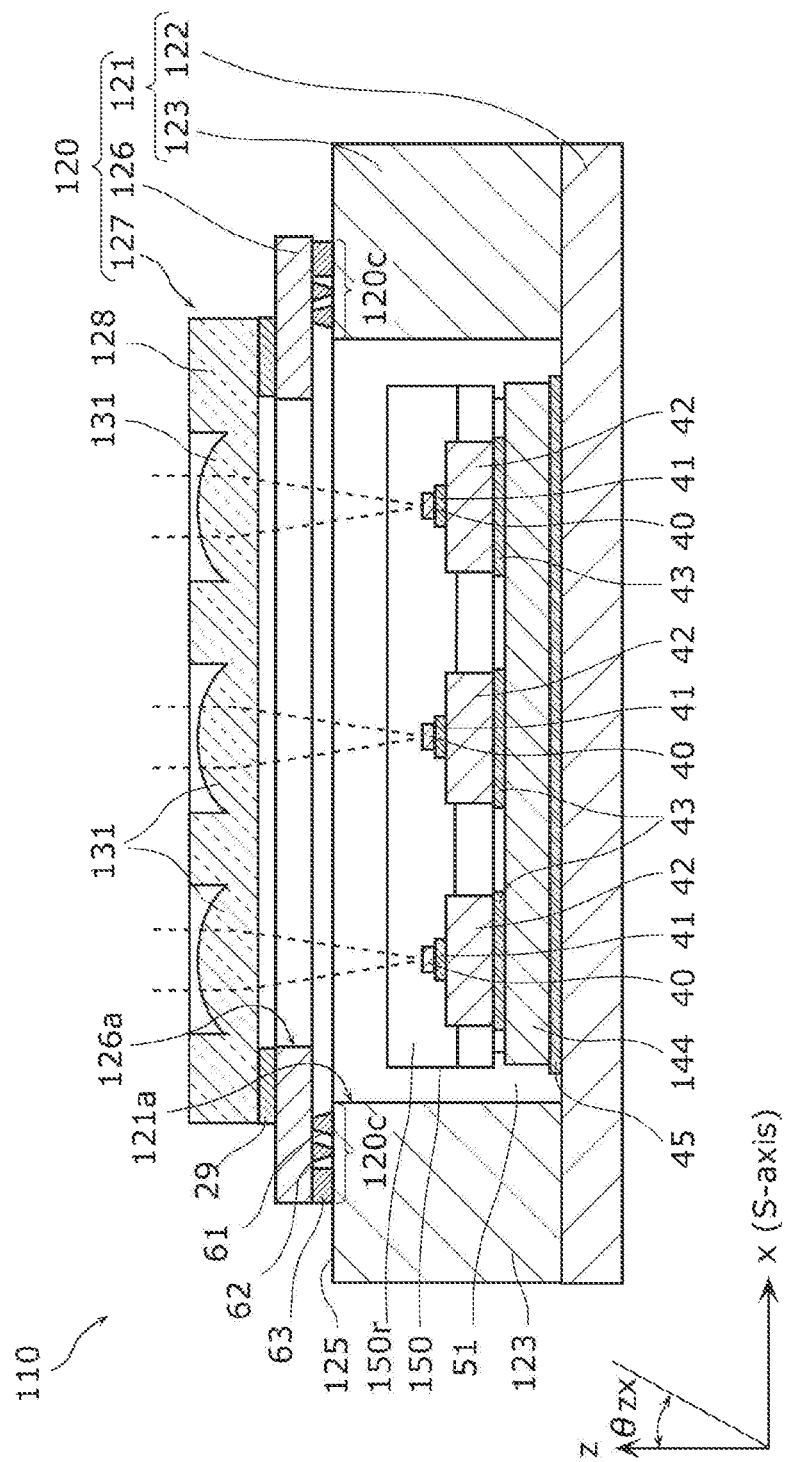
FIG. 20 is a second schematic cross-sectional view showing the overall configuration of the semiconductor laser module according to Embodiment 2.

First, an overall configuration of semiconductor laser module 110 according to this embodiment will be described with reference to FIGS. 18 to 20. FIGS. 18, 19, and 20 are a schematic plan view, a first schematic cross-sectional view, and a second schematic cross-sectional view of the overall configuration of semiconductor laser module 110 according to this embodiment. FIG. 19 shows a cross-section taken along line XIX-XIX in FIG. 18. FIG. 20 shows a cross-section taken along line XX-XX in FIG. 18.

As shown in FIGS. 18 to 20, semiconductor laser module 110 includes package 120. As shown in FIG. 20, semiconductor laser module 110 further includes three semiconductor laser chips 40 and one first collimator element 150. In this embodiment, semiconductor laser module 110 further includes three second collimator elements 131, three submounts 42, and one heat sink 144.

Package 120 is a case containing three semiconductor laser chips 40 and one first collimator element 150. Package 120 includes body 121, cap member 126 attached to top 125, and window member 127.

As shown in FIGS. 19 and 20, body 121 according to this embodiment is a bottomed cylindrical member having plate-like bottom 122 and top 125 with opening 121a. Opening 121a is an example of the first opening at the end of body 121 opposite to the end at bottom 122. Body 121 has bottom 122 and side 123. Bottom 122 has the same or similar configuration as bottom 22 according to Embodiment 1. Side 123 differs from side part 23 according to Embodiment 1 in the number of lead pins 24, and the same in other respects. In this embodiment, as shown in FIG. 18, side 123 has six lead pins. As shown in FIGS. 19 and 20, top 125 includes first protrusion 61 and second protrusion 63 in junction area 120c in which cap member 126 and top 125 overlap each other in a plan view of bottom 122. First protrusion 61 has a cross-sectional area variable in accordance with the position in the direction perpendicular to the principal surface of bottom 122. Second protrusion 63 has a cross-sectional area not variable in accordance with the position in the direction perpendicular to the principal surface of bottom 122.

Cap member 126 is attached to top 125 of body 121. Cap member 126 has an inner surface facing body 121 and an outer surface on the backside of the inner surface. As shown in FIG. 18, cap member 126 overlaps top 125 throughout the circumference of opening 121a in a plan view of bottom 122. Cap member 126 has opening 126a to overlap opening 121a of body 121 in a plan view of bottom 122. Opening 126a is an example of the second opening that penetrates cap member 126 around the center of cap member 126 in a plan view. As shown in FIGS. 19 and 20, cap member 126 includes first protrusion 62 in junction area 120c in which cap member 126 and top 125 overlap each other in a plan view of bottom 122. First protrusion 62 has a cross-sectional area variable in accordance with the position in the direction perpendicular to the principal surface of bottom 122.

Window member 127 is a translucent member in cap member 126. In this embodiment, window member 127 closes opening 126a of cap member 126. In this embodiment, three second collimator elements 131 and window member 127 are formed integrally. As shown in FIGS. 19 and 20, each second collimator element 131 is the part of window member 127 including the optical axis of the laser light.

Window member 127 includes plate 128 around second collimator elements 131. Plate 128 is joined to cap member 126. Window member 127 and cap member 126 are joined air tight by joining member 29.

Each of three semiconductor laser chips 40 has the same or similar configuration as semiconductor laser chip 40 according to Embodiment 1. Each of three submounts 42 has the same or similar configuration as submount 42 according to Embodiment 1. Each of three semiconductor laser chips 40 is mounted on one of three submounts 42.

Other than the size, heat sink 144 has the same or similar configuration as heat sink 44 according to Embodiment 1. Joined to heat sink 144 are three submounts 42. Three submounts 42 are aligned, on the upper surface of heat sink 144, in the direction (i.e., along the x-axis in FIGS. 18 to 20)

perpendicular to the laser light emitting direction. More specifically, three semiconductor laser chips 40 and three submounts 42 are arranged so that light-emitting points 40a of three semiconductor laser chips 40 are located in the same position in the laser light emitting direction (i.e., along the y-axis in FIGS. 18 to 20).

First collimator element 150 is a single cylindrical mirror with concave mirror surface 150r opposed to all light-emitting points 40a of three semiconductor laser chips 40 in package 120. In this embodiment, mirror surface 150r reflects the laser beams from three semiconductor laser chips 40 toward opening 121a, and reduces the divergence angle of the laser beams along the first axis. Each of the three laser beams reflected by mirror surface 150r is incident on one of three second collimator elements 131. In order to enable this, first collimator element 150 is placed so that mirror surface 150r overlaps openings 121a and 126a in a plan view of bottom 122. In addition, first collimator element 150 is placed with mirror surface 150r opposed to each of front surfaces 42f of three submounts 42.

Mirror surface 150r has a parabolic shape having, as a focal point, each of light-emitting points 40a of three semiconductor laser chips 40. Mirror surface 150r is a parabolic cylindrical surface having no curvature along the x-axis and parallel to the x-axis. The distances from light-emitting points 40a of three semiconductor laser chips 40 to mirror surface 150r are equal to each other. Each of three semiconductor laser chips 40 emits the laser beam along the y-axis. The fast axis of the laser beams emitted from three semiconductor laser chips 40 corresponds to the z-axis, and the slow axis corresponds to the x-axis. This reduces the divergence angle of the laser beams emitted from three light-emitting points 40a along the first axis. That is, mirror surface 150r reduces the divergence angles of the three laser beams along the first axis. As a result, semiconductor laser module 110 requires a smaller number of components than in the case of using three first collimator elements each reflecting one of the three laser beams.

Each of three second collimator elements 131 reduces the divergence angle along the second axis of the laser beam reflected by first collimator element 150. In this embodiment, as shown in FIG. 20, each of three second collimator elements 131 has a convex surface. More specifically, each of three second collimator elements 131 is a cylindrical lens in a convex shape in the direction away from bottom 122. In other words, each of three second collimator elements 131 is a cylindrical lens having a cylindrical surface as the light-emitting surface. As shown in FIG. 20, each of three second collimator elements 131 reduces the divergence angle of the laser beam along the x-axis that is the second axis. As described above, second collimator elements 131 are integrally formed with window member 127. In addition, second collimator elements 131 are located at the outer surface of cap member 126. This configuration reduces the size of package 120 more than in the case where second collimator elements 131 are located at the inner surface of cap member 126. In addition, the collimating surface of each second collimator element 131 serves as the laser light-emitting surface to reduce the beam aberration. Each of three second collimator elements 131 is located on the optical path of one of the three laser beams reflected by first collimator element 150.

As described above, semiconductor laser module 110 according to this embodiment includes the plurality of semiconductor laser chips 40 and one first collimator element 150 opposed to all light-emitting points 40a of the plurality of semiconductor laser chips 40. This configuration requires a smaller number of first collimator elements 150. In addition, all the laser beams are collimated and reflected by same first collimator element 150, which reduces displacement among the plurality of laser beams. In order to uniformize the spot sizes and the positions of the laser beams at second collimator elements 131 along the y-axis, light-emitting points 40a may be arranged in a line along the x-axis when submounts 42 are mounted on heat sink 144. While this embodiment employs three semiconductor laser chips 40, the number is not limited thereto. A plurality of semiconductor laser chips 40 only need to be used.

Figure 21:
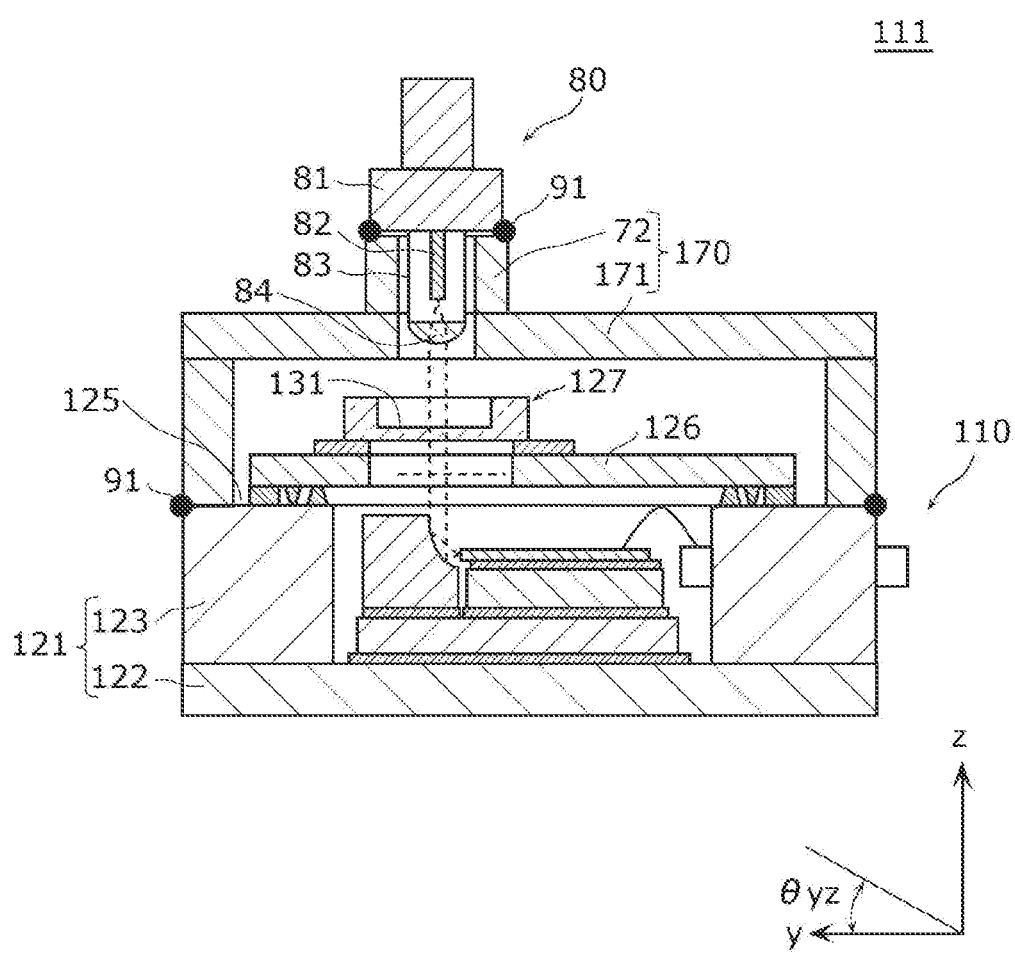
FIG. 21 is a first schematic cross-sectional view showing another overall configuration of the semiconductor laser module according to Embodiment 2.
Figure 22:
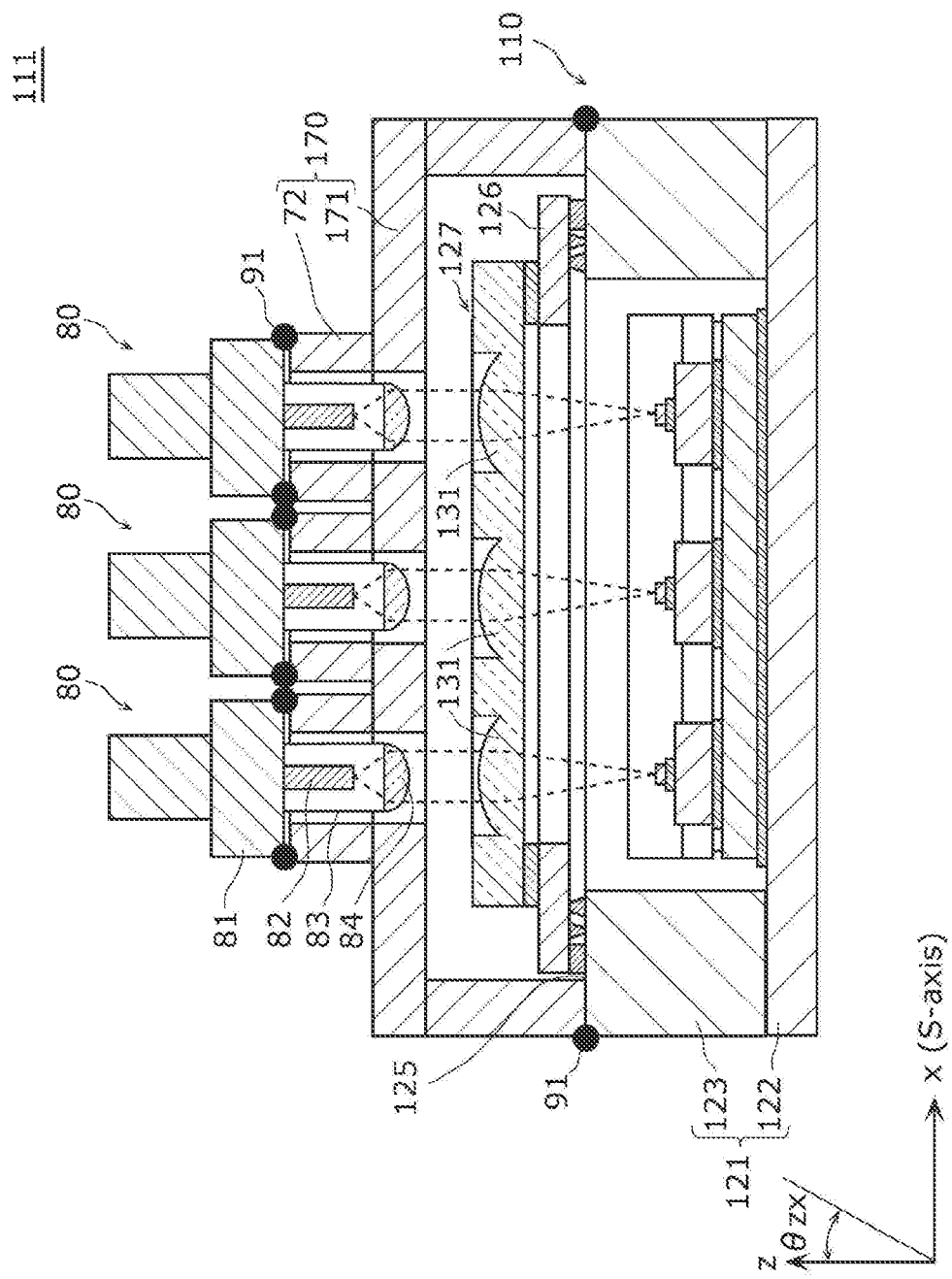
FIG. 22 is a second schematic cross-sectional view showing the other overall configuration of the semiconductor laser module according to Embodiment 2.

Like semiconductor laser module 10 according to Embodiment 1, semiconductor laser module 110 according to this embodiment may be combined with another optical element such as an optical fiber. An example configuration of such the semiconductor laser module will be described with reference to FIGS. 21 and 22. FIGS. 21 and 22 are first and second schematic cross-sectional views, respectively, showing an overall configuration of semiconductor laser module 111 according to this embodiment. FIGS. 21 and 22 are cross-sectional views of semiconductor laser module 111 in the same or similar positions as in the cross-sectional views shown in FIGS. 19 and 20.

As shown in FIGS. 21 and 22, semiconductor laser module 111 includes semiconductor laser module 110 described above and three lens-tip equipped optical fibers 80. In this embodiment, semiconductor laser module 111 further includes fiber holder 170.

Each lens-tip equipped optical fiber 80 has the same or similar configuration as lens-tip equipped optical fiber 80 according to Embodiment 1.

Fiber holder 170 is a member that holds three lens-tip equipped optical fibers 80. Fiber holder 170 includes fixture 171 and cylinders 72. Fixture 171 is a part fixed to package 120 and covering cap member 126. Fixture 171 has openings each opposed to one of three second collimator elements 131. That is, fixture 171 has three openings. Located around each opening is one of cylinders 72. Each cylinder 72 has the same or similar configuration as cylinder 72 according to Embodiment 1. Accordingly, each laser beam emitted from one of three second collimator elements 131 enters one of three optical fibers 82 through one of the three openings in fixture 171.

Fiber holder 170 and side 123 of body 121 are joined by spot welding, for example. FIGS. 21 and 22 show spot welding marks 91 formed by spot welding. In addition, lens-tip equipped optical fibers 80 may also be joined to fiber holder 170 by spot welding. Fiber holder 170 and body 121 as well as lens-tip equipped optical fibers 80 and fiber holder 170 may be positioned and fixed in the same or similar manner as in Embodiment 1.

[2-2. Advantageous Effects]

Now, advantageous effects of second collimator elements 131 of semiconductor laser module 110 according to this embodiment will be described.

Figure 23:
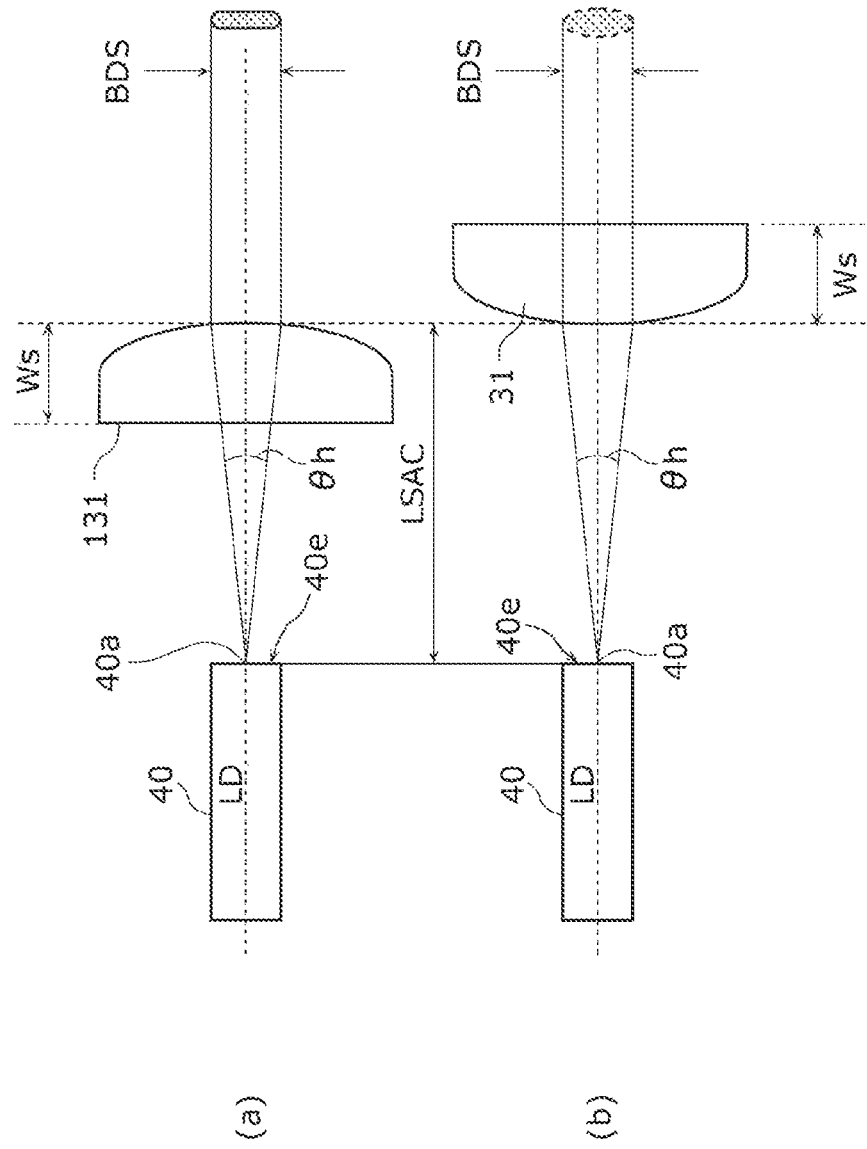
FIG. 23 is a schematic view showing a relationship between a second collimator element according to Embodiment 2 and laser light.

As described above, each second collimator element 131 according to this embodiment has the cylindrical surface as the light-emitting surface. Advantageous effects of such second collimator element 131 will be described with reference to FIG. 23. FIG. 23 is a schematic view showing a relationship between second collimator element 131 according to this embodiment and the laser light. Schematic view (a) of FIG. 23 shows a relationship between second collimator element 131 according to this embodiment and the spot shape of the laser light along the second axis. Schematic view (b) of FIG. 23 shows a relationship between second collimator element 31 according to Embodiment 1 and the spot shape of the laser light along the second axis. Schematic views (a) and (b) of FIG. 23 also show semiconductor laser chip 40.

In each case shown in schematic views (a) and (b) of FIG. 23, the laser beam emitted from light-emitting point 40a diverges at divergence angle θh along the second axis and collimated by each second collimator element. Accordingly, the laser beam is obtained which has a spot diameter of BDS along the second axis.

Second collimator element 31 shown in schematic view (b) of FIG. 23 is a cylindrical lens having a cylindrical surface as the laser light incident surface. Such second collimator element 31 has a larger aberration than second collimator elements 131 according to this embodiment, which degrades the beam quality of the laser light. Accordingly, the spot of the laser light emitted from second collimator element 31 has a blurred outline. For example, if the laser light enters an optical fiber, the circumference of the spot of the laser light may not enter the optical fiber, thereby causing a loss.

On the other hand, each second collimator element 131 according to this embodiment is the cylindrical lens having the cylindrical surface as the laser light-emitting surface, and has a smaller aberration than second collimator element 31 according to Embodiment 1. The laser beams emitted from second collimator elements 131 have a higher quality than the laser light emitted from second collimator element 31 according to Embodiment 1. Accordingly, the spot of the laser beam emitted from each second collimator element 131 has a clear outline. For example, less loss occurs when the laser light enters the optical fiber.

In this embodiment, cap member 126 above which second collimator elements 131 are located has an inner surface facing body 121 and an outer surface on the backside of the inner surface. Second collimator elements 131 are located above the outer surface of cap member 126. This configuration reduces the size of the package more than in the case where second collimator elements 131 are located at the inner surface of cap member 126. Specifically, as shown in FIG. 23, second collimator element 131 has thickness Ws of at least about 400 μm and at most about 800 μm. If second collimator elements 131 are located at the inner surface of cap member 126, the height of package 120 needs to be raised by thickness Ws. In view of the strength of the glass as the material and the manufacturing method, each second collimator element 131 needs to have a thickness of at least about 400 μm and at most about 800 μm.

As described above, the lens with the following surfaces is used as each second collimator element 131. The surface closer to cap member 126 (the laser light incident surface) is a flat surface, whereas the back surface (i.e., the outer surface or the laser light-emitting surface) is a surface, such as a cylindrical surface, in a convex shape. The lens reduces the aberration of the second collimator elements. As a result, the beam quality of the light emitted from the semiconductor laser module is less degraded.

As described above, if second collimator elements 131 are located at the outer surface of cap member 126, the optical path length may be at least 1450 μm and at most 4200 μm from each light-emitting point 40a to associated second collimator element 131. The optical path length of 1450 μm or more from each light-emitting point 40a to associated second collimator element 131 reduces the interference between first and second collimator elements 150 and 131, even if the optical path length is relatively long, for example, about 700 μm from light-emitting point 40a to first collimator element 150. On the other hand, the optical path length of 1450 μm or less reduces the beam aspect ratio to be lower than 1:1 (i.e., lower than the aspect ratio along the first axis). In addition, the optical path length of 4200 μm or less from each light-emitting point 40a to associated second collimator element 131 reduces spot diameter BDS along the second axis of the laser light to about 1000 μm or less. Accordingly, less loss occurs when the laser light is incident on the tip lens of lens-tip equipped optical fibers 80 shown in FIGS. 21 and 22. The size of semiconductor laser module 110 is less increased. Here, the optical path length from each light-emitting point 40a to associated second collimator element 131 means the optical path length from each light-emitting point 40a to the part of associated second collimator element 131 exhibiting collimate effects. In this embodiment, the optical path length from each light-emitting point 40a to associated second collimator element 131 means the optical path length from each light-emitting point 40a to the light-emitting surface of associated second collimator element 131.

Second collimator element 31 as shown in schematic view (a) of FIG. 23 may be located at the inner surface of cap member 126. With this configuration, cap member 126 has a flatter outer surface than in the case where second collimator element 31 is located at the outer surface of cap member 126. Accordingly, an additional component can be easily mounted at the outer surface of the cap member.

If each second collimator element 131 is located at the inner surface of cap member 126, the optical path length may be at least 900 μm and at most 4200 μm from light-emitting point 40a to second collimator element 131. The optical path length of 900 μm or more from each light-emitting point 40a to associated second collimator element 131 reduces the interference between first and second collimator elements 150 and 131, even if the optical path length is relatively long, for example, about 700 μm from light-emitting point 40a to first collimator element 150. The optical path length of 4200 μm or less from each light-emitting point 40a to associated second collimator element 131 reduces spot diameter BDS along the second axis of the laser light to about 1000 μm or less. Accordingly, less loss occurs when the laser beam enters the tip lenses of lens-tip equipped optical fibers 80 as shown in FIGS. 21 and 22. The size of semiconductor laser module 110 is less increased.

In general, the number of light-emitting points 40a is n, where n≥1). The optical path length is LFAC from light-emitting point 40a to mirror surface 150r on the optical axis of the laser light. The spot diameter of the laser light is BDS on the convex surface (i.e., the cylindrical surface) of each second collimator element 131 along the second axis. In this case, the following expression may be satisfied.

$$BDS > 1.1 \times LFAC \times 1.5 \times n$$

This configuration reduces a too large decrease in the spot diameter along the second axis with respect to the spot diameters of n laser beams along the first axis, when n laser beams are aligned at the tips of the optical fibers along the first axis. Accordingly, when n laser beams are introduced into optical fibers with a circular cross-section, the entire cross-sections of the optical fibers can be used effectively.

The distance between two adjacent light-emitting points 40a may be at least 1.2 spot diameter BDS. This configuration reduces the interference between two adjacent laser beams.

Embodiment 3

A semiconductor laser module according to Embodiment 3 will be described. The semiconductor laser module according to this embodiment differs from semiconductor laser module 110 according to Embodiment 2 in further including a beam rotating element. Now, the semiconductor laser module according to this embodiment will be described with reference to FIGS. 24 to 26, focusing on the differences from semiconductor laser module 110 according to Embodiment 2.

Figure 24:
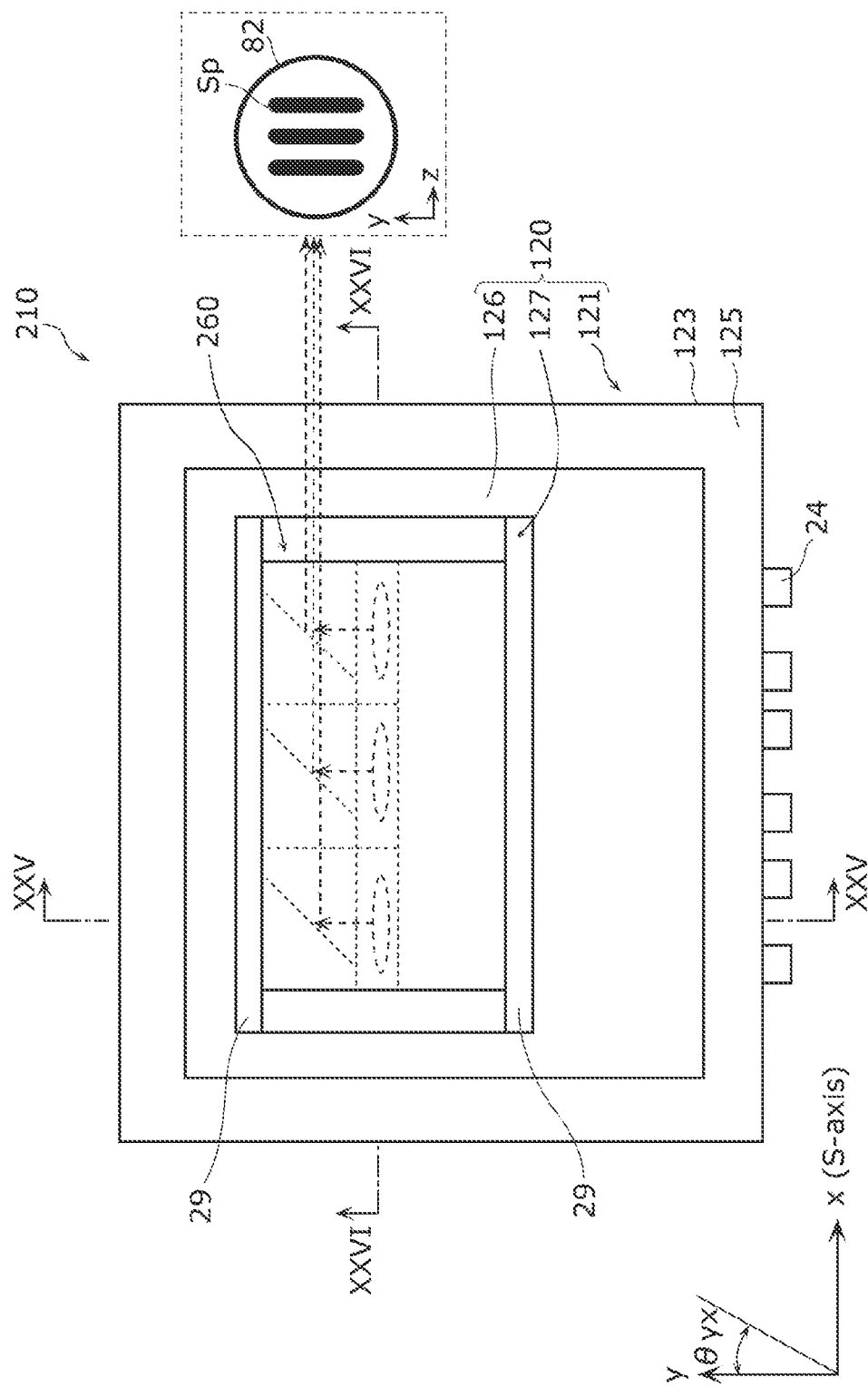
FIG. 24 is a schematic plan view showing an overall configuration of a semiconductor laser module according to Embodiment 3.
Figure 25:
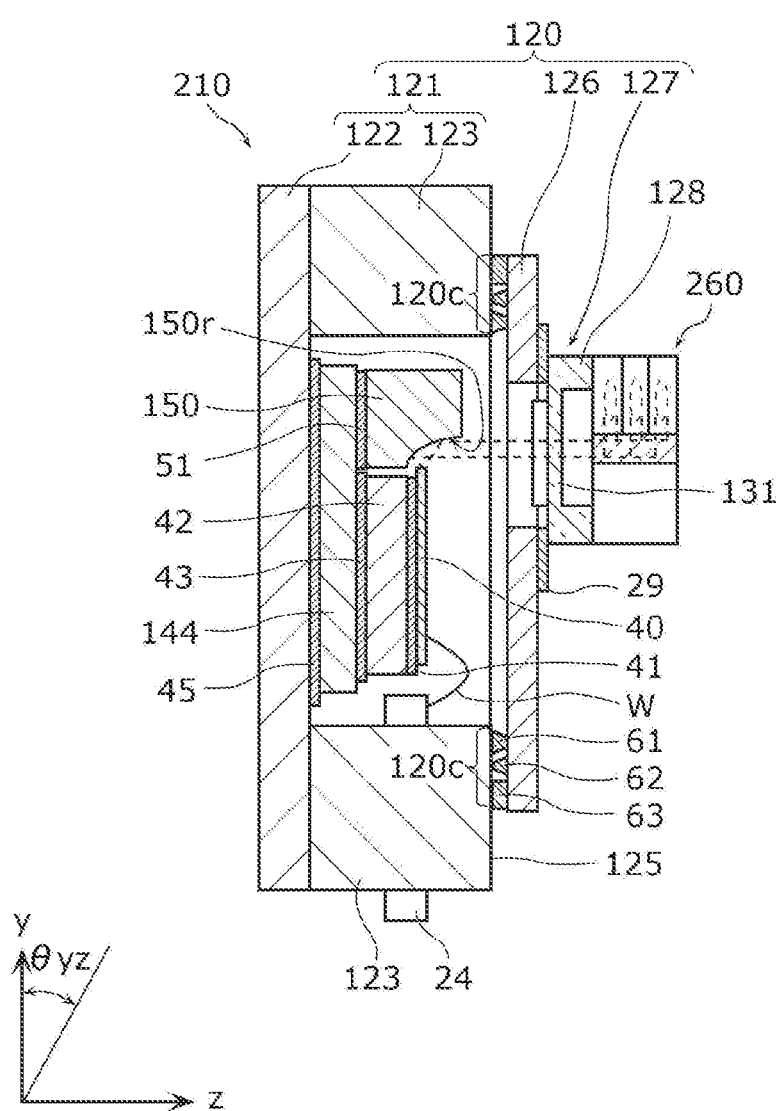
FIG. 25 is a first schematic cross-sectional view showing the overall configuration of the semiconductor laser module according to Embodiment 3.
Figure 26:
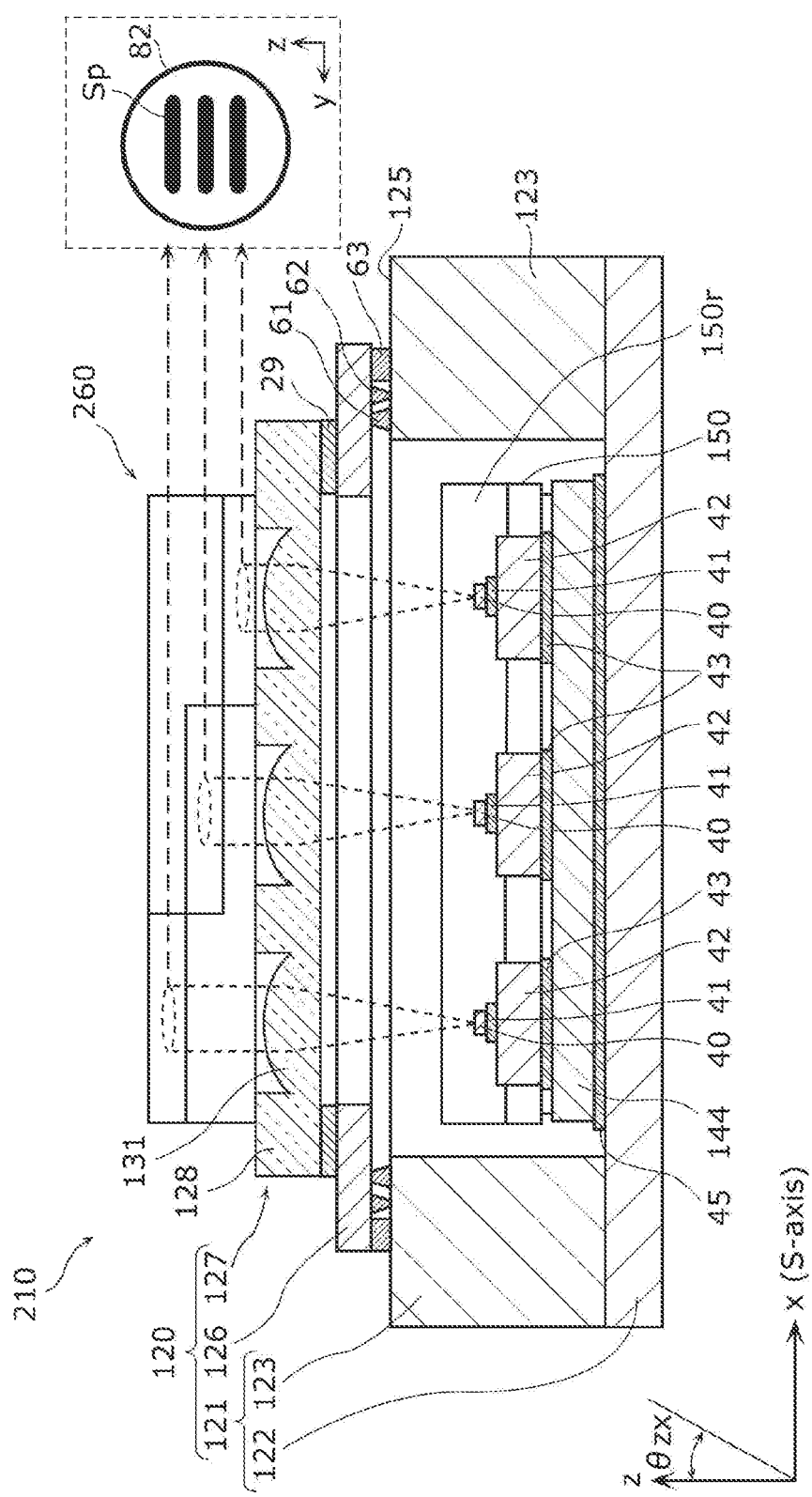
FIG. 26 is a second schematic cross-sectional view showing the overall configuration of the semiconductor laser module according to Embodiment 3.

FIGS. 24, 25, and 26 are a schematic plan view, a first schematic cross-sectional view, and a second schematic cross-sectional view, respectively, showing an overall configuration of semiconductor laser module 210 according to this embodiment. FIG. 25 shows a cross-section taken along line XXV-XXV in FIG. 24. FIG. 26 shows a cross-section taken along line XXVI-XXVI in FIG. 24. Note that FIGS. 24 and 26 also show, in the broken frame, a plan view of the facet of each optical fiber 82 on which each laser beam is incident, and a schematic view of spot Sp of the laser beam incident on the facet.

As shown in FIGS. 24 to 26, semiconductor laser module 210 includes package 120. As shown in FIG. 26, semiconductor laser module 210 further includes three semiconductor laser chips 40 and one first collimator element 150. In this embodiment, semiconductor laser module 210 further includes three second collimator elements 131, three submounts 42, and one heat sink 144. The constituent elements of semiconductor laser module 210 have the same or similar configurations as the constituent elements according to Embodiment 2.

As shown in FIGS. 24 to 26, semiconductor laser module 210 according to this embodiment further includes beam rotating element 260 outside package 120.

Beam rotating element 260 is an optical element that emits the incident laser light after rotating the orientation of the spot thereof. In this embodiment, beam rotating element 260 rotates the first axis (i.e., the fast axis) of the three laser beams from the y-axis to the z-axis, and the second axis (i.e., the slow axis) from the x-axis to the y-axis. Beam rotating element 260 further converts the direction in which the three laser beams propagate from the z-axis to the x-axis. Beam rotating element 260 according to this embodiment may be achieved by, for example, a plurality of mirrors that reflect laser beams, or a beam twister that includes an array of cylindrical lens whose optical axes tilt with respect to those of laser beams.

As shown in FIGS. 24 and 26, beam rotating element 260 aligns the three laser beams separately along the first axis (or along the z-axis in the position in which the beams are emitted from beam rotating element 260), and then emits the laser beams. The three laser beams are thus incident on one optical fiber 82. Accordingly, a high-power laser source is achieved.

Embodiment 4

A semiconductor laser module according to Embodiment 4 will be described. The semiconductor laser module according to this embodiment differs from semiconductor laser module 210 according to Embodiment 3 mainly in the configuration of the beam rotating element and the locations of the semiconductor laser chips. Now, the semiconductor laser module according to this embodiment will be described with reference to FIGS. 27 to 29, focusing on the differences from semiconductor laser module 210 according to Embodiment 3.

Figure 27:
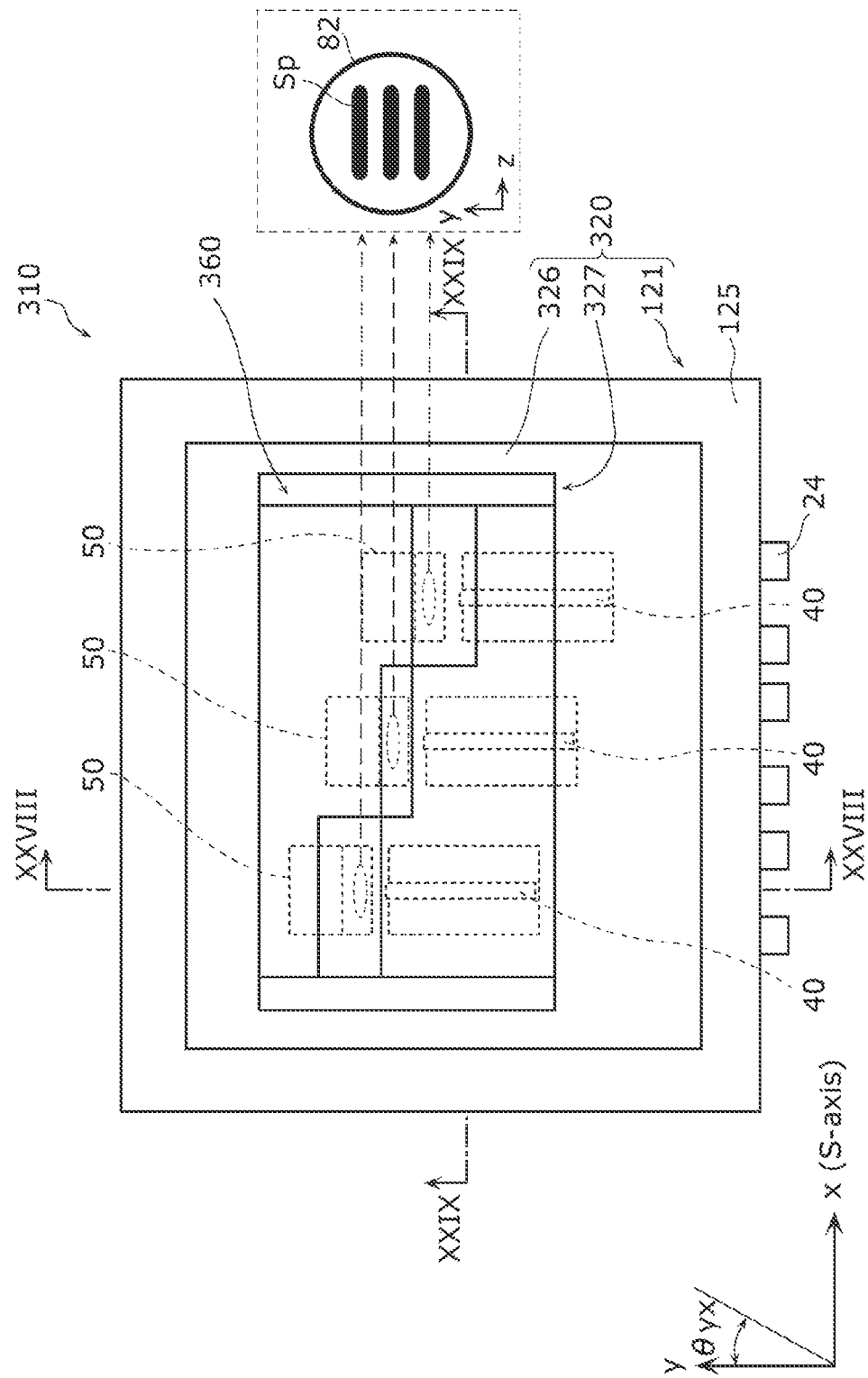
FIG. 27 is a schematic plan view showing an overall configuration of a semiconductor laser module according to Embodiment 4.
Figure 28:
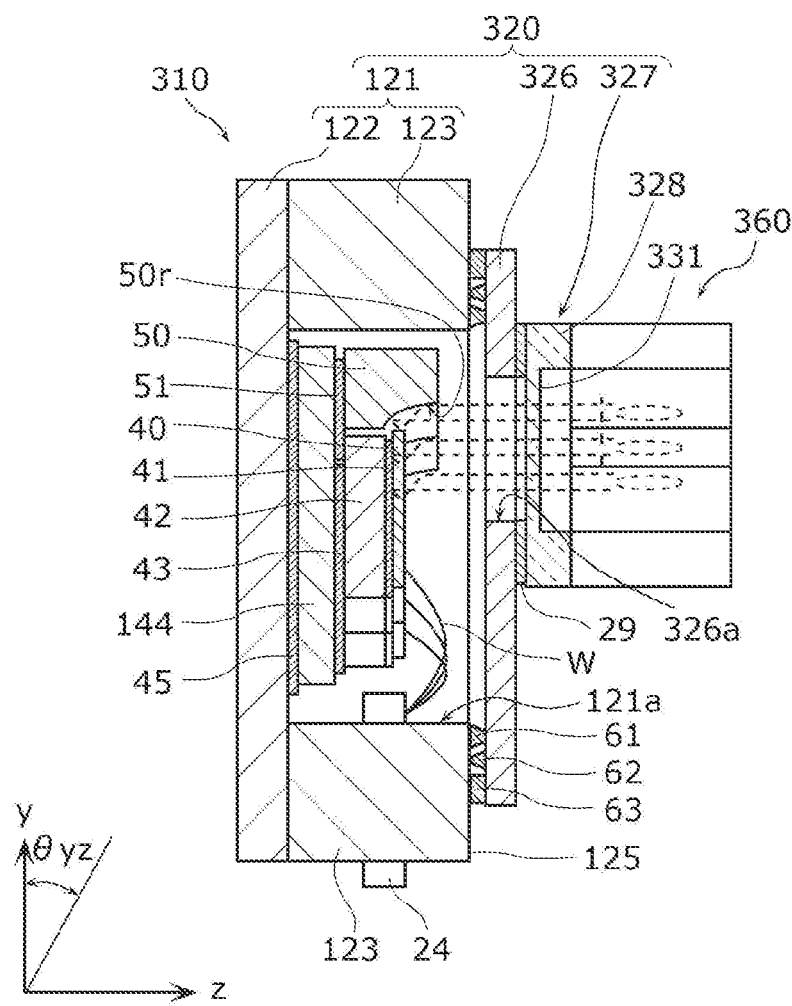
FIG. 28 is a first schematic cross-sectional view showing the overall configuration of the semiconductor laser module according to Embodiment 4.
Figure 29:
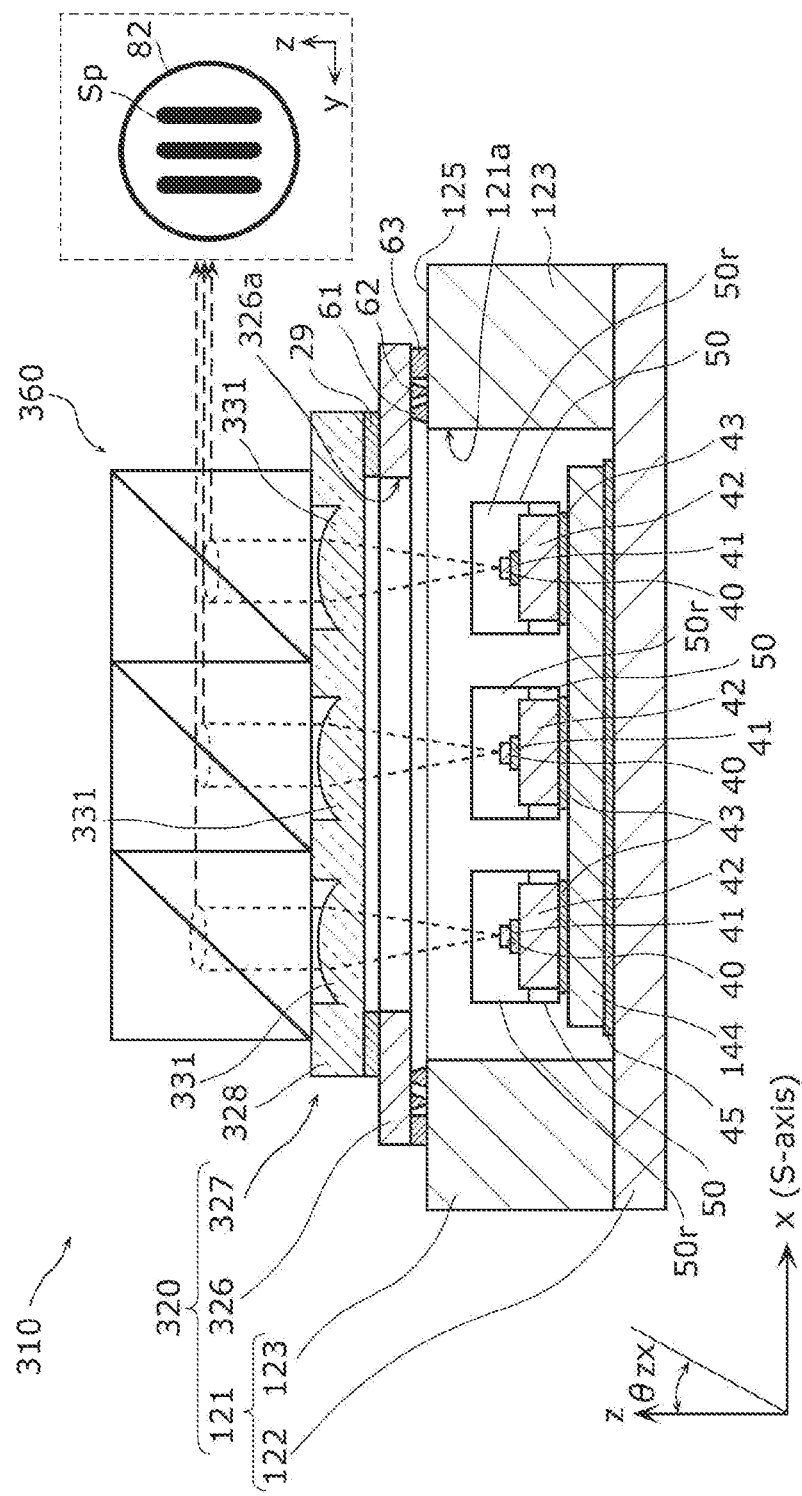
FIG. 29 is a second schematic cross-sectional view showing the overall configuration of the semiconductor laser module according to Embodiment 4.

FIGS. 27, 28, and 29 are a schematic plan view, a first schematic cross-sectional view, and a second schematic cross-sectional view, respectively, showing an overall configuration of semiconductor laser module 310 according to this embodiment. FIG. 28 shows a cross-section taken along line XXVIII-XXVIII in FIG. 27. FIG. 29 shows a cross-section taken along line XXIX-XXIX in FIG. 27. Note that FIGS. 27 and 29 also show, in the broken frame, a plan view of the facet of optical fiber 82 on which each laser beam is incident and a schematic view of spot Sp of the laser beam incident on the facet.

As shown in FIGS. 27 to 29, semiconductor laser module 310 includes package 320. As shown in FIG. 29, semiconductor laser module 310 further includes three semiconductor laser chips 40 and three first collimator elements 5. In this embodiment, semiconductor laser module 310 further includes three second collimator elements 331, three submounts 42, and one heat sink 144. Semiconductor laser module 310 further includes beam rotating element 360.

Package 320 is a case containing three semiconductor laser chips 40 and three first collimator elements 50. Package 320 includes body 121, cap member 326 attached to top 125, and window member 327.

Body 121 according to this embodiment has the same or similar configuration as body 121 according to Embodiments 2 and 3.

Cap member 326 is attached to top 125 of body 121. Cap member 326 has an inner surface facing body 121 and an outer surface on the backside of the inner surface. Cap member 326 has opening 326a to overlap opening 121a of body 121 in a plan view of bottom 122. (see FIGS. 28 and 29). Opening 326a is an example of the second opening that penetrates cap member 326 near the center of cap member 326 in a plan view. Like cap member 126 according to Embodiments 2 and 3, cap member 326 includes first protrusion 62.

Window member 327 is a translucent member in cap member 326. In this embodiment, window member 327 closes opening 326a of cap member 326. In this embodiment, three second collimator elements 331 and window member 327 are formed integrally. As shown in FIGS. 28 and 29, each second collimator element 331 is the part of window member 327 including the optical axis of one of the laser beams.

Window member 327 includes plate 328 around second collimator elements 331. Plate 328 is joined to cap member 326. Window member 327 and cap member 326 are joined air tight by joining member 29.

Each of three semiconductor laser chips 40 has the same or similar configuration as semiconductor laser chip 40 according to Embodiment 1. Each of three submounts 42 has the same or similar configuration as submount 42 according to Embodiment 1. Each of three semiconductor laser chips 40 is mounted on one of three submounts 42.

Heat sink 144 has the same or similar configuration as heat sink 144 according to Embodiments 2 and 3. Joined to heat sink 144 are three submounts 42. As shown in FIGS. 27 and 29, three submounts 42 are, on the upper surface of heat sink 144, spaced apart from each other in the direction perpendicular to the laser light emitting direction (i.e., along the x-axis in FIGS. 27 to 29). In this embodiment, three semiconductor laser chips 40 and three submounts 42 are arranged with light-emitting points 40a of three semiconductor laser chips 40 located in different positions in the laser light emitting direction (i.e., along the y-axis in FIGS. 27 to 29).

Three first collimator elements 50 have the same or similar configuration as first collimator element 50 according to Embodiment 1. As shown in FIGS. 27 and 29, three first collimator elements 50 are, on the upper surface of heat sink 144, spaced apart from each other in direction perpendicular to the laser light emitting direction. In this embodiment, three first collimator elements 50 are arranged with three first collimator elements 50 located in different positions in the laser light emitting direction (i.e., along the y-axis in FIGS. 27 to 29). The distances from light-emitting points 40a of three semiconductor laser chips 40 to mirror surfaces 50r of three first collimator elements 50 are equal the each other. Each of three semiconductor laser chips 40 emits the laser beam along the y-axis. The fast axis of the laser beams emitted from three semiconductor laser chips 40 corresponds to the z-axis, and the slow axis corresponds to the x-axis.

Beam rotating element 360 is an optical element that emits the incident laser light after rotating the orientation of the spot thereof. In this embodiment, beam rotating element 360 does not rotate the first axis (i.e., the fast axis) of the three laser beams but rotates the second axis (i.e., the slow axis) from the x-axis to the z-axis. Beam rotating element 360 further converts the direction in which the three laser beams propagate from the z-axis to the x-axis. Beam rotating element 260 according to this embodiment may be achieved by, for example, a plurality of mirrors that reflect the laser beams. In beam rotating element 360 according to this embodiment, the three laser beams are incident on different positions in the direction along the y-axis. Accordingly, as shown in FIG. 27, the direction in which the three laser beams propagate is converted from the z-axis to the x-axis so that the three laser beams are aligned along the y-axis. Beam rotating element 360 according to this embodiment may be achieved by, for example, a plurality of mirrors that reflect the laser beams.

As shown in FIG. 27, beam rotating element 360 emits the three laser beams aligned along the first axis. The three laser beams are thus incident on one optical fiber 82. Accordingly, a high-power laser source is achieved.

Embodiment 5

A semiconductor laser module according to Embodiment 5 will be described. The semiconductor laser module according to this embodiment differs from semiconductor laser module 110 according to Embodiment 2 mainly in that a single semiconductor laser chip has a plurality of light-emitting points. Now, the semiconductor laser module according to this embodiment will be described with reference to FIGS. 30 and 31, focusing on the differences from semiconductor laser module 110 according to Embodiment 2.

Figure 30:
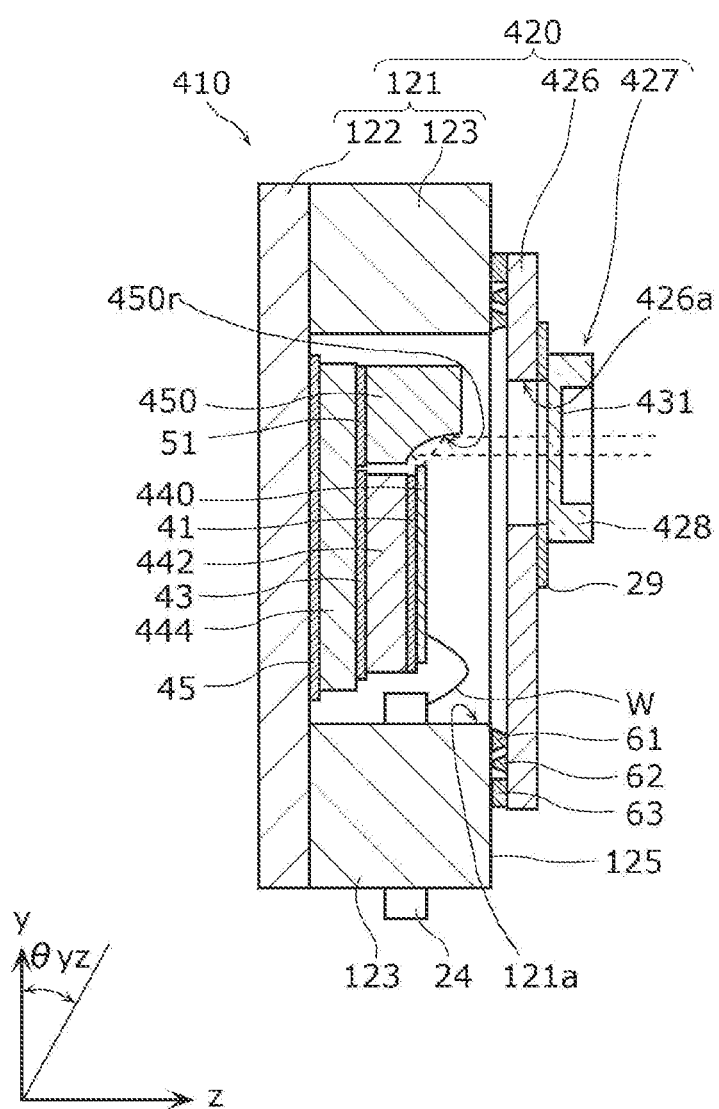
FIG. 30 is a first schematic cross-sectional view showing an overall configuration of a semiconductor laser module according to Embodiment 5.
Figure 31:
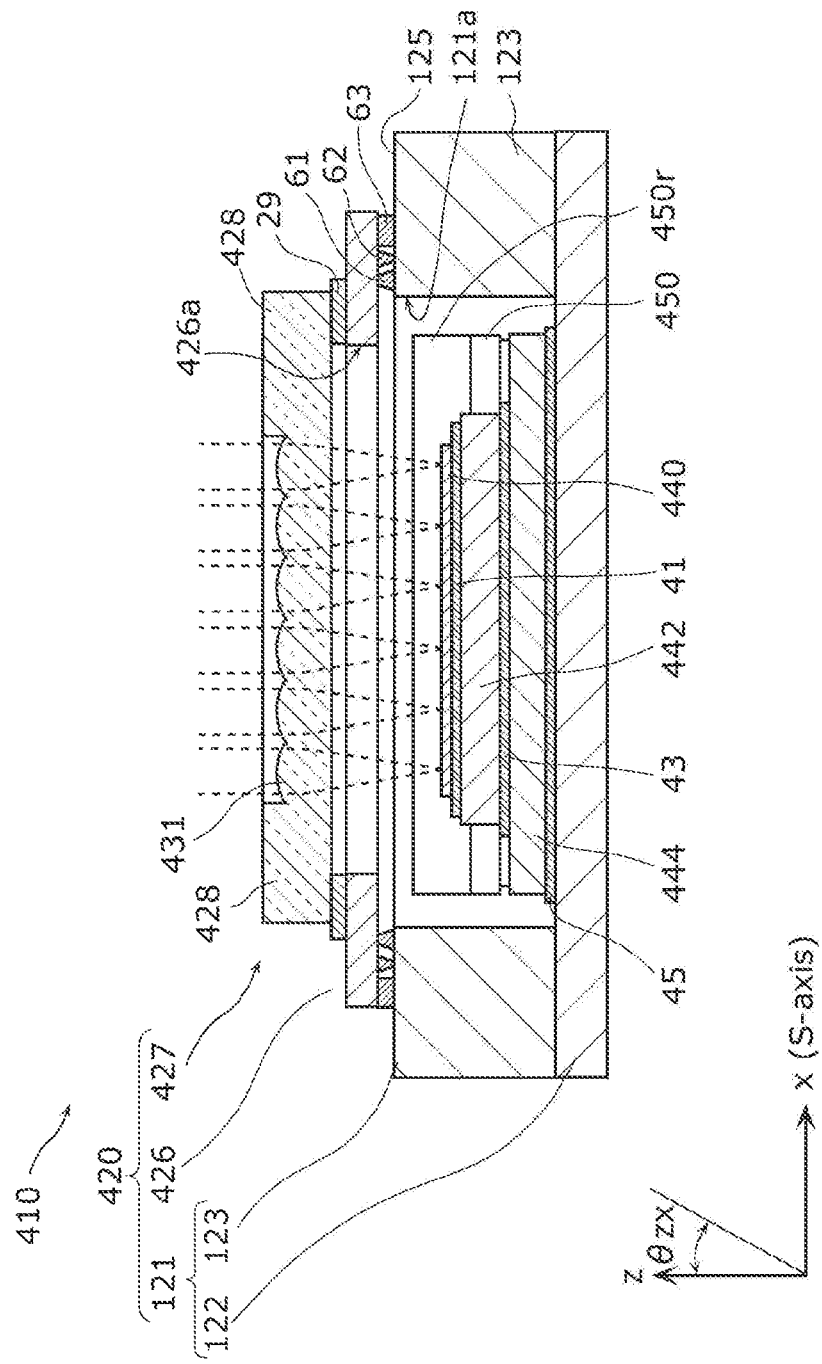
FIG. 31 is a second schematic cross-sectional view showing the overall configuration of the semiconductor laser module according to Embodiment 5.

FIGS. 30 and 31 are first and second schematic cross-sectional views, respectively, showing an overall configuration of semiconductor laser module 410 according to this embodiment. FIG. 30 shows a cross-section along the optical axis of one laser beam. FIG. 31 shows a cross-section passing through semiconductor laser chip 440 and perpendicular to the laser light emitting direction (i.e., the y-axis).

As shown in FIGS. 30 and 31, semiconductor laser module 410 includes package 420. Semiconductor laser module 410 further includes one semiconductor laser chip 440 and one first collimator element 450. In this embodiment, semiconductor laser module 410 further includes six second collimator elements 431, one submount 442, and one heat sink 444.

Package 420 is a case containing one semiconductor laser chip 440 and one first collimator element 450. Package 420 includes body 121, cap member 426 attached to top 125, and window member 427.

Body 121 according to this embodiment has the same or similar configuration as body 121 according to Embodiments 2 to 4.

Cap member 426 is attached to top 125 of body 121. Cap member 426 has an inner surface facing body 121 and an outer surface on the backside of the inner surface. Cap member 426 overlaps top 125 throughout the circumference of opening 121a in a plan view of bottom 122. Cap member 426 has opening 426a to overlap opening 121a of body 121 in a plan view of bottom 122. Opening 426a is an example of the second opening that penetrates cap member 426 around the center of cap member 426 in a plan view. Like cap member 126 according to Embodiments 2 and 3, cap member 426 includes first protrusion 62.

Window member 427 is a translucent member in cap member 426. In this embodiment, window member 427 closes opening 426a of cap member 426. In this embodiment, six second collimator elements 431 and window member 427 are formed integrally. As shown in FIGS. 30 and 31, each second collimator element 431 is the part of window member 427 including the optical axis of one of the laser beams.

Window member 427 includes plate 428 around second collimator elements 431. Plate 428 is joined to cap member 426. Window member 427 and cap member 426 are joined air tight by joining member 29.

Semiconductor laser chip 440 differs from semiconductor laser chip 40 according to Embodiment 1 in having the plurality of light-emitting points. In this embodiment, as shown in FIG. 31, semiconductor laser chip 440 has six light-emitting points. Accordingly, semiconductor laser chip 440 emits six laser beams aligned along the x-axis. The fast axis of the laser beams emitted from semiconductor laser chip 440 corresponds to the z-axis, and the slow axis corresponds to the x-axis. This configuration reduces extra works such as the alignment of the semiconductor laser chip and the displacement among the plurality of laser beams as compared to the case of using a plurality of semiconductor laser chips each having one light-emitting point. As long as being a plurality, the number of light-emitting points of semiconductor laser chip 440 is not particularly limited.

Submount 442 is a base joined to bottom 122. Other than being mounted with semiconductor laser chip 440, submount 442 has the same or similar configuration as surmount 42 according to embodiment 1.

Heat sink 444 has the same or similar configuration as heat sink 144 according to Embodiment 2.

First collimator element 450 has concave mirror surface 450r opposed to all the light-emitting points of semiconductor laser chip 440 inside package 420. In this embodiment, mirror surface 450r reflects the laser beams from six light-emitting points toward opening 121a and reduces the divergence angles of the laser beams along the first axis. Each of the six laser beams reflected by mirror surface 450r is incident on one of six second collimator elements 431. In order to enable this, first collimator element 450 is placed so that mirror surface 450r overlaps openings 121a and 426a in a plan view of bottom 122.

Mirror surface 450r has a parabolic shape having, as focal points, the six light-emitting points of semiconductor laser chip 440. This reduces the divergence angle of the laser beams emitted from the six light-emitting points along the first axis. That is, mirror surface 450r reduces the divergence angles of the six laser beams along the first axis. As a result, semiconductor laser module 410 requires a smaller number of components than in the case of using six first collimator elements each reflecting one of six laser beams. In addition, extra works such as the alignment of first collimator element 450 can be reduced.

Each of six second collimator elements 431 reduces the divergence angle along the second axis of the laser light reflected by first collimator element 450. In this embodiment, each of six second collimator elements 431 is a cylindrical lens in a convex shape in the direction away from bottom 122. In other words, each of six second collimator elements 431 is a cylindrical lens having a cylindrical surface as the light-emitting surface. As shown in FIG. 31, each of six second collimator elements 431 reduces the divergence angle of the laser light along the x-axis that is the second axis. Each of six second collimator elements 431 is located on the optical path of one of the six laser beams reflected by first collimator element 450.

As described above, in semiconductor laser module 410 according to this embodiment, semiconductor laser chip 440 has the plurality of light-emitting points each emits the laser beam. This configuration reduces extra works such as the alignment of the semiconductor laser chip and the displacement among the plurality of laser beams as compared to the case of using a plurality of semiconductor laser chips each having one light-emitting point.

Embodiment 6

A semiconductor laser module according to Embodiment 6 will be described. The semiconductor laser module according to this embodiment differs from semiconductor laser module 110 according to Embodiment 2 mainly in that a plurality of semiconductor laser chips are arranged in a matrix. Now, the semiconductor laser module according to this embodiment will be described with reference to FIGS. 32 to 36, focusing on the differences from semiconductor laser module 110 according to Embodiment 2.

Figure 32:
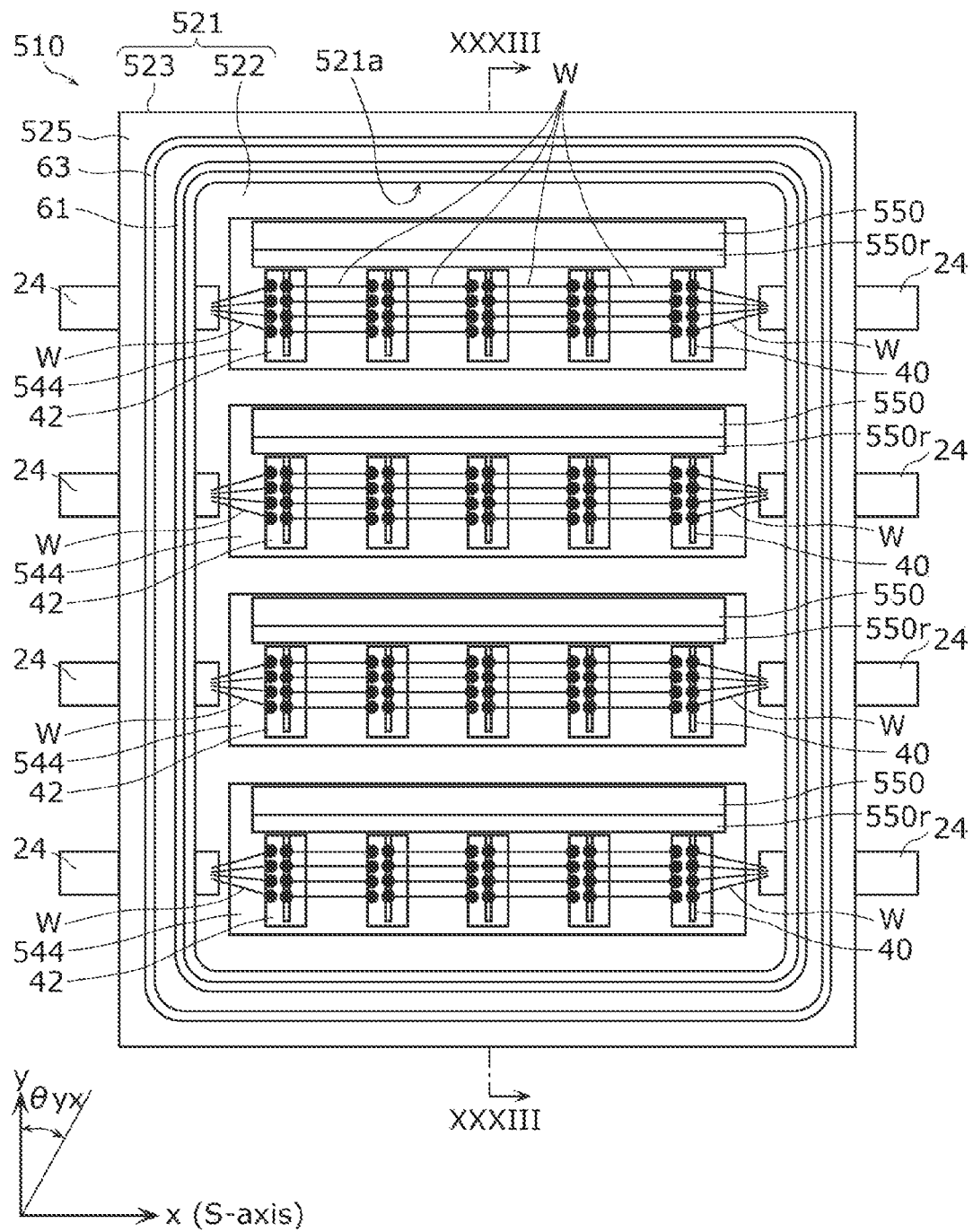
FIG. 32 is a schematic plan view showing a configuration of a semiconductor laser module according to Embodiment 6 excluding a cap member and a window member.
Figure 33:
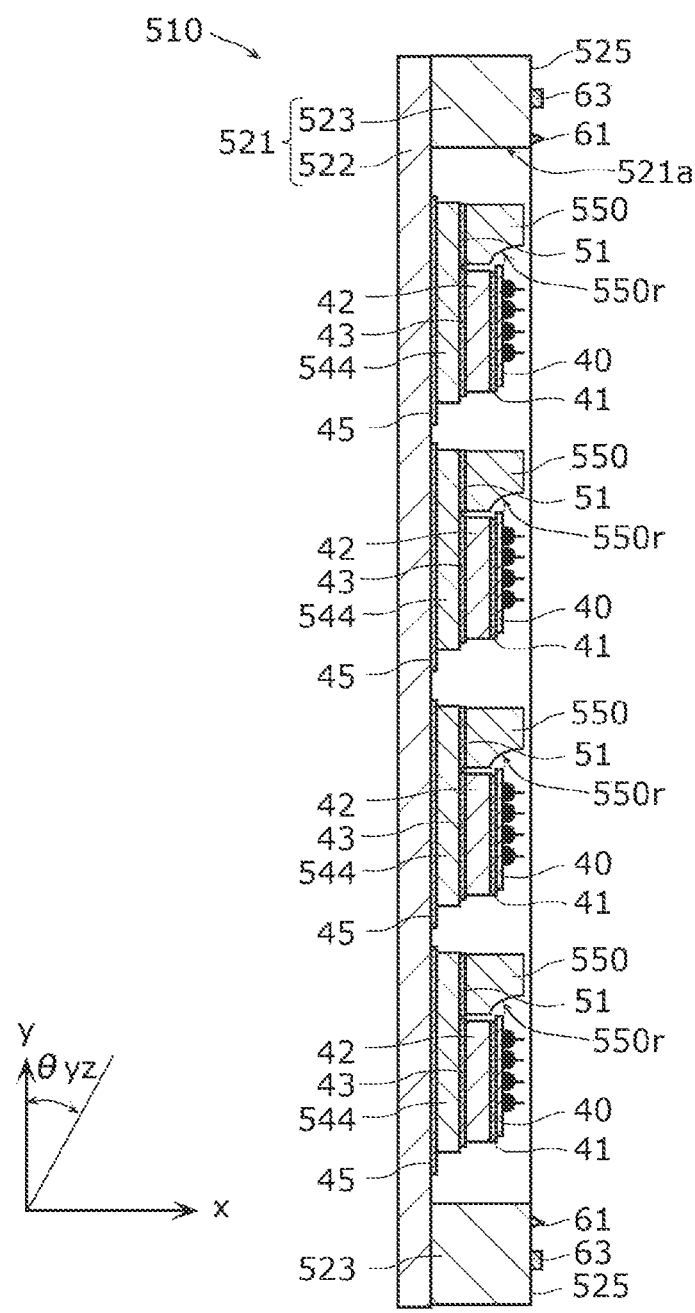
FIG. 33 is a schematic cross-sectional view showing the configuration of the semiconductor laser module according to Embodiment 6 excluding the cap member and the window member.
Figure 34:
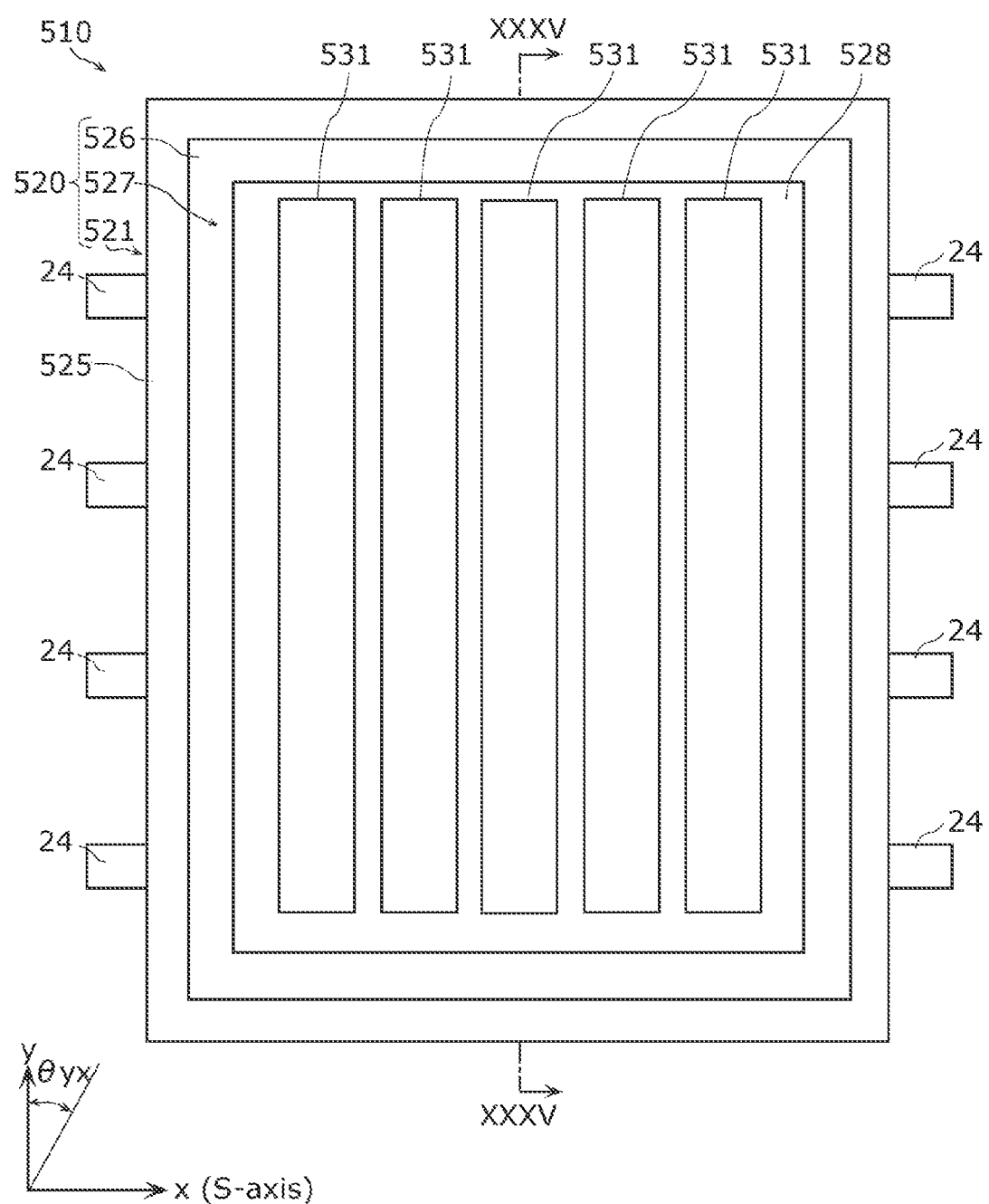
FIG. 34 is a schematic plan view showing an overall configuration of a semiconductor laser module according to Embodiment 6.
Figure 35:
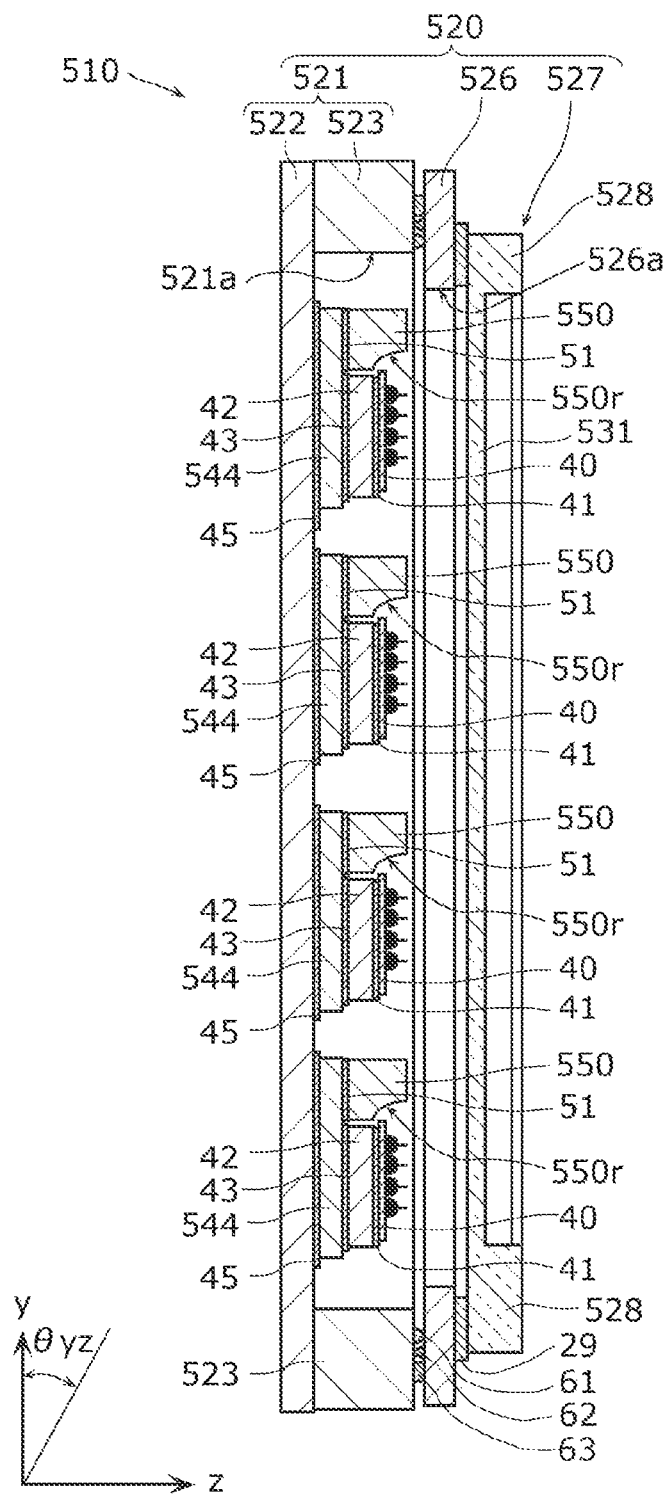
FIG. 35 is a schematic cross-sectional view showing the overall configuration of the semiconductor laser module according to Embodiment 6.
Figure 36:
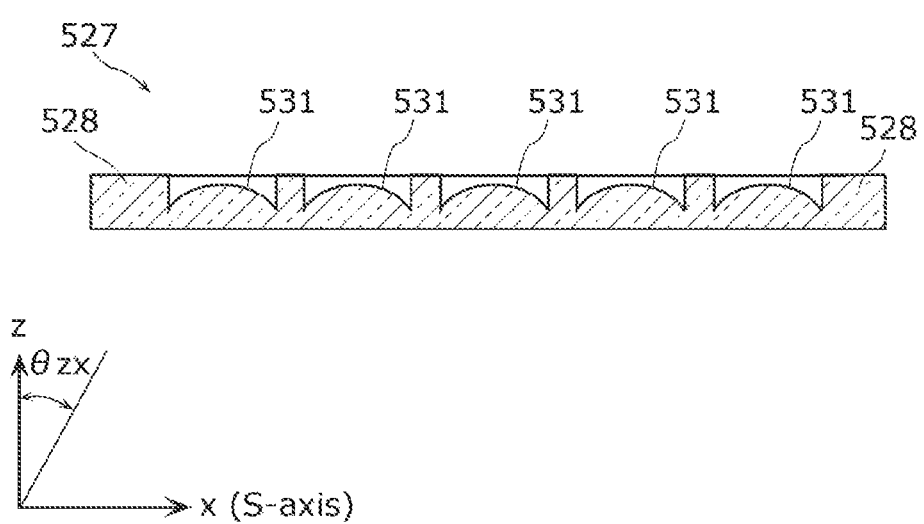
FIG. 36 is a schematic cross-sectional view showing a shape of the window member according to Embodiment 6.

FIGS. 32 and 33 are a schematic plan view and a schematic cross-sectional view, respectively, showing a configuration of semiconductor laser module 510 according to this embodiment excluding cap member 526 and window member 527. FIG. 33 shows a cross-section taken along line XXXIII-XXXIII in FIG. 32. FIGS. 34 and 35 are a schematic plan view and a schematic cross-sectional view, respectively, showing an overall configuration of semiconductor laser module 510 according to this embodiment. FIG. 35 shows a cross-section taken along line XXXV-XXXV in FIG. 34. FIG. 36 is a schematic cross-sectional view showing a shape of window member 527 according to this embodiment. FIG. 36 shows a cross-section of window member 527 parallel to the z-x plane.

As shown in FIGS. 34 and 35, semiconductor laser module 510 includes package 520. As shown in FIGS. 32 and 33, semiconductor laser module 510 further includes a plurality of semiconductor laser chips 40 arranged in a matrix and four first collimator elements 550. In this embodiment, semiconductor laser module 510 further includes five second collimator elements 531, a plurality of submounts 42 arranged in a matrix, and four heat sinks 544. Here, like in FIG. 2, as shown in FIG. 33, each semiconductor laser chip 40 is placed on one of on submounts 42 as follows. The light-emitting surface of each semiconductor laser chip 40 coincides with the focal point of one of mirror surfaces 550r. Each semiconductor laser chip 40 protrudes from submount 42 toward one of first collimator elements 550. Note that each semiconductor laser chip 40 may be placed on one of submounts 42 so that the light-emitting surface of semiconductor laser chip 40 coincides with the side surface of submount 42 opposed to one of first collimator elements 550.

As shown in FIG. 35, package 520 is a case containing the plurality of semiconductor laser chips 40 and four first collimator elements 550. As shown in FIGS. 34 and 35, package 520 includes body 521, cap member 526 attached to top 525, and window member 527.

Body 521 according to this embodiment is a bottomed cylindrical member having plate-like bottom 522 and top 525 with opening 521a. Opening 521a is an example of the first opening at the end of body 521 opposite to the end at bottom 522. In this embodiment, body 521 includes bottom 522 and side 523.

Bottom 522 is a plate-like member at the bottom of body 521. In this embodiment, bottom 522 is a rectangular plate-like member. Bottom 522 includes, on the principal surface inside package 520, a plurality of semiconductor laser chips 40, for example.

Side 523 is a cylindrical member standing on the principal surface of bottom 522 inside package 520. Located at one opening end of side 523 is bottom 522. located at the other opening end, that is, at top 525 is cap member 526. In other words, top 525 is one end surface of side 523 opposed to cap member 526. In this embodiment, side 523 is a cylindrical member extending along the outer edge of bottom 522 and having openings at both ends. Side 523 has a rectangular opening. The opening at top 525 of side 523 is the first opening (i.e., opening 521a) described above.

Side 523 includes a plurality of lead pins 24 electrically connected to semiconductor laser chips 40. In the example shown in FIG. 32, side 523 includes eight lead pins 24. In this embodiment, four pins are located at one end of side 523 along the x-axis, and four lead pins 24 at the other end.

Like top 125 according to Embodiment 2, top 525 includes first protrusion 61 and second protrusion 63.

Cap member 526 is attached to top 525 of body 521. Cap member 526 has an inner surface facing body 521 and an outer surface on the backside of the inner surface. As shown in FIG. 35, cap member 526 overlaps top 525 throughout the circumference of opening 521a in a plan view of bottom 522. Cap member 526 has opening 526a to overlap opening 521a of body 521 in a plan view of bottom 522. Opening 526a is an example of the second opening that penetrates cap member 526 near the center of cap member 526 in a plan view. The material of cap member 526 is not particularly limited and may be Fe or a Fe-based alloy, for example. Like cap member 126 according to embodiment 2, cap member 526 includes first protrusion 62.

Window member 527 is a translucent member in cap member 526. In this embodiment, window member 527 closes opening 526a of cap member 526. In this embodiment, as shown in FIGS. 34 to 36, second collimator element 531 and window member 527 are formed integrally. Each second collimator element 531 is the part of window member 527 including the optical axis of the laser light. Semiconductor laser module 510 includes five second collimator elements 531 that are opposed to four semiconductor laser chips 40 aligned along the y-axis and that extend along the y-axis. In this manner, second collimator elements 531 and window member 527 are integral so that semiconductor laser module 510 requires a smaller number of components, which simplifies the assembly procedure.

Window member 527 has plate 528 around second collimator elements 531. Plate 528 is joined to cap member 526.

Each of the plurality of semiconductor laser chips 40 has the same or similar configuration as semiconductor laser chip 40 according to Embodiment 1. As shown in FIG. 32, semiconductor laser module 510 according to this embodiment includes twenty semiconductor laser chips 40 arranged in a matrix. In this embodiment, aligned along the y-axis are four groups of five semiconductor laser chips 40 that are aligned along the x-axis. Each semiconductor laser chip 40 is supplied with electric power from lead pins 24. In FIG. 32, lead pins 24 at the left end are applied with a higher potential, whereas lead pins 24 at the right end are applied with a lower potential. Each lead pin 24 at the left end is connected to the associated one lead pin 24 at the right end via five semiconductor laser chips 40 aligned along the x-axis and connected in series. Accordingly, the same current is supplied to five semiconductor laser chips 40 aligned along the x-axis. Note that lead pins 24 and semiconductor laser chip 40 as well as semiconductor laser chips 40 adjacent along the x-axis are electrically connected by wires W. More specifically, wire W whose one end is connected to the n-type electrode (not shown) of semiconductor laser chip 40 at the left end in FIG. 32 has the other end connected to following submount 42. On submount 42, semiconductor laser chip 40 (second semiconductor laser chip 40 from left) on the right of former semiconductor laser chip 40 is located. Accordingly, wire W is connected to the p-type electrode (not shown) of each semiconductor laser chip 40 via submount 42. Similarly, wire W connects second and third semiconductor laser chips 40 from left, third and fourth semiconductor laser chips 40 from left, and fourth and fifth semiconductor laser chips 40 from left.

Each of the plurality of submounts 42 has the same or similar configuration as submount 42 according to Embodiment 1. The plurality of submounts 42 are arranged in a matrix. Mounted on each of the plurality of submounts 42 is one semiconductor laser chip 40.

Each heat sink 544 is a base joined to bottom 522. Joined to each heat sink 544 are five submounts 42 aligned along the x-axis.

Each first collimator element 550 has concave mirror surface 550r opposed to all light-emitting points of five semiconductor laser chips 40 aligned along the x-axis inside package 520. In this embodiment, mirror surface 550r reflects the laser beams from the five light-emitting points toward opening 521a and reduces the divergence angles of the laser beams along the first axis. Each of the five laser beams reflected by mirror surface 550r is incident on one of five second collimator elements 531. In order to enable this, each first collimator element 550 is placed so that mirror surface 550r overlaps openings 521a and 526a in a plan view of bottom 522.

Mirror surface 550r has a parabolic shape having, as focal points, the light-emitting points of semiconductor laser chips 40. This reduces the divergence angle of the laser beams emitted from the five light-emitting points along the first axis. As a result, semiconductor laser module 510 requires a smaller number of components than in the case of using five first collimator elements each reflects one of the five laser beams. In addition, extra works such as the alignment of first collimator elements 550 can be reduced.

Each of five second collimator elements 531 reduces the divergence angle along the second axis of the laser light reflected by first collimator element 550. Each second collimator element 531 receives four laser beams aligned along the y-axis. In this embodiment, as shown in FIG. 36, each of five second collimator elements 531 is a cylindrical lens in a convex shape in the direction away from bottom 522. In other words, each of five second collimator elements 531 is a cylindrical lens having a cylindrical surface serving as the light-emitting surface. Each of five second collimator elements 531 reduces the divergence angle of the laser light along the x-axis that is the second axis. Each of five second collimator elements 531 is located on the optical path of one of the five laser beams reflected by first collimator element 550. Accordingly, each of five second collimator elements 531 aligned along the x-axis emits the four laser beams aligned along the y-axis. As a result, five second collimator elements 531 emit twenty laser beams arranged in a matrix.

As described above, semiconductor laser module 510 according to this embodiment emits a plurality of laser beams arranged in a matrix. By collecting these laser beams, high-power laser light is obtained.

Embodiment 7

A semiconductor laser module according to Embodiment 7 will be described. The semiconductor laser module according to this embodiment differs from semiconductor laser module 510 according to Embodiment 6 in the configuration of the window member. Now, the semiconductor laser module according to this embodiment will be described with reference to FIGS. 37 to 39, focusing on the differences from semiconductor laser module 510 according to Embodiment 6.

Figure 37:
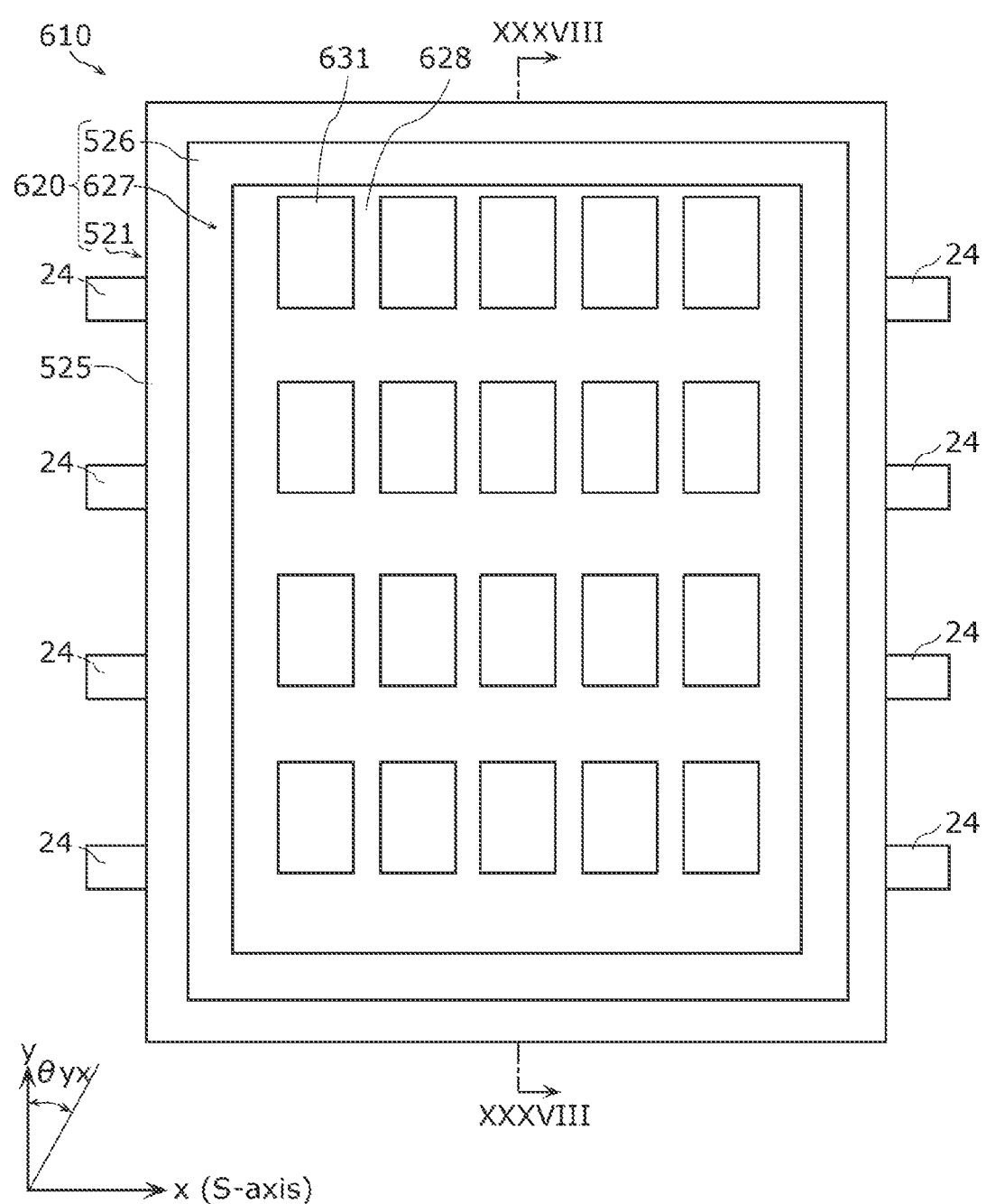
FIG. 37 is a schematic plan view showing an overall configuration of a semiconductor laser module according to Embodiment 7.
Figure 38:
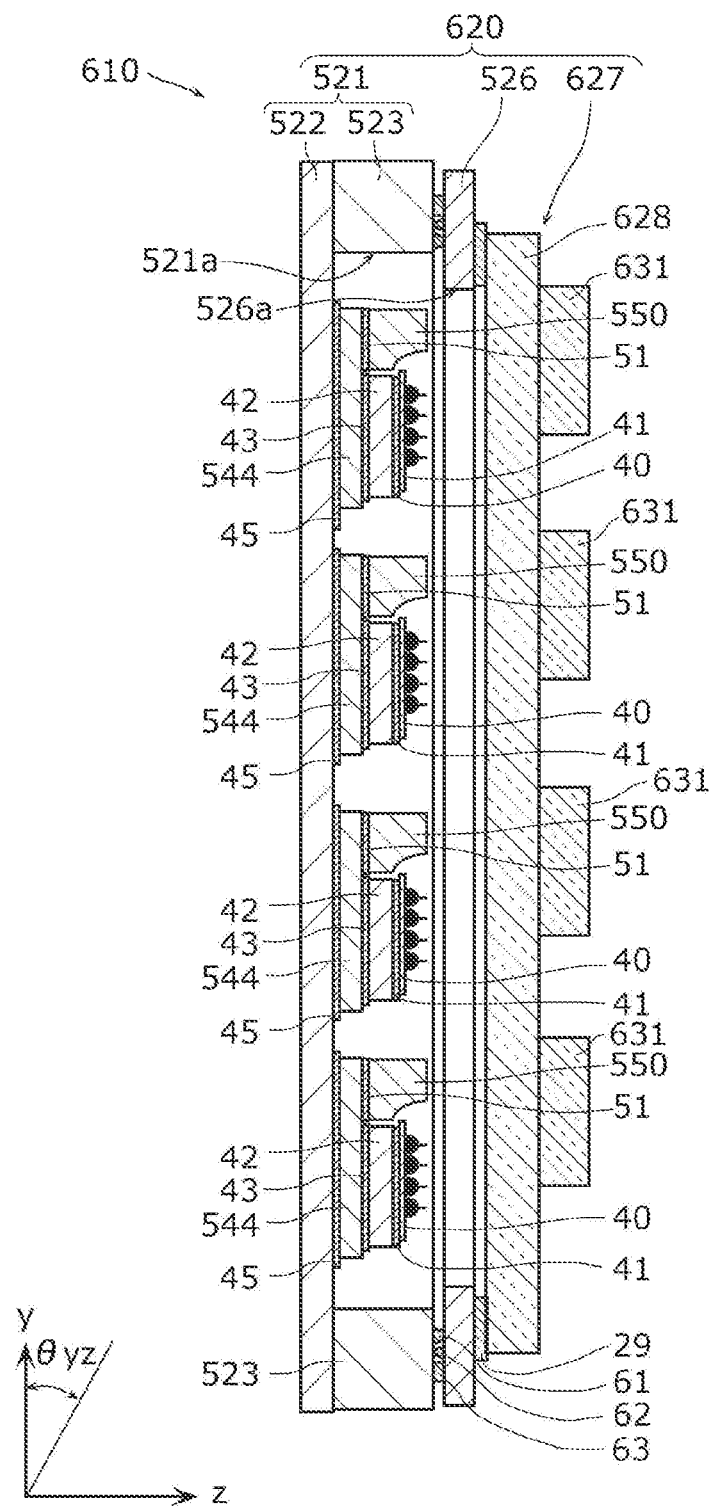
FIG. 38 is a schematic cross-sectional view showing the overall configuration of the semiconductor laser module according to Embodiment 7.

FIGS. 37 and 38 are a schematic plan view and a schematic cross-sectional view, respectively, showing an overall configuration of semiconductor laser module 610 according to this embodiment. FIG. 38 shows a cross-section taken along line XXXVIII-XXXVIII in FIG. 37. FIG. 39 is a schematic cross-sectional view showing a shape of window member 627 according to this embodiment. FIG. 39 shows a cross-section of window member 627 parallel to the z-x plane.

As shown in FIGS. 37 and 38, semiconductor laser module 610 includes package 620. Like semiconductor laser module 510 according to Embodiment 6, semiconductor laser module 610 further includes a plurality of semiconductor laser chips 40 arranged in a matrix and four first collimator elements 550. In this embodiment, semiconductor laser module 610 further includes a plurality of submounts 42 arranged in a matrix and four heat sinks 544. As shown in FIG. 37, semiconductor laser module 610 further includes a plurality of second collimator elements 631 arranged in a matrix.

As shown in FIG. 38, package 620 is a case containing the plurality of semiconductor laser chips 40 and four first collimator elements 550. As shown in FIGS. 37 and 38, package 620 includes body 521, cap member 526 attached to top 525, and window member 627.

Body 521 and cap member 526 have the same or similar configurations as body 521 and cap member 526 according to Embodiment 6.

Window member 627 is a translucent member in cap member 526. In this embodiment, window member 627 closes opening 526a of cap member 526. In this embodiment, as shown in FIGS. 37 to 39, window member 627 includes plate 628 and the plurality of second collimator elements 631. In this embodiment, window member 627 is obtained by fixing the plurality of second collimator elements 631 to plate 628. Semiconductor laser module 610 includes the plurality of second collimator elements 631 arranged in the matrix. In this manner, second collimator elements 631 are fixed to plate 628 so as to be located in the positions corresponding to the laser beams of semiconductor laser chips 40. In other words, after the positions of second collimator elements 631 have been finely adjusted in accordance with the positions of the laser beams, second collimator elements 631 can be fixed to plate 628. Accordingly, even if the positions of light-emitting points 40a vary, the beams can be efficiently picked up in the same direction. Note that how to fix second collimator elements 631 to plate 628 is not particularly limited. For example, second collimator elements 631 may be fixed to plate 628 in positions away from the optical paths by spot welding or soldering. In this case, a metal film may be formed in advance in the part other than the optical paths and to be subjected to the spot welding or solder joining. In addition, antireflection coating films may be formed on both surfaces of second collimator elements 631 and plate 628.

Plate 628 is joined to cap member 526. In this embodiment, as shown in FIGS. 38 and 39, the plurality of second collimator elements 631 protrude from plate 628 in the direction away from bottom 522.

As described above, semiconductor laser module 610 according to this embodiment includes the plurality of second collimator elements 631 arranged in the matrix. Semiconductor laser module 610 with such the configuration provides the same or similar advantages as the semiconductor laser module according to Embodiment 6.

Variations

The semiconductor laser module according to the present disclosure has been described above based on the embodiments. The present disclosure is however not limited to the embodiments described above.

For example, in the embodiments, the top includes first and second protrusion 61 and 63, whereas cap member includes first protrusion 62. The configurations of the first and second protrusions are however not limited thereto. At least one of the cap member or the top may include first and second protrusions in the junction area in which the cap member and the top overlap each other in a plan view of the bottom. The first protrusion has a cross-sectional area variable in accordance with the position in the direction perpendicular to the principal surface of the bottom. The second protrusion has a constant cross-sectional area. For example, the cap member may include the second protrusion. Alternatively, only one of the cap member and the top may include the first protrusion.

The present disclosure includes other embodiments, such as those obtained by variously modifying the embodiments as conceived by those skilled in the art or those achieved by freely combining the constituent elements and functions in the embodiments without departing from the scope and spirit of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

Industrial Applicability

The semiconductor laser module according to the present disclosure is applicable as a laser source for processing, for example.

The invention claimed is:

1. A semiconductor laser module, comprising:
   at least one semiconductor laser chip;
   at least one first collimator element;
   a package containing, in an inside space, the at least one semiconductor laser chip and the at least one first collimator element; and
   at least one second collimator element, wherein
   the package includes:
      a body in a bottomed tubular shape including a bottom in a plate shape and a top with an opening;
      a cap member attached to the top; and
      a window member located in the cap member and having a translucency,
   each of the at least one semiconductor laser chip includes a light-emitting point for emitting laser light,
   each of the at least one semiconductor laser chip is placed on the bottom so as to emit the laser light in a direction parallel to a principal surface of the bottom,
   the laser light has a divergence angle along a first axis greater than a divergence angle along a second axis, the first axis extending perpendicularly to a propagating direction of the laser, the second axis extending perpendicularly to the propagating direction and the first axis,
   each of the at least one first collimator element includes a mirror surface in a concave shape and opposed to the light-emitting point,
   the mirror surface reflects the laser light toward the opening and reduces the divergence angle of the laser light along the first axis, and
   each of the at least one second collimator element reduces the divergence angle along the second axis of the laser light reflected by one of the at least one first collimator element.

2. The semiconductor laser module according to claim 1, further comprising:
   at least one submount joined to the bottom, wherein
   each of the at least one semiconductor laser chip is joined to the bottom via the at least one submount.

3. The semiconductor laser module according to claim 2, wherein
   each of the at least one submount includes a surface including a front surface extending orthogonally to a direction in which the laser light of a corresponding one of the at least one semiconductor laser chip is emitted, and
   each of the at least one first collimator element is placed with the mirror surface opposed to the front surface.

4. The semiconductor laser module according to claim 1, wherein
   the cap member includes an inner surface facing the body, and an outer surface on a backside of the inner surface, and
   the at least one second collimator element is located at the outer surface.

5. The semiconductor laser module according to claim 1, wherein
   the cap member includes an inner surface facing the body, and an outer surface on a backside of the inner surface, and
   the at least one second collimator element is located at the inner surface.

6. The semiconductor laser module according to claim 1, wherein
   the at least one second collimator element and the window member are formed integrally.

7. The semiconductor laser module according to claim 1, wherein
the package seals the inside space.

8. The semiconductor laser module according to claim 7, wherein
the at least one semiconductor laser chip and the at least one first collimator element are joined to the package by a joining member containing no resin.

9. The semiconductor laser module according to claim 1, wherein
an optical path length is at least 30 μm and at most 300 μm from the light-emitting point to the mirror surface of one of the at least one first collimator element on which the laser light is incident.

10. The semiconductor laser module according to claim 4, wherein
an optical path length is at least 1450 μm and at most 4200 μm from the light-emitting point to one of the at least one second collimator element on which the laser light is incident.

11. The semiconductor laser module according to claim 5, wherein
an optical path length is at least 900 μm and at most 4200 μm from the light-emitting point to one of the at least one second collimator element on which the laser light is incident.

12. The semiconductor laser module according to claim 7, wherein
at least one of the cap member or the top includes, in a junction area in which the cap member and the top overlap each other in a plan view of the bottom;
a first protrusion with a cross-sectional area variable in accordance with a position in a direction perpendicular to the principal surface of the bottom; and
a second protrusion with a cross-sectional area not variable in accordance with the position in the direction perpendicular to the principal surface of the bottom.

13. The semiconductor laser module according to claim 1, wherein
the at least one semiconductor laser chip includes a plurality of semiconductor laser chips, and
the at least one first collimator element includes one first collimator element opposed to the light-emitting point of each of the plurality of semiconductor laser chips.

14. The semiconductor laser module according to claim 1, wherein
a maximum width of each of the at least one first collimator element in the direction in which the laser light is emitted is at least twice a maximum width of the mirror surface in the direction in which the laser light is emitted.

15. The semiconductor laser module according to claim 1, further comprising:
outside the package, a beam rotating element that rotates an orientation of a spot of the laser light incident.

16. The semiconductor laser module according to claim 1, further comprising:
a lens-tip equipped optical fiber that receives the laser light reflected by the at least one first collimator element.

17. The semiconductor laser module according to claim 1, wherein
each of the at least one second collimator element includes a convex surface, and $BDS > 1.1 \times LFAC \times 1.5 \times n$ is satisfied, where:
n, where n≥1, is a number of light-emitting points;
LFAC is an optical path length from each of the light-emitting points to the mirror surface on an optical axis of the laser light; and
BDS is a spot diameter of the laser light along the second axis on the convex surface.

18. The semiconductor laser module according to claim 17, wherein
a distance between adjacent two of the light-emitting points is at least 1.2 times BDS.

19. The semiconductor laser module according to claim 1, wherein
the body includes a side part extending along an outer edge of the bottom, and
the side part includes a plurality of lead pins electrically connected to the at least one semiconductor laser chip.

20. A semiconductor laser module, comprising:
at least one semiconductor laser chip;
at least one first collimator element; and
a package containing, in an inside space, the at least one semiconductor laser chip and the at least one first collimator element, wherein
the package includes:
a body in a bottomed tubular shape including a bottom in a plate shape and a top with an opening;
a cap member attached to the top; and
a window member located in the cap member and having a translucency,
each of the at least one semiconductor laser chip includes a light-emitting point for emitting laser light,
each of the at least one semiconductor laser chip is placed on the bottom so as to emit the laser light in a direction parallel to a principal surface of the bottom,
the laser light has a divergence angle along a first axis greater than a divergence angle along a second axis, the first axis extending perpendicularly to a propagating direction of the laser, the second axis extending perpendicularly to the propagating direction and the first axis,
each of the at least one first collimator element includes a mirror surface in a concave shape and opposed to the light-emitting point,
the mirror surface reflects the laser light toward the opening and reduces the divergence angle of the laser light along the first axis,
the package seals an inside space,
at least one of the cap member or the top includes, in a junction area in which the cap member and the top overlap each other in a plan view of the bottom:
a first protrusion with a cross-sectional area variable in accordance with a position in a direction perpendicular to the principal surface of the bottom; and
a second protrusion with a cross-sectional area not variable in accordance with the position in the direction perpendicular to the principal surface of the bottom.

21. A semiconductor laser module, comprising:
at least one semiconductor laser chip;
at least one first collimator element; and
a package containing, in an inside space, the at least one semiconductor laser chip and the at least one first collimator element, wherein
the package includes:
a body in a bottomed tubular shape including a bottom in a plate shape and a top with an opening;
a cap member attached to the top; and
a window member located in the cap member and having a translucency, each of the at least one semiconductor laser chip includes a light-emitting point for emitting laser light, each of the at least one semiconductor laser chip is placed on the bottom so as to emit the laser light in a direction parallel to a principal surface of the bottom, the laser light has a divergence angle along a first axis greater than a divergence angle along a second axis, the first axis extending perpendicularly to a propagating direction of the laser, the second axis extending perpendicularly to the propagating direction and the first axis, the package seals the inside space, in the inside space, the laser light is reflected toward the opening and the divergence angle of the laser light along the first axis is reduced by the at least one first collimator element, the semiconductor laser module further comprises an optical element that converts, outside the package, a propagating direction of the laser light reflected toward the opening parallel to the principal surface of the bottom, and the optical element is a mirror.

\* \* \* \* \*